(12) United States Patent
Roussev et al.

(10) Patent No.: US 11,453,612 B2
(45) Date of Patent: Sep. 27, 2022

(54) GLASS-BASED ARTICLES INCLUDING A METAL OXIDE CONCENTRATION GRADIENT

(71) Applicant: CORNING INCORPORATED, Corning, NY (US)

(72) Inventors: Rostislav Vatchev Roussev, Painted Post, NY (US); Charlene Marie Smith, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 517 days.

(21) Appl. No.: 15/491,531

(22) Filed: Apr. 19, 2017

(65) Prior Publication Data
US 2017/0305786 A1    Oct. 26, 2017

Related U.S. Application Data

(60) Provisional application No. 62/325,353, filed on Apr. 20, 2016.

(51) Int. Cl.
| | |
|---|---|
| C03C 21/00 | (2006.01) |
| C03C 3/097 | (2006.01) |
| C03C 3/093 | (2006.01) |
| H05K 5/00 | (2006.01) |
| H05K 5/02 | (2006.01) |

(52) U.S. Cl.
CPC .......... *C03C 21/002* (2013.01); *C03C 3/093* (2013.01); *C03C 3/097* (2013.01); *H05K 5/0017* (2013.01); *H05K 5/0217* (2013.01)

(58) Field of Classification Search
CPC .. C03C 21/002; H05K 5/0017; H05K 5/0217; Y10T 428/10; Y10T 428/1036
See application file for complete search history.

(56) References Cited

U.S. PATENT DOCUMENTS

| 8,713,972 B2 | 5/2014 | Lakota et al. |
| 8,854,623 B2 | 10/2014 | Fontaine et al. |
| (Continued) | | |

FOREIGN PATENT DOCUMENTS

| CN | 101553441 A | 10/2009 |
| CN | 104114503 A | 10/2014 |
| (Continued) | | |

OTHER PUBLICATIONS

ASTM standard C770-98 (2008), entitled "Standard Test Method for Measurement of Glass Stress-Optical Coefficient," downloaded Apr. 18, 2017.

(Continued)

*Primary Examiner* — Anthony J Frost
(74) *Attorney, Agent, or Firm* — Kevin M. Johnson

(57) ABSTRACT

Provided are methods of forming a chemically strengthened glass-based article. Certain methods comprise: providing a glass-based substrate comprising a first surface and a second surface opposing the first surface defining a thickness (t), a length dimension, a width, and a weight; and ion exchanging a plurality of alkali ions into the glass-based substrate to form a non-zero alkali metal oxide concentration that varies along at least a substantial portion of the thickness (t). The ion exchanging comprises immersing a glass-based substrate in a molten salt bath comprising at least about 90% by weight $KNO_3$, and less than about 10% by weight $NaNO_3$ for a time in the range of 70% to 130% of the ion exchange time that produces a peak central tension (CT) with the same molten salt bath composition and temperature. Also provided are ion exchanged glass-based articles prepared by said methods.

41 Claims, 50 Drawing Sheets

(56) References Cited

U.S. PATENT DOCUMENTS

| | | | |
|---|---|---|---|
| 8,957,374 | B2 | 2/2015 | Liu et al. |
| 9,003,835 | B2 | 4/2015 | Lock |
| 9,140,543 | B1 | 9/2015 | Allan et al. |
| 9,593,042 | B2 | 3/2017 | Hu et al. |
| 2005/0099618 | A1 | 5/2005 | DiFoggio et al. |
| 2010/0152333 | A1* | 6/2010 | Berthereau ............... C03C 4/20 524/5 |
| 2015/0027169 | A1 | 1/2015 | Fredholm |
| 2015/0030834 | A1* | 1/2015 | Morey ................. C03C 21/002 428/220 |
| 2015/0072129 | A1* | 3/2015 | Okahata ............... C03C 21/002 428/220 |
| 2015/0079398 | A1* | 3/2015 | Amin .................... C01B 21/068 428/408 |
| 2015/0111030 | A1* | 4/2015 | Miyasaka ............. C03C 21/002 428/338 |
| 2016/0102011 | A1* | 4/2016 | Hu ......................... C03C 10/00 428/155 |

FOREIGN PATENT DOCUMENTS

| | | |
|---|---|---|
| CN | 104203859 A | 12/2014 |
| CN | 104254501 A | 12/2014 |
| JP | 2001-517854 A | 10/2001 |
| JP | 2011-032140 A | 2/2011 |
| JP | 2012-229154 A | 11/2012 |
| JP | 2016-044119 A | 4/2016 |
| WO | 2016/057787 A2 | 4/2016 |

OTHER PUBLICATIONS

FSM-6000, manufactured by Luceo Co., Ltd. (Tokyo, Japan). downloaded Apr. 18, 2017.

ASTM C1499-09(2013), entitled "Standard Test Method for Monotonic Equibiaxial Flexural Strength of Advanced Ceramics at Ambient Temperature," downloaded Apr. 18, 2017.

ASTM C158-02(2012), entitled Standard Test Methods for Strength of Glass by Flexure (Determination of Modulus of Rupture) downloaded Apr. 18, 2017. Rupture).

International Search Report and Written Opinion PCT/US2017/028488 dated Jul. 17, 2017.

Taiwanese Application No. 106113185; Office Action dated Sep. 7, 2020; 11 pages (English Translation Only) Taiwanese Patent Office.

Japanese Patent Application No. 2018-554670, Office Action dated Feb. 1, 2021, 11 pages (5 pages of English Translation and 6 pages of Original Document); Japanese Patent Office.

Chinese Patent Application No. 201780025098.8, Office Action dated Jun. 10, 2021, 15 pages (8 pages of English Translation and 7 pages of Original Document); Chinese Patent Office.

* cited by examiner

GLASS-BASED ARTICLES INCLUDING A METAL OXIDE CONCENTRATION GRADIENT

RELATED APPLICATIONS

This application claims priority to U.S. Application No. 62/325,353 filed Apr. 20, 2016, the entirety of which is incorporated herein by reference.

BACKGROUND

This disclosure relates to glass-based articles exhibiting improved damage resistance, including improved fracture resistance, and more particularly to glass and glass ceramic articles exhibiting a non-zero metal oxide concentration gradient or concentration that varies along a substantial portion of the thickness.

Glass-based articles often experience severe impacts that can introduce large flaws into a surface of such articles. Such flaws can extend to depths of up to about 200 micrometers from the surface. Traditionally, thermally tempered glass has been used to prevent failures caused by the introduction of such flaws into the glass because thermally tempered glass often exhibits large compressive stress (CS) layers (e.g., approximately 21% of the total thickness of the glass), which can prevent the flaws from propagating further into the glass and thus, can prevent failure. An example of a stress profile generated by thermal tempering is shown in FIG. 1. In FIG. 1, the thermally treated glass-based article 100 includes a first surface 101, a thickness $t_1$, and a surface CS 110. The thermally treated glass-based article 100 exhibits a CS that decreases from the first surface 101 to a depth of compression (DOC) 130, as defined herein, at which depth the stress changes from compressive to tensile stress and reaches a maximum central tension (CT) 120.

Thermal tempering is currently limited to thick glass-based articles (i.e., glass-based articles having a thickness $t_1$ of about 3 millimeters or greater) because, to achieve the thermal strengthening and the desired residual stresses, a sufficient thermal gradient must be formed between the core of such articles and the surface. Such thick articles are undesirable or not practical in many applications such as display (e.g., consumer electronics, including mobile phones, tablets, computers, navigation systems, and the like), architecture (e.g., windows, shower panels, countertops etc.), transportation (e.g., automotive, trains, aircraft, sea craft, etc.), appliance, or any application that requires superior fracture resistance but thin and light-weight articles.

Although chemical strengthening is not limited by the thickness of the glass-based article in the same manner as thermally tempering, known chemically strengthened glass-based articles do not exhibit the stress profile of thermally tempered glass-based articles. An example of a stress profile generated by chemical strengthening (e.g., by an ion exchange process), is shown in FIG. 2. In FIG. 2, the chemically strengthened glass-based article 200 includes a first surface 201, a thickness $t_2$ and a surface CS 210. The glass-based article 200 exhibits a CS that decreases from the first surface 201 to a DOC 230, as defined herein, at which depth the stress changes from compressive to tensile stress and reaches a maximum CT 220. As shown in FIG. 2, such profiles exhibit a substantially flat CT region or CT region with a constant or near constant tensile stress along at least a portion of the CT region. Often, known chemically strengthened glass-based articles exhibit a lower maximum CT value, as compared to the maximum central value shown in FIG. 1.

Additionally, the ion exchange processes that can be used in chemical strengthening, particularly where a large, heavy atom is exchanged into the glass for a smaller ion can result in undesired increases weight and dimensions in the substrate. These changes can be particularly problematic for glass-based articles with beveled edges or other asymmetric features. In such glass-based articles, the changes in weight and dimensions result in warping. Methods to reduce these undesired shape changes in the final (larger and/or warped) part, post-ion exchange, can involve etching or polishing to preferentially remove material, thereby producing a part with the desired features. These procedures, however, necessarily add more process steps to manufacturing; this is costly and due to increased handling may result in lower yields of final parts. In addition, they will usually incur unwanted reduction of the spike CS in particular, possibly unwanted reduction in the spike thickness.

Accordingly, there is a need for thin glass-based articles that exhibit improved fracture resistance, as well as improved methods of ion exchange processes that reduce undesired changes in the glass-based article.

SUMMARY

A first aspect of the present disclosure pertains to a glass-based article including a first surface and a second surface opposing the first surface defining a thickness (t); a concentration of a metal oxide that is both non-zero and varies along a thickness range from about 0·t to about 0.3·t; and a central tension (CT) region comprising a maximum CT greater than or equal to $71.5/\sqrt{J(t)}$, wherein, when the glass-based article is fractured, the glass-based article fractures into at least 2 fragments/inch² (fragments per square inch). As used herein, the variation in metal oxide concentration may be referred to herein as a metal oxide concentration gradient. In one or more embodiments, the concentration of the metal oxide is non-zero and varies along the entire thickness. In one or more embodiments, the CT region may include a metal oxide concentration that is both non-zero and varies along a thickness range from about 0·t to about 0.3·t. The glass-based article of one or more embodiments may include a thickness t of about 3 millimeters (mm) or less, 2 mm or less, or about 1 mm or less.

A second aspect of this disclosure pertains to a glass-based article including a first surface and a second surface opposing the first surface defining a thickness (t) of about less than about 3 millimeters, and a stress profile extending along the thickness, wherein all points of the stress profile between a thickness range from about 0·t up to 0.3·t and from greater than 0.7·t, comprise a tangent having an absolute value that is greater than about 0.1 MPa/micrometer, wherein the stress profile comprises a maximum CS, a DOC and a maximum CT greater than or equal to $71.5/\sqrt{(t)}$, wherein the ratio of maximum CT to maximum CS is in the range from about 0.01 to about 0.2 and wherein the DOC is about 0.1·t or greater.

A third aspect of this disclosure pertains to a glass-based article including a first surface and a second surface opposing the first surface defining a thickness (t); and a concentration of a metal oxide that is both non-zero and varies along a thickness range from about 0·t to about 0.3·t (or from about 0·t to about 0.4·t or from about 0·t to about 0.45·t), a surface compressive stress of greater than about 200 MPa or greater; and a CT region having a maximum CT greater than or equal to $71.5/\sqrt{(t)}$.

A fourth aspect of this disclosure pertains to a glass-based article comprising: a first surface and a second surface opposing the first surface defining a thickness (t); and a metal oxide that forms a concentration gradient, wherein the concentration of the metal oxide decreases from the first surface to a point between the first surface and the second surface and increases from the point to the second surface, wherein the concentration of the metal oxide at the point is non-zero, and wherein the glass-based article comprises a stored tensile energy of about greater than 0 J/m² to less than 20 J/m² and an elastic modulus of about 70 GPa or greater.

A fifth aspect of this disclosure pertains to a glass-based article comprising: a first surface and a second surface opposing the first surface defining a thickness (t) of about less than about 3 millimeter; and a stress profile extending along the thickness, wherein the stress profile at all points between a thickness range from about 0t up to 0.3 t and from greater than 0.7t, comprise a tangent having an absolute value of greater than about 0.1 MPa/micrometer, wherein the stress profile comprises a maximum CS, a DOC and a maximum CT, wherein the ratio of maximum CT to maximum CS is in the range from about 0.01 to about 0.2 and wherein the DOC is about 0.1·t or greater, and wherein the glass-based article comprises a stored tensile energy of about greater than 0 J/m² to less than 20 J/m² and an elastic modulus of about 70 GPa or greater. In one or more embodiments, the glass-based article includes a non-zero concentration of a metal oxide that continuously varies along the entire thickness. In some instances, the non-zero concentration of a metal oxide that continuously varies along thickness segments of less than about 10 micrometers.

A sixth aspect of this disclosure pertains to a glass-based article including a stress profile including a CS region and a CT region, wherein the CT region is defined by the equation Stress(x)=MaxT−(((CT$_n$·(n+1))/0.5n)·|(x/t)−0.5|n), wherein MaxT is a maximum tension value, CT$_n$ is less than or equal to MaxT and provided as a positive value in units of MPa, x is position along the thickness (t) in micrometers, and n is between 1.5 and 5. In some embodiments, the maximum CT value in the range from about 50 MPa to about 250 MPa and the maximum CT value is at a depth in the range from about 0.4t to about 0.6t. In one or more embodiments, from a thickness in the range from about 0·t to about 0.1t, the stress profile comprises a slope in the range from about 20 MPa/micron to about 200 MPa/micron. In one or more embodiments, the stress profile is defined by a plurality of error functions as measured from 0.5t to the surface.

In accordance with one or more embodiments of the glass-based articles described herein, a monovalent ion of the metal oxide generates a stress along the thickness range from about 0·t to about 0.3·t, from about 0·t to about 0.4·t, or from about 0·t to about 0.45·t. The concentration of the metal oxide of one or more embodiments decreases from the first surface to a point between the first surface and the second surface and increases from the point to the second surface.

In one or more embodiments, the concentration of the metal oxide concentration is about 0.05 mol % or greater throughout the thickness. For example, in one or more embodiments, the concentration of the metal oxide at the first surface is about 1.5 times greater than the concentration of the metal oxides at a depth equal to about 0.5·t. In exemplary embodiments, the glass-based article comprises a total concentration of the metal oxide in the range from about 1 mol % to about 15 mol %. In one or more embodiments, examples of the metal oxide include any one or more of Li$_2$O, Na$_2$O, K$_2$O, Rb$_2$O, and Cs$_2$O. In one or more embodiments, the metal oxide has a largest ionic diameter of all of the total metal oxides in the glass-based substrate or article.

In one or more embodiments, the CT region comprises the metal oxide that is both non-zero and varies along a thickness range from about 0·t to about 0.3·t. In one or more embodiments of the glass-based articles described herein, the maximum CT is greater than or equal to $71.5/\sqrt{(t)}$.

The glass-based article of some embodiments includes a first metal oxide concentration and a second metal oxide concentration. In some embodiments, the first metal oxide concentration is in the range from about 0 mol % to about 15 mol % in a first thickness range from about 0·t to about 0.5·t. In some embodiments, the second metal oxide concentration is in the range from about 0 mol % to about 10 mol % in a second thickness range from about 0 micrometers to about 25 micrometers. The glass-based article may include an optional third metal oxide.

In one or more embodiments, the glass-based articles described herein may exhibit a surface compressive stress (CS) that is greater than the maximum CT. One or more embodiments of the glass-based articles described herein may include a surface CS of about 300 MPa or greater. In some instances, this surface CS is exhibited when the glass-based article has a thickness of about 2 mm or less. In one or more embodiments, the glass-based article exhibits a combination of a surface CS of about 200 MPa or greater and a chemical depth of layer of about 0.4·t or greater. In one or more embodiments, the glass-based article includes a CS extending from the first surface to a DOC, wherein the DOC is about 0.1·t or greater. In some instances, the ratio of maximum CT to surface CS is in the range from about 0.1 to about 0.8.

In one or more embodiments, the glass-based article has an amorphous structure. In some embodiments, the glass-based article may include a crystalline structure.

In one or more embodiments, the glass-based articles described herein may exhibit a transmittance of about 88% or greater over a wavelength in the range from about 380 nm to about 780 nm. In some instances, the glass-based articles described herein may exhibit CIELAB color space coordinates, under a CIE illuminant F02, of L* values of about 88 and greater, a* values in the range from about −3 to about +3, and b* values in the range from about −6 to about +6.

In one or more embodiments, the glass-based articles described herein may include an elastic modulus of about 70 GPa or greater. In some embodiments, the glass-based articles described herein include a liquidus viscosity of less than about 100 kilopoise (kP). In one or more embodiments, the glass-based articles described herein exhibit a fracture toughness (K$_{1C}$) of about 0.65 MPa·m$^{1/2}$ or greater. In one or more embodiments, the glass-based articles described herein include any one or more of: a composition comprising a combined amount of Al$_2$O$_3$ and Na$_2$O of about 15 mol % or less, a composition comprising about 4 mol % or greater Na$_2$O, a composition comprising any one or more of B$_2$O$_3$ and ZnO, and a composition substantially free of P$_2$O$_5$. In one or more embodiments, glass-based article comprises a monovalent ion diffusivity of about 450 μm²/hour (square micrometers per hour) or greater at about 460° C. In some embodiments, this monovalent ion diffusivity is exhibited in combination with a DOC greater than about 0.15·t, and a surface CS that is 1.5 times the maximum CT or greater.

In one or more embodiments, the glass-based articles described herein exhibit certain fracture behavior. For example, in one or more embodiments, when the glass-based article is fractured by a single event (i.e., a single impact such as being dropped or being impacted once with an implement), the glass-based article fractures into at least 2 fragments/inch$^2$ (fragments per square inch). In some embodiments, when the glass-based article is fractured, the glass-based article fractures into at least 1 fragment/inch$^2$ up to 40 fragments/inch$^2$ (fragments per square inch).

A seventh aspect of this disclosure pertains to a use of a glass substrate in a strengthened glass-based article. In one or more embodiments, the glass substrate comprises (in mol %): $SiO_2$ in an amount in the range from about 68% to about 75%; $Al_2O_3$ in an amount in the range from about 12% to about 15%; $B_2O_3$ in an amount in the range from about 0.5% to about 5%; $Li_2O$ in an amount in the range from about 2% to about 10%; $Na_2O$ in an amount in the range from about 0% to about 6%; MgO in an amount in the range from about 1% to about 4%; ZnO in an amount in the range from about 0% to about 3%; and CaO in an amount in the range from about 0% to about 5%, wherein the glass substrate is ion-exchangeable and is amorphous. In one or more embodiments, the glass substrate exhibits any one or more of: a ratio of $Li_2O$ to $R_2O$ in the range from about 0.45 to about 1; a difference between a total amount of $R_2O$ to the amount of $Al_2O_3$ in the range from about −5% to about 0%; a difference between a total amount of $R_xO$ (in mol %) and the amount of $Al_2O_3$ in the range from about 0% to about 3%; and a ratio of the amount of MgO (in mol %) to a total amount of RO (in mol %) in the range from about 0% to about 1%, and wherein the glass substrate is substantially free of nucleating agents.

A eighth aspect of this disclosure pertains to a glass substrate comprising a composition including, in mol %, $SiO_2$ in an amount in the range from about 68% to about 75%; $Al_2O_3$ in an amount in the range from about 12% to about 15%; $B_2O_3$ in an amount in the range from about 0.5% to about 5%; $Li_2O$ in an amount in the range from about 2% to about 10%; $Na_2O$ in an amount in the range from about 0% to about 6%; MgO in an amount in the range from about 1% to about 4%; ZnO in an amount in the range from about 0% to about 3%; and CaO in an amount in the range from about 0% to about 5%, wherein the glass substrate is ion-exchangeable and is amorphous. In one or more embodiments, the glass substrate exhibits any one or more of: a ratio of $Li_2O$ to $R_2O$ in the range from about 0.45 to about 1; a difference between a total amount of $R_2O$ to the amount of $Al_2O_3$ in the range from about −5% to about 0%; a difference between a total amount of $R_xO$ (in mol %) and the amount of $Al_2O_3$ in the range from about 0% to about 3%; and a ratio of the amount of MgO (in mol %) to a total amount of RO (in mol %) in the range from about 0% to about 1%. In one or more embodiments, the glass substrate is substantially free of nucleating agents.

An ninth aspect of this disclosure pertains to a glass substrate that includes in mol %, $SiO_2$ in an amount in the range from about 68% to about 75%; $Al_2O_3$ in an amount in the range from about 12% to about 15%; $B_2O_3$ in an amount in the range from about 0.5% to about 5%; $Li_2O$ in an amount in the range from about 2% to about 10%; $Na_2O$ in an amount in the range from about 0% to about 6%; MgO in an amount in the range from about 1% to about 4%; ZnO in an amount in the range from about 0% to about 3%; and CaO in an amount in the range from about 0% to about 5%, wherein the glass substrate is amorphous and is strengthened. In one or more embodiments, the $Na_2O$ concentration varies in the glass substrate. In one or more embodiments, the glass substrate is substantially free of nucleating agents. In accordance with one or more embodiments, the strengthened glass substrate exhibits any one or more of the following compositional relationships: a ratio of $Li_2O$ to $R_2O$ in the range from about 0.45 to about 1; a difference between a total amount of $R_2O$ to the amount of $Al_2O_3$ in the range from about −5% to about 0%; a difference between a total amount of $R_xO$ (in mol %) and the amount of $Al_2O_3$ in the range from about 0% to about 3%; and a ratio of the amount of MgO (in mol %) to a total amount of RO (in mol %) in the range from about 0% to about 1%.

A tenth aspect of this disclosure pertains to a device comprising: a housing having front, back, and side surfaces; electrical components that are at least partially inside the housing; a display at or adjacent to the front surface of the housing; and a cover substrate disposed over the display, wherein the cover substrate or housing comprises a glass-based article according the embodiments described herein.

An eleventh aspect of this disclosure pertains to a method of forming a chemically strengthened glass-based article. In one or more embodiments, the method comprises: providing a glass-based substrate comprising a first surface and a second surface opposing the first surface defining a thickness (t), a length dimension, a width, and a weight; and ion exchanging a plurality of alkali ions into the glass-based substrate to form a non-zero alkali metal oxide concentration that varies along at least a substantial portion of the thickness (t), wherein ion exchanging comprises immersing the glass-based substrate in a molten salt bath comprising at least about 90% by weight of a potassium salt (e.g. $KNO_3$), and less than about 10% by weight of a sodium salt (e.g., $NaNO_3$) for less than about 12 hours.

In one or more embodiments, the molten salt bath further comprises a lithium salt (e.g., $LiNO_3$) in an amount of less than about 2% by weight. In some embodiments, the thickness is less than about 2 mm. In one or more embodiments, the thickness is less than about 1 mm. In some embodiments, the thickness is about 0.8 mm. In one or more embodiments, there is a less than 1.6% gain in the weight after ion exchanging compared to before ion exchanging. In some embodiments, there is a less than 0.24% change in the length dimension after ion exchanging compared to before ion exchanging. In one or more embodiments, there is a less than 0.24% change in the width after ion exchanging compared to before ion exchanging. In some embodiments, the glass-based article warps less than 200 μm after ion exchanging compared to the glass substrate before ion exchanging. In one or more embodiments, the potassium salt (e.g., $KNO_3$) is present in an amount of at least 92% by weight. In some embodiments, the potassium salt (e.g. $KNO_3$) is present in an amount of at least 94% by weight. In one or more embodiments, the potassium salt (e.g., $KNO_3$) is present in an amount of about 95% by weight. In some embodiments, the sodium salt (e.g., $NaNO_3$) is present in an amount of less than about 8% by weight. In one or more embodiments, the sodium salt (e.g., $NaNO_3$) is present in an amount of less than about 5% by weight. In some embodiments, the sodium salt (e.g., $NaNO_3$) is present in an amount of about 5% by weight. In one or more embodiments, the potassium salt (e.g., $KNO_3$) is present in an amount ranging from about 90% to about 97% by weight, and the sodium salt (e.g., $NaNO_3$) is present in an amount ranging from about 10% to about 3% by weight. In some embodiments, the glass-based article is ion exchanged for less than about 12 hours. In one or more embodiments, the glass-based article is ion exchanged for less than about 10 hours. In some embodiments, there is a change in the length dimension after ion exchanging compared to before ion exchanging ranging from about 0.2% to about 0.15% by weight. In one or more embodiments, the method further comprises a second ion exchange in a second molten salt bath comprising a potassium salt (e.g., KNO₃).

A twelfth aspect of the disclosure pertains to a glass-based article prepared by the methods described herein. In some embodiments, the glass-based article is an ion-exchanged glass-based article comprising: a length dimension; a width dimension; a weight; a first surface and a second surface opposing the first surface defining a thickness (t); a concentration of an ion-exchanged metal oxide that is both non-zero and varies along a thickness range from about 0·t to at least about 0.3·t; and a central tension (CT) region comprising a maximum CT greater than or equal to $71.5/\sqrt{(t)}$, where the thickness t is given in mm. In one or more embodiments, when the thickness (t) of the glass-based article is 0.8 mm: (1) there is less than a 1.6% gain in the weight of the glass-based article resulting from the ion-exchanged metal oxide compared to the weight of the glass-based substrate prior to ion exchange, (2) there is less than a 0.24% change in the length dimension of the ion-exchanged glass-based article compared to the length dimension of the glass-based substrate prior to ion exchange, and (3) there is less than a 0.24% change in the width dimension of the glass-based article compared to the width dimension of the glass-based substrate prior to ion exchange.

In some embodiments, the there is less than a 1.4% gain in weight of the glass-based article resulting from the ion-exchanged metal oxide compared to the weight of the glass-based substrate prior to ion exchanging. In one or more embodiments, there is less than a 0.15% change in the length dimension of the ion-exchanged glass-based article compared to the length dimension of the glass-based substrate prior to ion exchange. In some embodiments, there is less than a 0.15% change in the width dimension of the glass-based article compared to the width dimension of the glass-based substrate prior to ion exchange. In one or more embodiments, the article further comprises a surface compressive stress (CS) of about 300 MPa or greater. In some embodiments, the surface CS is about 400 MPa or greater. In one or more embodiments, t comprises about 1 millimeter or less.

A thirteenth aspect of the disclosure pertains to a device comprising a housing having front, back, and side surfaces; electrical components that are at least partially inside the housing; a display at or adjacent to the front surface of the housing; and a cover substrate disposed over the display, wherein the cover substrate or housing comprises the glass-based article as described in any of the above embodiments.

In embodiment (1) of the disclosure, a method of forming a chemically strengthened glass-based article is provided. The method comprises: providing a glass-based substrate comprising a first surface and a second surface opposing the first surface defining a thickness (t), a length dimension, a width, and a weight; and ion exchanging a plurality of alkali ions into the glass-based substrate to form a non-zero alkali metal oxide concentration that varies along at least a substantial portion of the thickness (t). The ion exchanging comprises immersing the glass-based substrate in a molten salt bath comprising at least about 90% by weight of a potassium salt, and less than about 10% by weight of a sodium salt for less than about 12 hours.

In embodiment (2) of the disclosure, the method of embodiment (1) is provided, wherein the molten salt bath further comprises a lithium salt in an amount of less than about 2% by weight.

In embodiment (3) of the disclosure, the method of embodiment (1) or (2) is provided, wherein the thickness is less than about 2 mm.

In embodiment (4) of the disclosure, the method of any of embodiments (1) to (3) is provided, wherein the thickness is less than about 1 mm.

In embodiment (5) of the disclosure, the method of any of embodiments (1) to (4) is provided, wherein the thickness is about 0.8 mm.

In embodiment (6) of the disclosure, the method of any of embodiments (1) to (4) is provided, wherein the potassium salt is KNO₃, the sodium salt is NaNO₃, and the lithium salt is LiNO₃ the there is a less than 1.6% gain in weight after ion exchanging compared to before ion exchanging.

In embodiment (7) of the disclosure, the method of any of embodiments (1) to (6) is provided, wherein there is a less than 0.24% change in the length dimension after ion exchanging compared to before ion exchanging.

In embodiment (8) of the disclosure, the method of any of embodiments (1) to (7) is provided, wherein there is a less than 0.24% change in the width after ion exchanging compared to before ion exchanging.

In embodiment (9) of the disclosure, the method of any of embodiments (1) to (8) is provided, wherein the glass-based article warps less than 200 μm after ion exchanging compared to before ion exchanging.

In embodiment (10) of the disclosure, the method of any of embodiments (1) to (9) is provided, wherein the potassium salt is present in an amount of at least 92% by weight.

In embodiment (11) of the disclosure, the method of any of embodiments (1) to (10) is provided, wherein the potassium salt is present in an amount of at least 94% by weight.

In embodiment (12) of the disclosure, the method of any of embodiments (1) to (11) is provided, wherein the potassium salt is present in an amount of about 95% by weight.

In embodiment (13) of the disclosure, the method of any of embodiments (1) to (12) is provided, wherein the sodium salt is present in an amount of less than about 8% by weight.

In embodiment (14) of the disclosure, the method of any of embodiments (1) to (13) is provided, wherein the sodium salt is present in an amount of less than about 6% by weight.

In embodiment (15) of the disclosure, the method of any of embodiments (1) to (14) is provided, wherein the sodium salt is present in an amount of about 5% by weight.

In embodiment (16) of the disclosure, the method of any of embodiments (1) to (15) is provided, wherein the potassium salt is present in an amount ranging from about 90 to about 97% by weight and the sodium salt is present in an amount ranging from about 10 to about 3% by weight.

In embodiment (17) of the disclosure, the method of any of embodiments (1) to (16) is provided, wherein the glass-based article is ion exchanged for less than about 12 hours.

In embodiment (18) of the disclosure, the method of any of embodiments (1) to (17) is provided, wherein the glass-based article is ion exchanged for less than about 10 hours.

In embodiment (19) of the disclosure, the method of any of embodiments (1) to (18) is provided, wherein there is a change in the length dimension after ion exchanging compared to before ion exchanging ranging from about 0.2 to about 0.15% by weight.

In embodiment (20) of the disclosure, the method of any of embodiments (1) to (19) is provided, further comprising a second ion exchange in a second molten salt bath comprising a potassium salt.

In embodiment (21) of the disclosure, a glass-based article prepared by the method of any of embodiments (1) to (20) is provided.

In embodiment (22) of the disclosure, an ion-exchanged glass-based article is provided. The ion-exchanged glass-based article comprises: a length dimension; a width dimension; a weight; a first surface and a second surface opposing the first surface defining a thickness (t); a concentration of an ion-exchanged metal oxide that is both non-zero and varies along a thickness range from about 0·t to at least about 0.3·t; and a central tension (CT) region comprising a maximum CT greater than or equal to $71.5/\sqrt{(t)}$, where the thickness t is given in mm. The thickness (t) of the glass-based article is 0.8 mm. There is less than 1.6% gain in weight of the glass-based article resulting from the ion-exchanged metal oxide compared to the weight of the glass-based substrate prior to ion exchange, there is less than 0.24% change in the length dimension of the ion-exchanged glass-based article compared to the length dimension of the glass-based substrate prior to ion exchange, and there is less than 0.24% change in the width dimension of the glass-based article compared to the width dimension of the glass-based substrate prior to ion exchange.

In embodiment (23) of the disclosure, the glass-based article of embodiment (22) is provided, wherein there is less than a 1.4% gain in weight of the glass-based article resulting from the ion-exchanged metal oxide compared to the weight of the glass-based substrate prior to ion exchanging.

In embodiment (24) of the disclosure, the glass-based article of embodiment (22) or (23) is provided, wherein there is less than a 0.15% change in the length dimension of the ion-exchanged glass-based article compared to the length dimension of the glass-based substrate prior to ion exchange.

In embodiment (25) of the disclosure, the glass-based article of any of embodiments (22) to (24) is provided, wherein there is a less than 0.15% change in the width dimension of the glass-based article compared to the width dimension of the glass-based substrate prior to ion exchange.

In embodiment (26) of the disclosure, the glass-based article of any of embodiments (22) to (25) is provided, further comprising a surface compressive stress (CS) of about 300 MPa or greater.

In embodiment (27) of the disclosure, the glass-based article of any of embodiments (22) to (26) is provided, wherein the surface CS is about 400 MPa or greater.

In embodiment (28) of the disclosure, the glass-based article of any of embodiments (22) to (27) is provided, wherein t comprises about 1 millimeter or less.

In embodiment (29) of the disclosure, a device is provided comprising: a housing having front, back, and side surfaces; electrical components that are at least partially inside the housing; a display at or adjacent to the front surface of the housing; and a cover substrate disposed over the display, wherein the cover substrate or housing comprises the glass-based article of any of embodiments (22) to (28).

In aspect (1) of the disclosure, a method of forming a chemically strengthened glass-based article is provided. The method comprises: ion exchanging a plurality of alkali ions into the glass-based substrate to form a glass-based article with a non-zero alkali metal oxide concentration that varies along at least a substantial portion of the thickness (t) of the glass-based article. The glass-based substrate comprises a glass-based substrate comprising a first surface and a second surface opposing the first surface defining a thickness (t), a length dimension, a width, and a weight. The ion exchanging comprises immersing the glass-based substrate in a molten salt bath comprising a weight ratio of a potassium salt to a sodium salt greater than the lesser of (a) 2.5:1 and (b) a molar ratio of $(Li_2O+K_2O):Na_2O$ in the glass-based substrate, for a time in the range of 50% to 130% of the ion exchange time that produces a peak central tension (CT) with the same molten salt bath composition and temperature.

In aspect (2) of the disclosure, the method of aspect (1) is provided, wherein the molten salt bath further comprises a lithium salt in an amount of less than about 2% by weight.

In aspect (3) of the disclosure, the method of aspect (1) or (2) is provided, wherein the thickness is less than about 2 mm.

In aspect (4) of the disclosure, the method of any of aspects (1) to (3) is provided, wherein the thickness is less than about 1 mm.

In aspect (5) of the disclosure, the method of any of aspects (1) to (4) is provided, wherein the thickness is about 0.8 mm.

In aspect (6) of the disclosure, the method of any of aspects (1) to (5) is provided, wherein the potassium salt is $KNO_3$, the sodium salt is $NaNO_3$, and the lithium salt is $LiNO_3$, and there is a less than 1.6% gain in weight after ion exchanging compared to before ion exchanging.

In aspect (7) of the disclosure, the method of any of aspects (1) to (6) is provided, wherein there is a less than 0.24% change in the length dimension after ion exchanging compared to before ion exchanging.

In aspect (8) of the disclosure, the method of any of aspects (1) to (7) is provided, wherein there is a less than 0.24% change in the width after ion exchanging compared to before ion exchanging.

In aspect (9) of the disclosure, the method of any of aspects (1) to (8) is provided, wherein the glass-based article warps less than 200 µm after ion exchanging compared to the glass substrate before ion exchanging.

In aspect (10) of the disclosure, the method of any of aspects (1) to (9) is provided, wherein the potassium salt is present in an amount of at least 92% by weight.

In aspect (11) of the disclosure, the method of any of aspects (1) to (10) is provided, wherein the potassium salt is present in an amount of at least 94% by weight.

In aspect (12) of the disclosure, the method of any of aspects (1) to (11) is provided, wherein the potassium salt is present in an amount of about 95% by weight.

In aspect (13) of the disclosure, the method of any of aspects (1) to (12) is provided, wherein the sodium salt is present in an amount of less than about 8% by weight.

In aspect (14) of the disclosure, the method of any of aspects (1) to (13) is provided, wherein the sodium salt is present in an amount of less than about 6% by weight.

In aspect (15) of the disclosure, the method of any of aspects (1) to (14) is provided, wherein the sodium salt is present in an amount of about 5% by weight.

In aspect (16) of the disclosure, the method of any of aspects (1) to (15) is provided, wherein the potassium salt is present in an amount of at least about 90% and the sodium salt is present in an amount of about 10% by weight or less.

In aspect (17) of the disclosure, the method of any of aspects (1) to (16) is provided, wherein the potassium salt is present in an amount ranging from about 90% to about 97% by weight and the sodium salt is present in an amount ranging from about 10% to about 3% by weight.

In aspect (18) of the disclosure, the method of any of aspects (1) to (17) is provided, wherein the glass-based article is ion exchanged for a time in the range of 70% to 130% of the ion exchange time that produces a peak central tension (CT) with the same molten salt bath composition and temperature.

In aspect (19) of the disclosure, the method of any of aspects (1) to (18) the glass-based article is ion exchanged for less than about 12 hours.

In aspect (20) of the disclosure, the method of any of aspects (1) to (19) is provided, wherein the glass-based article is ion exchanged for less than about 10 hours.

In aspect (21) of the disclosure, the method of any of aspects (1) to (20) is provided, wherein there is a change in the length dimension after ion exchanging compared to before ion exchanging ranging from about 0.1% to about 0.2%.

In aspect (22) of the disclosure, the method of any of aspects (1) to (21) is provided, further comprising a second ion exchange in a second molten salt bath comprising a potassium salt.

In aspect (23) of the disclosure, the method of any of aspects (1) to (22) is provided, wherein the glass substrate has a 2.5D or 3D shape.

In aspect (24) of the disclosure, the method of any of aspects (1) to (23) is provided, wherein the ion exchanging produces an increase in $Na_2O$ concentration at a center point of the glass substrate of less than 1.3 mol %.

In aspect (25) of the disclosure, the method of any of aspects (1) to (24) is provided, wherein the glass-based article comprises a compressive stress spike, and a spike depth of layer ($DOL_{spike}$), wherein $DOL_{spike}/t$ is in the range from about 0.006 to about 0.014.

In aspect (26) of the disclosure, the method of aspect (25) is provided, wherein $DOL_{spike}/t$ is in the range from about 0.008 to about 0.012.

In aspect (27) of the disclosure, the method of any of aspects (1) to (26) is provided, wherein the glass-based article comprises lithium.

In aspect (28) of the disclosure, the method of any of aspects (1) to (27) is provided, wherein the $Na_2O$ molar concentration at the center point of the glass-based article is less than 45% of the total alkali metal oxide molar concentration of the glass-based article at the center point.

In aspect (29) of the disclosure, the method of any of aspects (1) to (28) is provided, wherein the $Na_2O$ concentration at the center point of the glass-based article is less than 4.5 mol %.

In aspect (30) of the disclosure, the method of any of aspects (1) to (29) is provided, wherein the glass-based article has a maximum central tension greater than or equal to $71.5/\sqrt{(t)}$, where the thickness t is given in mm.

In aspect (31) of the disclosure, a glass-based article prepared by the method of any of aspects (1) to (30) is provided.

In aspect (32) of the disclosure, a glass-based article is provided. The glass-based article comprises: a first surface and a second surface opposing the first surface defining a thickness (t); a concentration of an ion-exchanged metal oxide that is both non-zero and varies along a thickness range from about 0·t to at least about 0.3·t; $Li_2O$; and $Na_2O$. The content of $Na_2O$ at a center point of the glass-based article is less than about 4.5 mol %.

In aspect (33) of the disclosure, the glass-based article of aspect (32) is provided, wherein the content of $Na_2O$ at the center point of the glass-based article is less than about 4.0 mol %.

In aspect (34) of the disclosure, the glass-based article of aspect (32) or (33) is provided, wherein the content of $Na_2O$ at a center point of the glass-based article is less than about 3.0 mol %.

In aspect (35) of the disclosure, a glass-based article is provided. The glass-based article comprises: a first surface and a second surface opposing the first surface defining a thickness (t); a concentration of an ion-exchanged metal oxide that is both non-zero and varies along a thickness range from about 0·t to at least about 0.3·t; and $Na_2O$. The molar concentration of $Na_2O$ at a center point of the glass-based article is less than about 45% of the total alkali metal oxide molar concentration of the glass-based article at the center point.

In aspect (36) of the disclosure, the glass-based article of aspect (35) is provided, wherein the molar concentration of $Na_2O$ at the center point of the glass-based article is less than about 40% of the total alkali metal oxide molar concentration of the glass-based article at the center point.

In aspect (37) of the disclosure, a glass-based article is provided. The glass-based article comprises: a first surface and a second surface opposing the first surface defining a thickness (t); a concentration of an ion-exchanged metal oxide that is both non-zero and varies along a thickness range from about 0·t to at least about 0.3·t; and a compressive stress spike depth of layer ($DOL_{spike}$). The $DOL_{spike}/t$ is in the range from about 0.006 to about 0.014.

In aspect (38) of the disclosure, the glass-based article of aspect (37) is provided, wherein $DOL_{spike}/t$ is in the range from about 0.008 to about 0.012.

In aspect (39) of the disclosure, the glass-based article of aspect (37) or (38) is provided, wherein $DOL_{spike}/t$ is in the range from about 0.009 to about 0.011.

In aspect (40) of the disclosure, the glass-based article of any of aspects (37) to (39) is provided, wherein $DOL_{spike}/t$ is about 0.01.

In aspect (41) of the disclosure, the glass-based article of any of aspects (32) to (40) is provided, wherein t is in the range from about 0.03 mm to about 1.3 mm.

In aspect (42) of the disclosure, the glass-based article of any of aspects (32) to (41) is provided, wherein t is about 0.8 mm.

In aspect (43) of the disclosure, the glass-based article of any of aspects (32) to (42) is provided, further comprising a surface compressive stress (CS) of about 300 MPa or greater.

In aspect (44) of the disclosure, the glass-based article of any of aspects (32) to (43) is provided, wherein the surface CS is about 400 MPa or greater.

In aspect (45) of the disclosure, the glass-based article of any of aspects (32) to (44) is provided, wherein the glass-based article has a 2.5D or 3D shape.

In aspect (46) of the disclosure, the glass-based article of any of aspects (32) to (45) is provided, wherein a $Na_2O$ concentration is a minimum at a center of the glass-based article.

In aspect (47) of the disclosure, the glass-based article of any of aspects (32) to (46) is provided, further comprising a warp of less than about 200 µm.

In aspect (48) of the disclosure, a strengthened glass-based article is provided. The strengthened glass-based article comprises: an inner region under a central tension CT; at least one compressive stress layer under a compressive stress CS, the compressive stress layer extending from a surface of the glass-based article to a depth of compression DOC, wherein DOC≥0.1·t when t<0.5 mm and DOC≥50 μm when t≥0.5 mm, and being adjacent to the inner region. The strengthened glass-based article has at least a 60% survivability rate when subjected to an inverted ball drop test with a 4.2 g stainless steel ball having a diameter of 10 mm from a height of 100 cm onto a 30 grit sandpaper positioned above the surface of the glass so there is a 100 μm air gap between the sandpaper and the surface of the glass, wherein the survivability rate is based on testing at least 5 samples.

In aspect (49) of the disclosure, the glass-based article of aspect (48) is provided, wherein the strengthened glass-based article has at least a 60% survivability rate when subjected to the inverted ball drop test from a height of 150 cm.

In aspect (50) of the disclosure a device is provided. The device comprises: a housing having front, back, and side surfaces; electrical components that are at least partially inside the housing; a display at or adjacent to the front surface of the housing; and a cover substrate disposed over the display, wherein the cover substrate or housing comprises the glass-based article of any one of aspects (31) to (49).

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
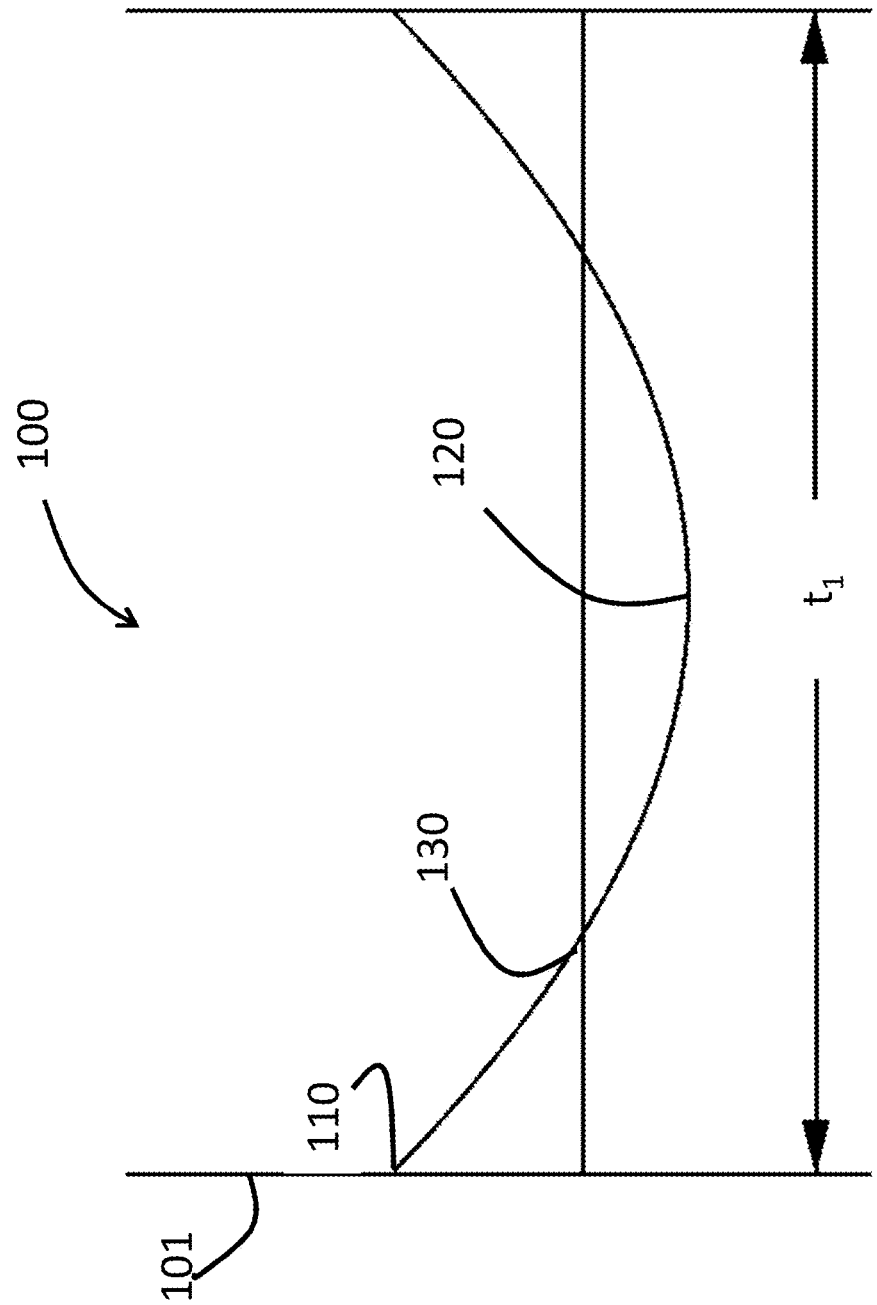
FIG. 1 is a cross-sectional view across a thickness of a known, thermally tempered glass-based article.

Reference will now be made in detail to various embodiments, examples of which are illustrated in the accompanying examples and drawings.

The embodiments described herein possess improved drop performance, reduced warp due to ion-exchange, and reduced weight gain due to ion-exchange. The improved properties of the glass-based articles are due at least in part to the glass composition, molten salt bath composition employed for the ion-exchange, and duration of the ion-exchange. The molten salt bath composition and ion-exchange time are selected such that the central tension, warp, and weight gain of the glass-based article are optimized. The amount of the central tension is associated with the total compressive stress of the glass-based articles, such that a higher central tension indicates a higher degree of compressive stress due to force balancing. The high degree of compressive stress contributes to the improved drop performance of the glass-based articles. As described herein, the duration of the ion-exchange is selected to achieve a high central tension while minimizing the total amount of metal oxide diffusion into the glass-based article, such that the resulting warp and weight gain are also minimized.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the terms "glass-based article" and "glass-based substrates" are used in their broadest sense to include any object made wholly or partly of glass. Glass-based articles include laminates of glass and non-glass materials, laminates of glass and crystalline materials, and glass-ceramics (including an amorphous phase and a crystalline phase). Unless otherwise specified, all compositions are expressed in terms of mole percent (mol %).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant.

Unless otherwise specified, all temperatures are expressed in terms of degrees Celsius (° C.). As used herein the term "softening point" refers to the temperature at which the viscosity of a glass is approximately $10^{7.6}$ poise (P), the term "anneal point" refers to the temperature at which the viscosity of a glass is approximately $10^{13.2}$ poise, the term "200 poise temperature ($T^{200P}$)" refers to the temperature at which the viscosity of a glass is approximately 200 poise, the term "$10^{11}$ poise temperature" refers to the temperature at which the viscosity of a glass is approximately $10^{11}$ poise, the term "35 kP temperature ($T^{35kP}$)" refers to the temperature at which the viscosity of a glass is approximately 35 kilopoise (kP), and the term "160 kP temperature ($T^{160kP}$)" refers to the temperature at which the viscosity of a glass is approximately 160 kP.

Figure 2:
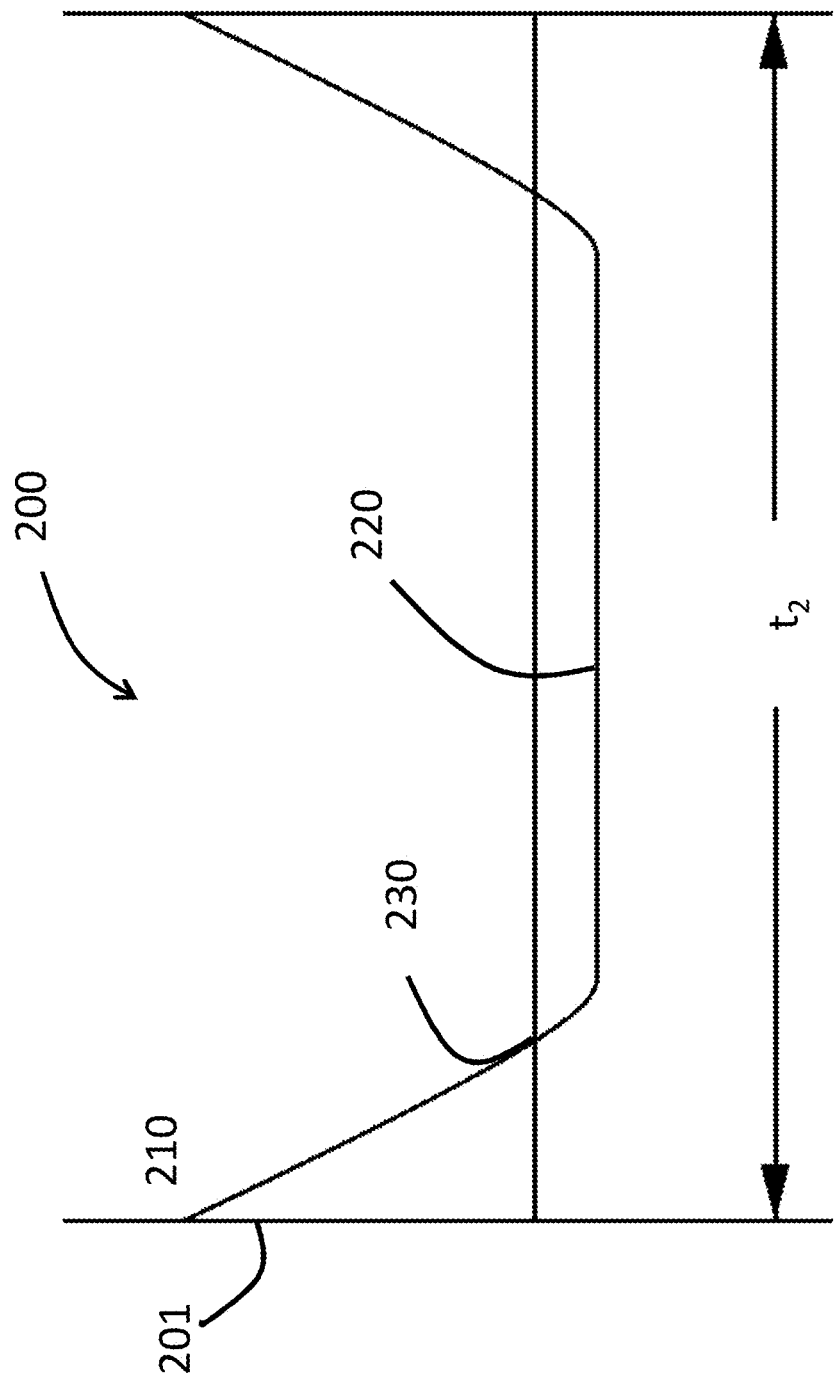
FIG. 2 is a cross-sectional view across a thickness of a known, chemically strengthened glass-based article.
Figure 3:
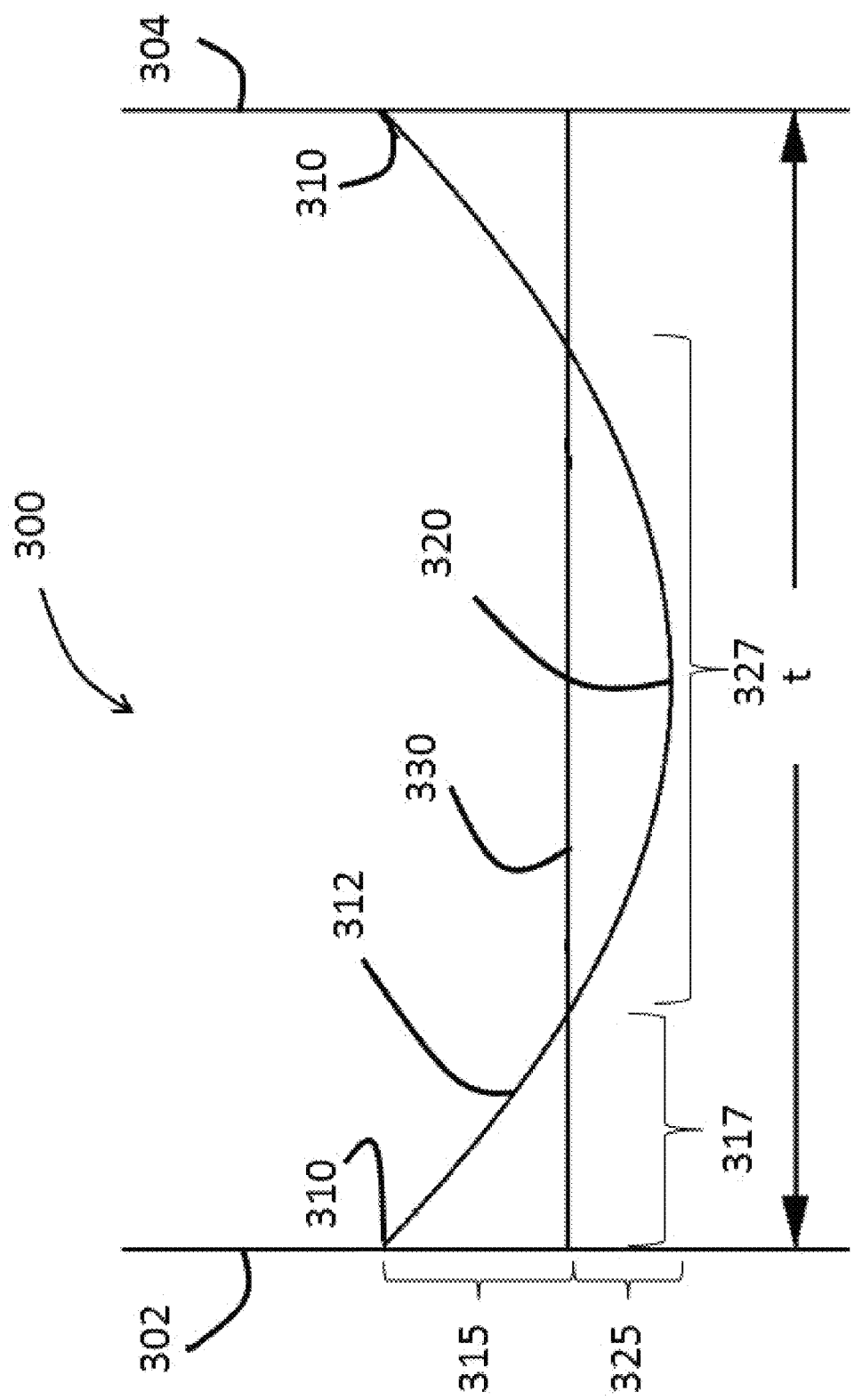
FIG. 3 is a cross-sectional view across a thickness of a chemically strengthened glass-based article according to one or more embodiments of this disclosure.

Referring to the drawings in general and to FIGS. 1-3 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

As used herein, depth of compression (DOC) refers to the depth at which the stress within the glass-based article changes from compressive to tensile stress. At the DOC, the stress crosses from a positive (compressive) stress to a negative (tensile) stress (e.g., 130 in FIG. 1) and thus exhibits a stress value of zero. However, in some of the figures, such as FIGS. 4, 11, 14, 15, 19, 20, 21, 24, 26, 43, and 45, the compressive stress is shown as negative and the tensile stress is shown as positive.

As used herein, the terms "chemical depth", "chemical depth of layer" and "depth of chemical layer" may be used interchangeably and refer to the depth at which an ion of the metal oxide or alkali metal oxide (e.g., the metal ion or alkali metal ion) diffuses into the glass-based article and the depth at which the concentration of the ion reaches a minimum value, as determined by Electron Probe Micro-Analysis (EPMA) or Glow Discharge-Optival Emission Spectroscopy (GD-OES)). In particular, the depth of $Na_2O$ diffusion or $Na+$ ion concentration may be determined using EPMA and a surface stress meter (described in more detail below).

According to the convention normally used in the art, compression is expressed as a negative (<0) stress and tension is expressed as a positive (>0) stress. Throughout this description, however, CS is expressed as a positive or absolute value—i.e., as recited herein, CS=|CS|, unless otherwise noted.

Described herein are thin, chemically strengthened glass-based articles that include glasses, such as silicate glasses including alkali-containing glass, and glass-ceramics that may be used as a cover glass for mobile electronic devices and touch-enabled displays. The glass-based articles may also be used in displays (or as display articles) (e.g., billboards, point of sale systems, computers, navigation systems, and the like), architectural articles (walls, fixtures, panels, windows, etc.), transportation articles (e.g., in automotive applications, trains, aircraft, sea craft, etc.), appliances (e.g., washers, dryers, dishwashers, refrigerators and the like), or any article that requires some fracture resistance.

In particular, the glass-based articles described herein are thin and exhibit stress profiles that are typically only achievable through tempering thick glass-based articles (e.g., having a thickness of about 2 mm or 3 mm or greater). The glass-based articles exhibit unique stress profiles along the thickness thereof. In some cases, the glass-based articles described herein exhibit a greater surface CS than tempered glass-based articles. In one or more embodiments, the glass-based articles have a compressive stress layer that extends deeper into the glass-based article (in which the CS decreases and increases more gradually than known chemically strengthened glass-based articles) such the glass-based article exhibits substantially improved fracture resistance, even when the glass-based article or a device including the same is dropped on a hard surface (e.g., granite) or a hard and rough surface (e.g., asphalt). The glass-based articles of one or more embodiments exhibit a greater maximum CT value than some known chemically strengthened glass substrates.

DOC may be measured by (1) surface stress meter using commercially available instruments such as the FSM-6000, manufactured by Luceo Co., Ltd. (Tokyo, Japan) (commonly referred to as the FSM technique) or (2) a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions ("Potassium DOL") in such glass articles is measured by FSM.

CS, including surface CS may be measured by the FSM technique. Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In one or more embodiments, maximum CT values may be measured using a scattered light polariscope (SCALP) techniques known in the art.

As stated above, the glass-based articles described herein are chemically strengthened by ion exchange and exhibit stress profiles that are distinguished from those exhibited by known strengthened glass-based articles. In this disclosure glass-based substrates are generally unstrengthened and glass-based articles generally refer to glass-based substrates that have been strengthened (by, for example, ion exchange). In this process, ions at or near the surface of the glass-based article are replaced by—or exchanged with—larger ions having the same valence or oxidation state. In those embodiments in which the glass-based article comprises an alkali aluminosilicate glass, ions in the surface layer of the glass and the larger ions are monovalent alkali metal cations, such as $Li^+$ (when present in the glass-based article), $Na^+$, $K^+$, $Rb^+$, and $Cs^+$. Alternatively, monovalent cations in the surface layer may be replaced with monovalent cations other than alkali metal cations, such as $Ag^+$ or the like. In such embodiments, the monovalent ions (or cations) exchanged into the glass-based substrate generate a stress in the resulting glass-based article.

Ion exchange processes are typically carried out by immersing a glass-based substrate in a molten salt bath (or two or more molten salt baths) containing the larger ions to be exchanged with the smaller ions in the glass-based substrate. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass-based article in a salt bath (or baths), use of multiple salt baths, additional steps such as annealing, washing, and the like, are generally determined by the composition of the glass-based article (including the structure of the article and any crystalline phases present) and the desired DOL or DOC and CS of the glass-based article that results from strengthening. By way of example, ion exchange of glass-based substrates may be achieved by immersion of the glass-based substrates in at least one molten bath containing a salt such as, but not limited to, nitrates, sulfates, and chlorides of the larger alkali metal ion. Typical salts include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass thickness, bath temperature and glass (or monovalent ion) diffusivity. However, temperatures and immersion times different from those described above may also be used.

In one or more embodiments, the glass-based substrates may be immersed in a molten salt bath of 100% $NaNO_3$ having a temperature from about 370° C. to about 480° C. In some embodiments, the glass-based substrate may be immersed in a molten mixed salt bath including from about 5% to about 90% $KNO_3$ and from about 10% to about 95% $NaNO_3$. In some embodiments, the glass-based substrate may be immersed in a molten mixed salt bath including $Na_2SO_4$ and $NaNO_3$ and have a wider temperature range (e.g., up to about 500° C.). In one or more embodiments, the glass-based article may be immersed in a second bath, after immersion in a first bath. Immersion in a second bath may include immersion in a molten salt bath including 100% $KNO_3$ for 15 minutes to 8 hours.

In one or more embodiments, the glass-based substrate may be immersed in a molten, mixed salt bath including $NaNO_3$ and $KNO_3$ (e.g., 49%51%, 50%/50%, 51%/49%) having a temperature less than about 420° C. (e.g., about 400° C. or about 380° C.) for less than about 5 hours, or even about 4 hours or less.

Ion exchange conditions can be tailored to provide a "spike" or to increase the slope of the stress profile at or near the surface of the resulting glass-based article. This spike can be achieved by single bath or multiple baths, with the bath(s) having a single composition or mixed composition, due to the unique properties of the glass compositions used in the glass-based articles described herein.

As illustrated in FIG. 3, the glass-based article 300 of one or more embodiments includes a first surface 302 and a second surface 304 opposing the first surface, defining a thickness t. In one or more embodiments, the thickness t may be about 3 millimeters or less, such as in the range from about 0.01 millimeter to about 3 millimeters, from about 0.1 millimeter to about 3 millimeters, from about 0.2 millimeter to about 3 millimeters, from about 0.3 millimeter to about 3 millimeters, from about 0.4 millimeter to about 3 millimeters, from about 0.01 millimeter to about 2.5 millimeters, from about 0.01 millimeter to about 2 millimeters, from about 0.01 millimeter to about 1.5 millimeters, from about 0.01 millimeter to about 1 millimeter, from about 0.01 millimeter to about 0.9 millimeter, from about 0.01 millimeter to about 0.8 millimeter, from about 0.01 millimeter to about 0.7 millimeter, from about 0.01 millimeter to about 0.6 millimeter, from about 0.01 millimeter to about 0.5 millimeter, from about 0.1 millimeter to about 0.5 millimeter, from about 0.3 millimeter to about 0.5 millimeter, or any sub-ranges contained therein.

The glass-based article includes a stress profile 312 that extends from the first surface 302 to the second surface 304 (or along the entire length of the thickness t). In FIG. 3, the x-axis represents the stress value and the y-axis represents the thickness or depth within the glass-based article.

As illustrated in FIG. 3, the stress profile 312 includes a CS layer 315 (with a surface CS 310), a CT layer 325 (with a maximum CT 320) and a DOC 317 at which the stress profile 312 turns from compressive to tensile at 330. The CT layer 325 also has an associated depth or length 327 (CT region or layer). As used herein, reference to the DOC and DOL is with respect to a depth from one surface (either the first surface 302 or the second surface 304), with the understanding that such DOC or DOL may also be present from the other surface.

The surface CS 310 may be about 150 MPa or greater or about 200 MPa or greater (e.g., about 250 MPa or greater, about 300 MPa or greater, about 400 MPa or greater, about 450 MPa or greater, about 500 MPa or greater, or about 550 MPa or greater). The surface CS 310 may be up to about 900 MPa, up to about 1000 MPa, up to about 1100 MPa, or up to about 1200 MPa. The surface CS values provided herein may also comprise the maximum CS. In some embodiments, the surface CS is less than the maximum CS.

The maximum CT 320 may be greater than or equal to about $71.5/\sqrt{(t)}$. In some embodiments, the maximum CT 320 is about 80 MPa or greater, about 85 MPa or greater or about 90 MPa or greater. In some embodiments, the maximum CT 320 may be in the range from greater than about 80 MPa to about 100 MPa (e.g., from about 85 MPa to about 100 MPa, from about 90 MPa to about 100 MPa, from about 80 MPa to about 95 MPa, from about 80 MPa to about 90 MPa, from about 85 MPa to about 95 MPa, or from about 88 MPa to about 92 MP). The maximum CT 320 may be positioned at a range from about 0.3·t to about 0.7·t, from about 0.4·t to about 0.6·t or from about 0.45·t to about 0.55·t. It should be noted that any one or more of surface CS 310 and maximum CT 320 may be dependent on the thickness of the glass-based article. For example, glass-based articles having at thickness of about 0.8 mm may have a maximum CT in the range from about 85 MPa to about 100 MPa. When the thickness of the glass-based article decreases, the maximum CT may increase. In other words, the maximum CT increases with decreasing thickness (or as the glass-based article becomes thinner).

In some embodiments, the ratio of the maximum CT 320 to the surface CS 310 in the range from about 0.1 to about 0.8 (e.g., in the range from about 0.1 to about 0.7, from about 0.1 to about 0.6, from about 0.1 to about 0.5, from about 0.1 to about 0.4, from about 0.1 to about 0.3, from about 0.1 to about 0.25, from about 0.1 to about 0.2, from about 0.15 to about 0.8, from about 0.2 to about 0.8, from about 0.3 to about 0.8, from about 0.4 to about 0.8, from about 0.5 to about 0.8, or from about 0.6 to about 0.8). In known chemically strengthened glass-based articles, the ratio of the maximum CT 320 to the surface CS 310 is 0.1 or less. In some embodiments, surface CS may be 4 times (e.g., 5 times, 6 times or 6.5 times) the maximum CT or greater. In some embodiments, the surface CS may be up to about 47.5 times the maximum CT. The surface CS may be in the range from about 4 times up to about 7.5 times the maximum CT.

In one or more embodiments, the stress profile 312 comprises a maximum CS, which is typically the surface CS 310 and can be found at one or both of the first surface 302 and the second surface 304. In one or more embodiments, the CS layer or region 315 extends along a portion of the thickness to the DOC 317 and a maximum CT 320. In one or more embodiments, the DOC 317 may be about 0.1·t or greater. For example, the DOC 317 may be about 0.12·t or greater, about 0.14·t or greater, about 0.15·t or greater, about 0.16·t or greater, 0.17·t or greater, 0.18·t or greater, 0.19·t or greater, 0.20·t or greater, about 0.21·t or greater, or up to about 0.25·t. In one or more embodiments, the stress profile 312 may be described as parabolic-like in shape. In some embodiments, the stress profile along the region or depth of the glass-based article exhibiting tensile stress exhibits a parabolic-like shape. In one or more specific embodiments, the stress profile 312 is free of a flat stress (i.e., compressive or tensile) portion or a portion that exhibits a substantially constant stress (i.e., compressive or tensile). In some embodiments, the CT region exhibits a stress profile that is substantially free of a flat stress or free of a substantially constant stress. In one or more embodiments, all points of the stress profile 312 between a thickness range from about 0t up to about 0.2·t and greater than 0.8·t (or from about 0·t to about 0.3·t and greater than 0.7·t) comprise a tangent having an absolute value that is greater than about 0.1 MPa/micrometer. In some embodiments, the tangent may have an absolute value of greater than about 0.2 MPa/micrometer. In some more specific embodiments, the tangent may have an absolute value of greater than 0.3 MPa/micrometer. In even more specific embodiments, the tangent may have an absolute value of greater than 0.5 MPa/micrometer. In other words, the stress profile of one or more embodiments along these thickness ranges (i.e., 0·t up to about 2·t and greater than 0.8t, or from about 0t to about 0.3·t and 0.7·t or greater) exclude points having a tangent, as described herein. Without being bound by theory, known error function or quasi-linear stress profiles have points along these thickness ranges (i.e., from about 0·t up to about 2·t and greater than 0.8·t, or from about 0·t to about 0.3·t and 0.7·t or greater) that have a tangent may have an absolute value of less than about 0.1 MPa/micrometer, less than about 0.2 MPa/micrometer, less than about 0.3 MPa/micrometer, or less than about 0.5 MPa/micrometer (indicating a flat or zero slope stress profile along such thickness ranges, as shown in FIG. 2, 220). The glass-based articles of one or more embodiments of this disclosure do not exhibit such a stress profile having a flat or zero slope stress profile along these thickness ranges, as shown in FIG. 3.

In one or more embodiments, the glass-based article exhibits a stress profile in a thickness range from about 0.1·t to 0.3·t and from about 0.7·t to 0.9·t that comprises a maximum tangent and a minimum tangent. In some instances, the difference between the maximum tangent and the minimum tangent is about 3.5 MPa/micrometers or less, about 3 MPa/micrometers or less, about 2.5 MPa/micrometers or less, or about 2 MPa/micrometers or less.

In one or more embodiments, the glass-based article includes a stress profile 312 that is substantially free of any linear segments that extend in a depth direction or along at least a portion of the thickness t of the glass-based article. In other words, the stress profile 312 is substantially continuously increasing or decreasing along the thickness t. In some embodiments, the stress profile is substantially free of any linear segments in a depth direction having a length of about 10 micrometers or more, about 50 micrometers or more, or about 100 micrometers or more, or about 200 micrometers or more. As used herein, the term "linear" refers to a slope having a magnitude of less than about 5 MPa/micrometer, or less than about 2 MPa/micrometer along the linear segment.

In some embodiments, one or more portions of the stress profile that are substantially free of any linear segments in a depth direction are present at depths within the glass-based article of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of linear segments.

In some embodiments, the stress profile may include linear segments at depths from about 0t up to about 0.1t and may be substantially free of linear segments at depths of about 0.1t to about 0.4t. In some embodiments, the stress profile from a thickness in the range from about 0t to about 0.1t may have a slope in the range from about 20 MPa/microns to about 200 MPa/microns. As will be described herein, such embodiments may be formed using a single ion-exchange process by which the bath includes two or more alkali salts or is a mixed alkali salt bath or multiple (e.g., 2 or more) ion exchange processes.

In one or more embodiments, the glass-based article may be described in terms of the shape of the stress profile along the CT region (327 in FIG. 3). For example, in some embodiments, the stress profile along the CT region (where stress is in tension) may be approximated by equation. In some embodiments, the stress profile along the CT region may be approximated by Equation (1):

$$\text{Stress}(x) = \text{Max}T - (((CT_n \cdot (n+1))/0.5^n) \cdot |(x/t) - 0.5|^n) \quad (1).$$

Figure 4:
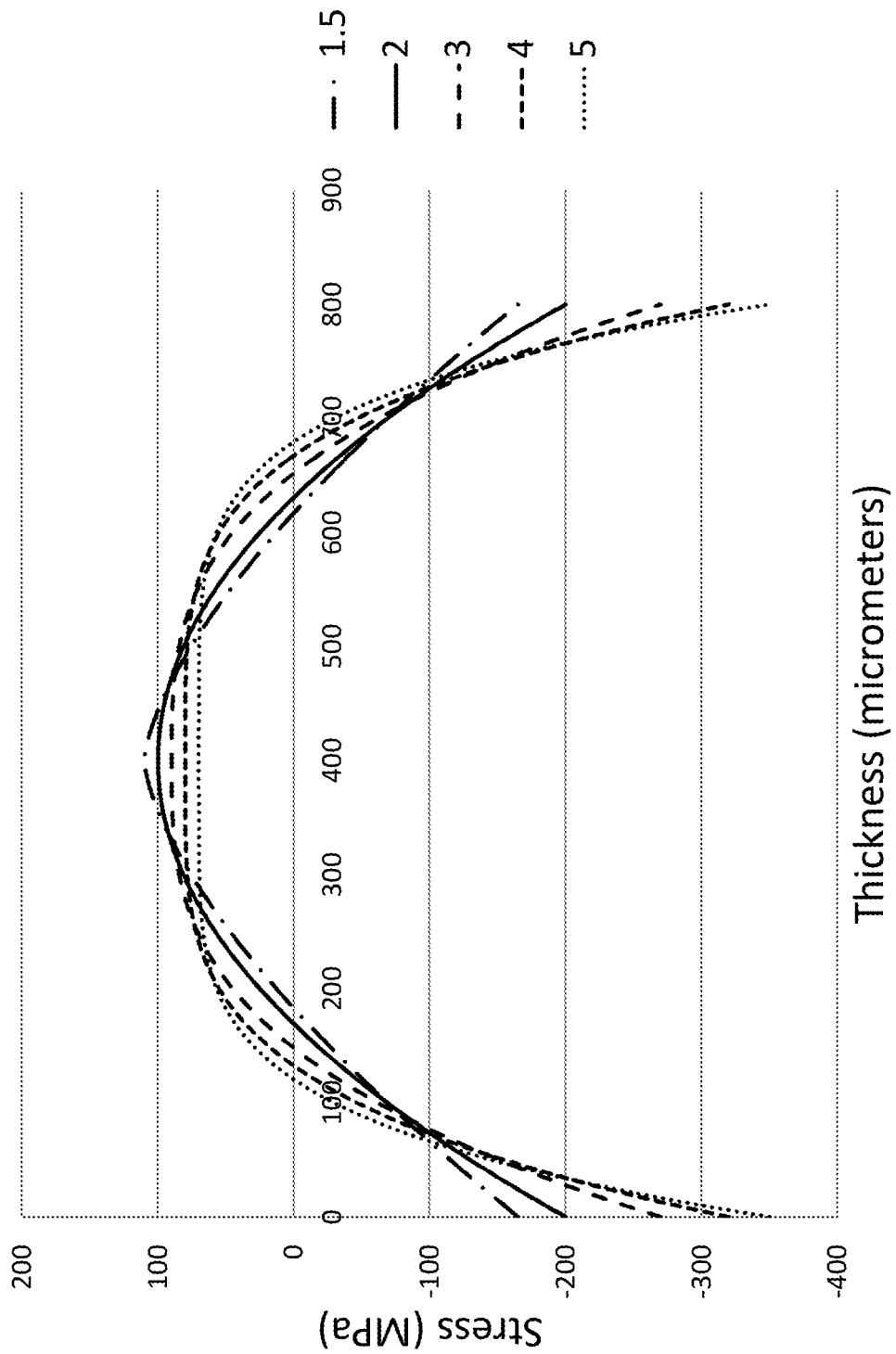
FIG. 4 is a graph illustrating various stress profiles as a function of depth according to one or more embodiments of this disclosure with the CT region having positive stress and the CS region having negative stress.

In Equation (1), the stress(x) is the stress value at position x. Here the stress is positive (tension). In Equation (1), MaxT is the maximum tension value and $CT_n$ is the tension value at n and is less than or equal to MaxT. Both MaxT and $CT_n$ are expressed as positive values in MPa. The value x is position along the thickness (t) in micrometers, with a range from 0 to t; x=0 is one surface (302, in FIG. 3), x=0.5t is the center of the glass-based article, and x=t is the opposite surface (304, in FIG. 3). MaxT used in Equation (1) is equivalent to the maximum CT, which may be greater than or equal to about $71.5/\sqrt{(t)}$. In some embodiments, the MaxT used in Equation (1) may be in the range from greater than about 80 MPa to about 100 MPa (e.g., from about 85 MPa to about 100 MPa, from about 90 MPa to about 100 MPa, from greater than about 80 MPa to about 95 MPa, from greater than about 80 to about 90 MPa, or from about 85 MPa to about 95 MPa), and n is a fitting parameter from 1.5 to 5 (e.g., 2 to 4, 2 to 3 or 1.8 to 2.2) or from about 1.5 to about 2. In one or more embodiments, n=2 can provide a parabolic stress profile, exponents that deviate from n=2 provide stress profiles with near parabolic stress profiles. FIG. 4 is a graph illustrating various stress profiles according to one or more embodiments of this disclosure, based on changes in the fitting parameter n.

In one or more embodiments, $CT_n$ may be less than MaxT where there is a compressive stress spike on one or both major surfaces of the glass-based article. In one or more embodiments, $CT_n$ is equal to MaxT when there is no compressive stress spike on one or both major surfaces of the glass-based article.

In some embodiments, the stress profile may be modified by heat treatment. In such embodiments, the heat treatment may occur before any ion-exchange processes, between ion-exchange processes, or after all ion-exchange processes. In some embodiments, the heat treatment may result reduce the slope of the stress profile at or near the surface. In some embodiments, where a steeper or greater slope is desired at the surface, an ion-exchange process after the heat treatment may be utilized to provide a "spike" or to increase the slope of the stress profile at or near the surface.

In one or more embodiments, the stress profile 312 is generated due to a non-zero concentration of a metal oxide(s) that varies along a portion of the thickness. As mentioned above, the variation in metal oxide concentration may be referred to herein as a metal oxide concentration gradient. In some embodiments, the concentration of a metal oxide is non-zero and varies, both along a thickness range from about 0·t to about 0.3·t. In some embodiments, the concentration of the metal oxide is non-zero and varies along a thickness range from about 0·t to about 0.35·t, from about 0·t to about 0.4·t, from about 0·t to about 0.45·t or from about 0·t to about 0.48·t. The metal oxide may be described as generating a stress in the glass-based article. The variation in concentration may be continuous along the above-referenced thickness ranges. Variation in concentration may include a change in metal oxide concentration of about 0.2 mol % along a thickness segment of about 100 micrometers. This change may be measured by known methods in the art including microprobe, as shown in Example 1. The metal oxide that is non-zero in concentration and varies along a portion of the thickness may be described as generating a stress in the glass-based article.

The variation in concentration may be continuous along the above-referenced thickness ranges. In some embodiments, the variation in concentration may be continuous along thickness segments in the range from about 10 micrometers to about 30 micrometers. In some embodiments, the concentration of the metal oxide decreases from the first surface to a point between the first surface and the second surface and increases from the point to the second surface.

The concentration of metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while the at deeper depths, the concentration of ions having a smaller radius is greater than the concentration of ions having larger radius. For example, where a single Na– and K– containing bath is used in the ion exchange process, the concentration of K+ ions in the glass-based article is greater than the concentration of Na+ ions at shallower depths, while the concentration of Na+ is greater than the concentration of K+ ions at deeper depths. This is due, in part, to the size of the monovalent ions that are exchanged into the glass for smaller monovalent ions. In such glass-based articles, the area at or near the surface comprises a greater CS due to the greater amount of larger ions (i.e., K+ ions) at or near the surface. This greater CS may be exhibited by a stress profile having a steeper slope at or near the surface (i.e., a spike in the stress profile at the surface).

The concentration gradient or variation of one or more metal oxides is created by chemically strengthening a glass-based substrate, as previously described herein, in which a plurality of first metal ions in the glass-based substrate is exchanged with a plurality of second metal ions. The first ions may be ions of lithium, sodium, potassium, and rubidium. The second metal ions may be ions of one of sodium, potassium, rubidium, and cesium, with the proviso that the second alkali metal ion has an ionic radius greater than the ionic radius than the first alkali metal ion. The second metal ion is present in the glass-based substrate as an oxide thereof (e.g., $Na_2O$, $K_2O$, $Rb_2O$, $Cs_2O$ or a combination thereof).

In one or more embodiments, the metal oxide concentration gradient extends through a substantial portion of the thickness t or the entire thickness t of the glass-based article, including the CT layer 327. In one or more embodiments, the concentration of the metal oxide is about 0.5 mol % or greater in the CT layer 327. In some embodiments, the concentration of the metal oxide may be about 0.5 mol % or greater (e.g., about 1 mol % or greater) along the entire thickness of the glass-based article, and is greatest at the first surface 302 and/or the second surface 304 and decreases substantially constantly to a point between the first surface 302 and the second surface 304. At that point, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. In some embodiments, the lowest concentration in the particular metal oxide is in the CT layer 327. The total concentration of the particular metal oxide in the glass-based article may be in the range from about 1 mol % to about 20 mol %.

In one or more embodiments, the glass-based article includes a first metal oxide concentration and a second metal oxide concentration, such that the first metal oxide concentration is in the range from about 0 mol % to about 15 mol % along a first thickness range from about 0t to about 0.5t, and the second metal oxide concentration is in the range from about 0 mol % to about 10 mol % from a second thickness range from about 0 micrometers to about 25 micrometers (or from about 0 micrometers to about 12 micrometers); however, the concentration of one or both the first metal oxide and the second metal oxide is non-zero along a substantial portion or the entire thickness of the glass-based article. The glass-based article may include an optional third metal oxide concentration. The first metal oxide may include $Na_2O$ while the second metal oxide may include $K_2O$.

The concentration of the metal oxide may be determined from a baseline amount of the metal oxide in the glass-based article prior to being modified to include the concentration gradient of such metal oxide.

In one or more embodiments, the glass-based articles may exhibit an increase in $Na_2O$ concentration at a center point of the glass-based article of less than about 1.3 mol % compared to the non-ion exchanged glass substrate, such as an increase of less than about 1.2 mol %, less than about 1.1 mol %, or less than about 1.0 mol %. An increase in $Na_2O$ concentration at the center point is greater than 1.3 mol % indicates that excessive diffusion of sodium ions into the glass-based article has occurred, and undesired warp and weight gain may be produced. Additionally, as described herein, excessive diffusion of sodium ions does not provide improved depth of compression, damage resistance, or drop performance. As utilized herein, the "center point" refers to any point within the glass-based article located at a depth of 0.5 t (vertically) within the glass article and at least 5t (horizontally) from the nearest peripheral edge of the glass-based article. The vertical direction is measured along a line that (1) connects the first and second surfaces and passes through the center point, and (2) is orthogonal to the first and second surfaces at the point where the line intersects the first and second surfaces. The horizontal direction is measured along a line between the peripheral edge and the center point and is orthogonal to the line used for measuring the vertical direction.

In some embodiments, the Na$_2$O molar concentration at a center point of the glass-based article is less than about 45% of the total alkali metal oxide (R$_2$O) molar concentration of the glass-based article at the center point, such as less than about 40% of the total alkali metal oxide molar concentration. The percentage of the total metal alkali oxide molar concentration attributable to Na$_2$O indicates the degree to which sodium ion-exchange into the glass-based article has occurred, as the ion-exchange is a 1:1 process in which the total metal alkali oxide molar concentration does not change. A Na$_2$O concentration at the center point greater than about 45% of the total alkali metal oxide at the center point may indicate that excessive diffusion of sodium ions into the glass-based article has occurred, and undesired warp and weight gain may be produced.

In some embodiments, the Na$_2$O molar concentration at a center point of the glass-based article is less than about 4.5 mol %, such as less than about 4 mol %, about 3 mol %, or about 2.5 mol %. By way of example, in some embodiments glass-based articles with a Na$_2$O molar concentration at a center point of the glass-based article of less than about 4.5 mol % may be formed from lithium containing glass-based substrates. A Na$_2$O concentration at the center point greater than 4.5 mol % may indicate that excessive diffusion of sodium ions into the glass-based article has occurred, and undesired warp and weight gain may be produced.

In one or more embodiments, the glass-based articles may be described in terms of how they fracture and the fragments that result from such fracture. In one or more embodiments, when fractured, the glass-based articles fracture into 2 or more fragments per square inch (or per 6.4516 square centimeters) of the glass-based article (prior to fracture). In some cases, the glass-based articles fracture into 3 or more, 4 or more, 5 or more, or 10 or more fragments per square inch (or per 6.4516 square centimeters) of the glass-based article (prior to fracture). In some instances, when fractured, the glass-based articles fracture into fragments such that 50% or more of the fragments have a surface area that is less than 5%, less than 2%, or less than 1% of the surface area of the glass-based article (prior to fracture). In some embodiments, when fractured, the glass-based articles fracture into fragments such that 90% or more or even 100% of the fragments have a surface area that is less than 5%, less than 2%, or less than 1% of the surface area of the glass-based article (prior to fracture).

In one or more embodiments, after chemically strengthening the glass-based article, the resulting stress profile 317 of the glass-based article provides improved fracture resistance. For example, in some embodiments, upon fracture, the glass-based article comprises fragments having an average longest cross-sectional dimension of less than or equal to about 2·t (e.g., 1.8·t, 1.6·t, 1.5·t, 1.4·t, 1.2·t or 1.·t or less).

In one or more embodiments, the glass-based articles may exhibit a fracture toughness (KO of about 0.65 MPa·m$^{1/2}$ or greater. In some cases, the fracture toughness may be about 0.69 MPa·m$^{1/2}$ or greater, about 0.7 MPa·m$^{1/2}$ or greater, about 0.8 MPa·m$^{1/2}$ or greater, or about 0.9 MPa·m$^{1/2}$ or greater. In some embodiments the fracture toughness may be in the range from about 0.65 MPa·m$^{1/2}$ to about 1 MPa·m$^{1/2}$.

In some embodiments, the substrate may also be characterized as having a hardness from about 500 HVN to about 800 HVN (kgf/mm2), as measured by Vicker's hardness test at a load of 200 g. In some embodiments, the glass-based article may include a Vicker's hardness is in the range from about 600 HVN to about 800 HVN.

The glass-based articles described herein may exhibit a stored tensile energy in the range from greater than 0 J/m$^2$ to about 40 J/m$^2$. In some instances, the stored tensile energy may be in the range from about 5 J/m$^2$ to about 40 J/m$^2$, from about 10 J/m$^2$ to about 40 J/m$^2$, from about 15 J/m$^2$ to about 40 J/m$^2$, from about 20 J/m$^2$ to about 40 J/m$^2$, from about 1 J/m$^2$ to about 35 J/m$^2$, from about 1 J/m$^2$ to about 30 J/m$^2$, from about 1 J/m$^2$ to about 25 J/m$^2$, from about 1 J/m$^2$ to about 20 J/m$^2$, from about 1 J/m$^2$ to about 15 J/m$^2$, from about 1 J/m$^2$ to about 10 J/m$^2$, from about 10 J/m$^2$ to about 30 J/m$^2$, from about 10 J/m$^2$ to about 25 J/m$^2$, from about 15 J/m$^2$ to about 30 J/m$^2$, from about 15 J/m$^2$ to about 25 J/m$^2$, from about 18 J/m$^2$ to about 22 J/m$^2$, from about 25 J/m$^2$ to about 40 J/m$^2$, or from about 25 J/m$^2$ to about 30 J/m$^2$. The thermally and chemically strengthened glass-based articles of one or more embodiments may exhibit a stored tensile energy of about 6 J/m$^2$ or greater, about 10 J/m$^2$ or greater, about 15 J/m$^2$ or greater, or about 20 J/m$^2$ or greater.

Stored tensile energy may be calculated using the following Equation (2):

$$\text{stored tensile energy } (J/m^2) = 1 - \nu E \int \sigma^2 dt \quad (2)$$

where $\nu$ is Poisson's ratio, E is the elastic modulus and the integration is computed for the tensile region only.

The glass-based articles described herein generally have elastic modulus or Young's modulus of about 70 GPa or greater (e.g., in the range from about 70 GPa to about 100 GPa, from about 72 GPa to about 100 GPa, from about 75 GPa to about 100 GPa, from about 76 GPa to about 100 GPa, from about 78 GPa to about 100 GPa, from about 80 GPa to about 100 GPa, from about 82 GPa to about 100 GPa, from about 84 GPa to about 100 GPa, from about 86 GPa to about 100 GPa, from about 88 GPa to about 100 GPa, from about 90 GPa to about 100 GPa, from about 70 GPa to about 95 GPa, from about 70 GPa to about 90 GPa, from about 70 GPa to about 88 GPa, from about 70 GPa to about 86 GPa, from about 70 GPa to about 85 GPa, from about 70 GPa to about 84 GPa, from about 70 GPa to about 82 GPa, or from about 70 GPa to about 80 GPa). The elastic modulus, which is intrinsic to the composition of the glass-based article, can provide the desired high stiffness, which is an extrinsic property, to the ultimate glass-based article that is produced therefrom. For clarity, unless the specific type of elastic modulus measurement is explicitly indicated, the elastic modulus described herein will be the Young's modulus of a material, rather than, for example, shear modulus, bulk modulus, Poisson's ratio, and the like.

In some embodiments, the glass-based article comprises a low liquidus viscosity that enables the formation of the glass-based articles via thin rolling techniques. As used herein, the term "liquidus viscosity" refers to the viscosity of a molten glass at the liquidus temperature, wherein the term "liquidus temperature" refers to the temperature at which crystals first appear as a molten glass cools down from the melting temperature (or the temperature at which the very last crystals melt away as temperature is increased from room temperature). In general, the glass-based articles (or the compositions used to form such articles) described herein a liquidus viscosity of less than about 100 kilopoise (kP). In some embodiments, the glass-based articles (or the compositions used to form such articles) exhibit a liquidus viscosity of less than about 80 kP, less than about 60 kP, less than about 40 kP, less than about 30 kP (e.g., in the range from about 15 kP to about 30 kP).

In one or more embodiments, the glass-based articles exhibit a Knoop Lateral Cracking Scratch Threshold in the range from about 4 N to about 7 N, from about 4.5 N to about 7 N, from about 5 N to about 7 N, from about 4 N to about 6.5 N, from about 4 N to about 6 N, or from about 5 N to about 6 N. As used herein, Knoop Scratch Lateral Cracking Threshold is load at the onset of lateral cracking (in 3 or more of 5 indentation events) which extend equal to or greater than 2 times the width of the microductile scratch groove, formed using a Knoop indenter.

In one or more embodiments, the glass-based articles exhibit a Vicker's Indentation Fracture Threshold in the range from about 10 kgf or greater, about 12 kgf or greater, or about 15 kgf or greater. In some instances, the glass-based articles exhibit a Vicker's Indentation Fracture Threshold in the range from about 15 kgf to about 25 kgf. As used herein, Vicker's Indentation Fracture Threshold is load at the onset of median/radial cracking (in 3 or more of 5 indentation events) extending from at least one corner of the indentation site.

In one or more embodiments, the glass-based articles exhibit improved surface strength when subjected to abraded ring-on-ring (AROR) testing. The strength of a material is defined as the stress at which fracture occurs. The AROR test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the AROR test methodology described herein. The contents of ASTM C1499-09 are incorporated herein by reference in their entirety.

In one embodiment, the glass specimen is abraded to normalize and/or control the surface defect condition of the sample prior to ring-on-ring testing with 90 grit silicon carbide (SiC) particles that are delivered to the glass sample using the method and apparatus described in Annex A2, entitled "abrasion Procedures," of ASTM C158-02(2012), entitled "Standard Test Methods for Strength of Glass by Flexure (Determination of Modulus of Rupture)." The contents of ASTM C158-02 and the contents of Annex 2 in particular are incorporated herein by reference in their entirety. The abrasive material is typically sandblasted onto the surface of the glass-based article at a load of 15 psi using an air pressure of 304 kPa (44 psi); although in the Examples below, the abrasive material was sandblasted onto the surface at other loads (e.g., 25 psi or 45 psi). After air flow is established, 5 cm$^3$ of abrasive material is dumped into a funnel and the sample is sandblasted for 5 seconds after introduction of the abrasive material.

Figure 5:
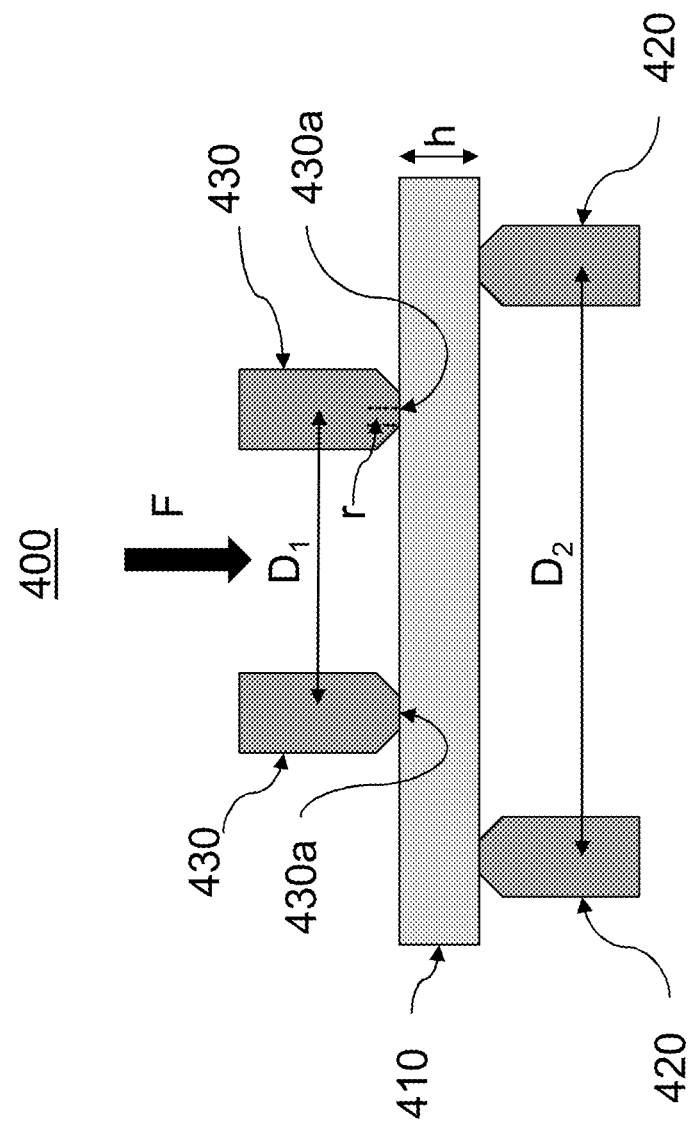
FIG. 5 is a is a schematic cross-sectional view of a ring-on-ring apparatus.

For the AROR test, a glass-based article 410 having at least one abraded surface as shown in FIG. 5 is placed between two concentric rings of differing size to determine equibiaxial flexural strength (i.e., the maximum stress that a material is capable of sustaining when subjected to flexure between two concentric rings), as also shown in FIG. 5. In the AROR configuration 400, the abraded glass-based article 410 is supported by a support ring 420 having a diameter D2. A force F is applied by a load cell (not shown) to the surface of the glass-based article by a loading ring 430 having a diameter D1.

The ratio of diameters of the loading ring and support ring D1/D2 may be in a range from about 0.2 to about 0.5. In some embodiments, D1/D2 is about 0.5. Loading and support rings 130, 120 should be aligned concentrically to within 0.5% of support ring diameter D2. The load cell used for testing should be accurate to within ±1% at any load within a selected range. In some embodiments, testing is carried out at a temperature of 23±2° C. and a relative humidity of 40±10%.

For fixture design, the radius r of the protruding surface of the loading ring 430, $h/2 \leq r \leq 3h/2$, where h is the thickness of glass-based article 410. Loading and support rings 430, 420 are typically made of hardened steel with hardness HRc>40. AROR fixtures are commercially available.

The intended failure mechanism for the AROR test is to observe fracture of the glass-based article 410 originating from the surface 430a within the loading ring 430. Failures that occur outside of this region—i.e., between the loading rings 430 and support rings 420—are omitted from data analysis. Due to the thinness and high strength of the glass-based article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. AROR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore generally be used as a statistical representation of the data obtained.

In some embodiments, the glass-based articles described herein have a surface or equibiaxial flexural strength of at least 20 kgf and up to about 30 kgf as determined by AROR testing using a load of 25 psi or even 45 psi to abrade the surface. In other embodiments, the surface strength is at least 25 kgf, and in still other embodiments, at least 30 kgf.

Figure 6:
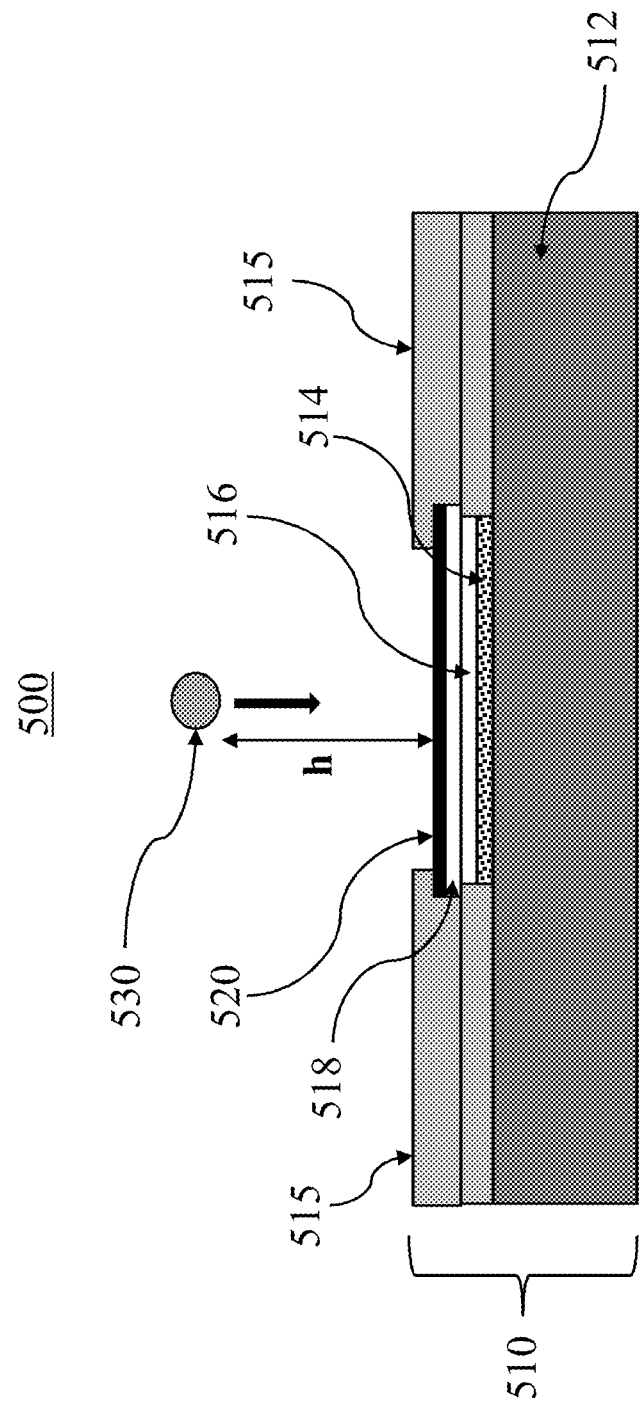
FIG. 6 is a schematic cross-sectional view of an embodiment of the apparatus that is used to perform the inverted ball on sandpaper (IBoS) test described in the present disclosure.
Figure 7:
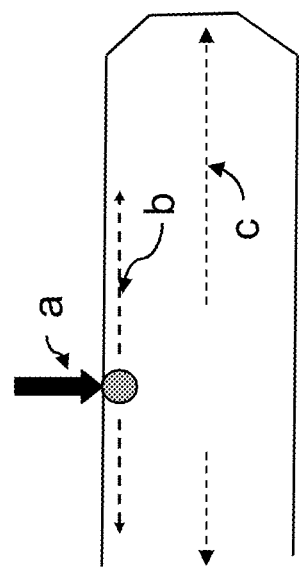
FIG. 7 is a schematic cross-sectional representation of the dominant mechanism for failure due to damage introduction plus bending that typically occurs in glass-based articles that are used in mobile or hand held electronic devices.

In some embodiments, the glass-based articles described herein may be described in terms of performance in an inverted ball on sandpaper (IBoS) test. The IBoS test is a dynamic component level test that mimics the dominant mechanism for failure due to damage introduction plus bending that typically occurs in glass-based articles that are used in mobile or hand held electronic devices, as schematically shown in FIG. 6. In the field, damage introduction (a in FIG. 7) occurs on the top surface of the glass-based article. Fracture initiates on the top surface of the glass-based article and damage either penetrates the glass-based article (b in FIG. 7) or the fracture propagates from bending on the top surface or from the interior portions of the glass-based article (c in FIG. 7). The IBoS test is designed to simultaneously introduce damage to the surface of the glass and apply bending under dynamic load. In some instances, the glass-based article exhibits improved drop performance when it includes a compressive stress than if the same glass-based article does not include a compressive stress.

An IBoS test apparatus is schematically shown in FIG. 6. Apparatus 500 includes a test stand 510 and a ball 530. Ball 530 is a rigid or solid ball such as, for example, a stainless steel ball, or the like. In one embodiment, ball 530 is a 4.2 gram stainless steel ball having diameter of 10 mm. The ball 530 is dropped directly onto the glass-based article sample 518 from a predetermined height h. Test stand 510 includes a solid base 512 comprising a hard, rigid material such as granite or the like. A sheet 514 having an abrasive material disposed on a surface is placed on the upper surface of the solid base 512 such that surface with the abrasive material faces upward. In some embodiments, sheet 514 is sandpaper having a 30 grit surface and, in other embodiments, a 180 grit surface. The glass-based article sample 518 is held in place above sheet 514 by sample holder 515 such that an air gap 516 exists between glass-based article sample 518 and sheet 514. The air gap 516 between sheet 514 and glass-based article sample 518 allows the glass-based article sample 518 to bend upon impact by ball 530 and onto the abrasive surface of sheet 514. In one embodiment, the glass-based article sample 518 is clamped across all corners to keep bending contained only to the point of ball impact and to ensure repeatability. In some embodiments, sample holder 514 and test stand 510 are adapted to accommodate sample thicknesses of up to about 2 mm. The air gap 516 is in a range from about 50 µm to about 100 µm. Air gap 516 is adapted to adjust for difference of material stiffness (Young's modulus, E), but also includes the elastic modulus and thickness of the sample. An adhesive tape 520 may be used to cover the upper surface of the glass-based article sample to collect fragments in the event of fracture of the glass-based article sample 518 upon impact of ball 530.

Various materials may be used as the abrasive surface. In a one particular embodiment, the abrasive surface is sandpaper, such as silicon carbide or alumina sandpaper, engineered sandpaper, or any abrasive material known to those skilled in the art for having comparable hardness and/or sharpness. In some embodiments, sandpaper having 30 grit may be used, as it has a surface topography that is more consistent than either concrete or asphalt, and a particle size and sharpness that produces the desired level of specimen surface damage.

Figure 8:
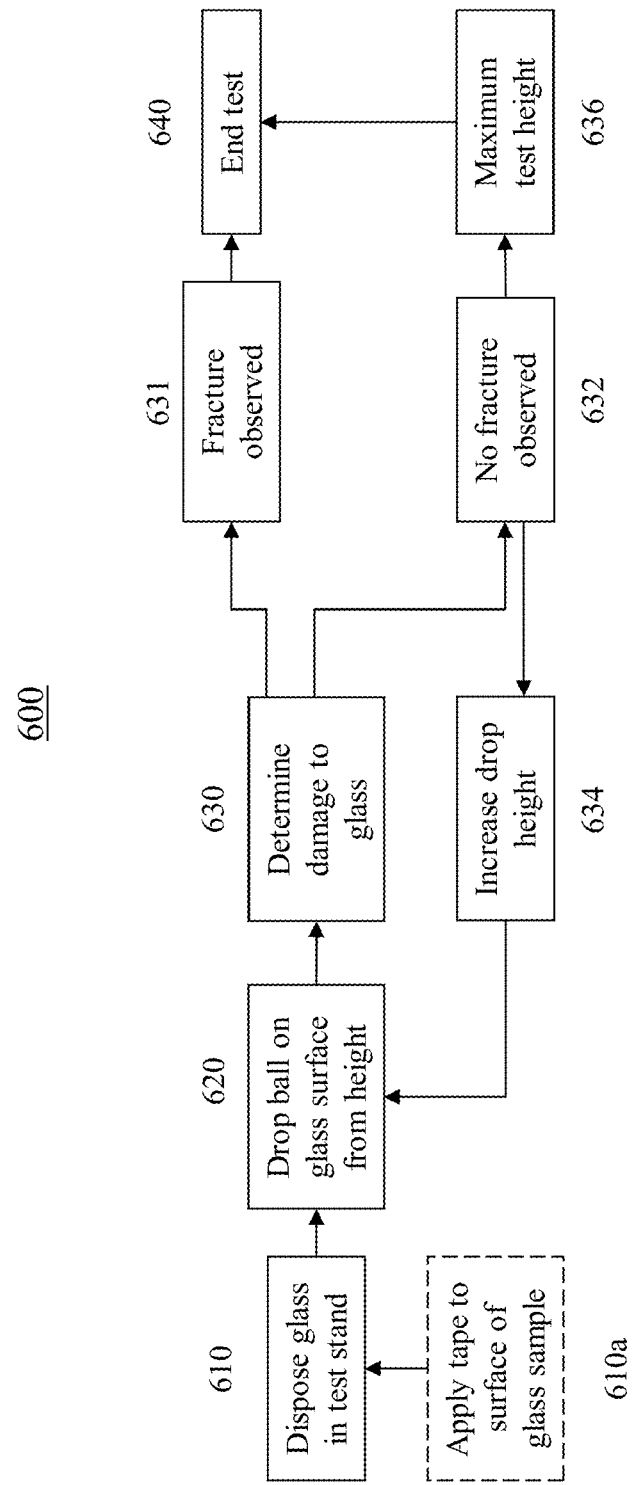
FIG. 8 is a flow chart for a method of conducting the IBoS test in the apparatus described herein.

In one aspect, a method 600 of conducting the IBoS test using the apparatus 500 described hereinabove is shown in FIG. 8. In Step 610, a glass-based article sample (518 in FIG. 6) is placed in the test stand 510, described previously and secured in sample holder 515 such that an air gap 516 is formed between the glass-based article sample 518 and sheet 514 with an abrasive surface. Method 600 presumes that the sheet 514 with an abrasive surface has already been placed in test stand 510. In some embodiments, however, the method may include placing sheet 514 in test stand 510, such that the surface with abrasive material faces upward. In some embodiments (Step 610a), an adhesive tape 520 is applied to the upper surface of the glass-based article sample 518 prior to securing the glass-based article sample 518 in the sample holder 510.

In Step 620, a solid ball 530 of predetermined mass and size is dropped from a predetermined height h onto the upper surface of the glass-based article sample 518, such that the ball 530 impacts the upper surface (or adhesive tape 520 affixed to the upper surface) at approximately the geometric center (i.e., within 1 mm, or within 3 mm, or within 5 mm, or within 10 mm of the geometric center) of the upper surface. Following impact in Step 620, the extent of damage to the glass-based article sample 518 is determined (Step 630). As previously described hereinabove, herein, the term "fracture" means that a crack propagates across the entire thickness and/or entire surface of a substrate when the substrate is dropped or impacted by an object.

In method 600, the sheet 518 with the abrasive surface may be replaced after each drop to avoid "aging" effects that have been observed in repeated use of other types (e.g., concrete or asphalt) of drop test surfaces.

Various predetermined drop heights h and increments are typically used in method 600. The test may, for example, utilize a minimum drop height to start (e.g., about 10-20 cm). The height may then be increased for successive drops by either a set increment or variable increments. The test described in method 600 is stopped once the glass-based article sample 518 breaks or fractures (Step 631). Alternatively, if the drop height h reaches the maximum drop height (e.g., about 100 cm) without fracture, the drop test of method 600 may also be stopped, or Step 620 may be repeated at the maximum height until fracture occurs.

In some embodiments, IBoS test of method 600 is performed only once on each glass-based article sample 518 at each predetermined height h. In other embodiments, however, each sample may be subjected to multiple tests at each height.

If fracture of the glass-based article sample 518 has occurred (Step 631 in FIG. 8), the IBoS test according to method 600 is ended (Step 640). If no fracture resulting from the ball drop at the predetermined drop height is observed (Step 632), the drop height is increased by a predetermined increment (Step 634)—such as, for example 5, 10, or 20 cm—and Steps 620 and 630 are repeated until either sample fracture is observed (631) or the maximum test height is reached (636) without sample fracture. When either Step 631 or 636 is reached, the test according to method 600 is ended.

When subjected to the inverted ball on sandpaper (IBoS) test described above, embodiments of the glass-based article described herein have at least about a 60% survival rate when the ball is dropped onto the surface of the glass from a height of 100 cm. For example, a glass-based article is described as having a 60% survival rate when dropped from a given height when three of five identical (or nearly identical) samples (i.e., having approximately the same composition and, when strengthened, approximately the same compressive stress and depth of compression or compressive stress layer, as described herein) survive the IBoS drop test without fracture when dropped from the prescribed height (here 100 cm). In other embodiments, the survival rate in the 100 cm IBoS test of the glass-based articles that are strengthened is at least about 70%, in other embodiments, at least about 80%, and, in still other embodiments, at least about 90%. In other embodiments, the survival rate of the strengthened glass-based articles dropped from a height of 100 cm in the IBoS test is at least about 60%, in other embodiments, at least about 70%, in still other embodiments, at least about 80%, and, in other embodiments, at least about 90%. In one or more embodiments, the survival rate of the strengthened glass-based articles dropped from a height of 150 cm in the IBoS test is at least about 60%, in other embodiments, at least about 70%, in still other embodiments, at least about 80%, and, in other embodiments, at least about 90%.

To determine the survivability rate of the glass-based articles when dropped from a predetermined height using the IBoS test method and apparatus described hereinabove, at least five identical (or nearly identical) samples (i.e., having approximately the same composition and, if strengthened, approximately the same compressive stress and depth of compression or layer) of the glass-based articles are tested, although larger numbers (e.g., 10, 20, 30, etc.) of samples may be subjected to testing to raise the confidence level of the test results. In other embodiments, at least 10 samples are tested to determine the survivability rate. Each sample is dropped a single time from the predetermined height (e.g., 100 cm or 150 cm) or, alternatively, dropped from progressively higher heights without fracture until the predetermined height is reached, and visually (i.e., with the naked eye) examined for evidence of fracture (crack formation and propagation across the entire thickness and/or entire surface of a sample). A sample is deemed to have "survived" the drop test if no fracture is observed after being dropped from the predetermined height, and a sample is deemed to have "failed" (or "not survived") if fracture is observed when the sample is dropped from a height that is less than or equal to the predetermined height. The survivability rate is determined to be the percentage of the sample population that survived the drop test. For example, if 7 samples out of a group of 10 did not fracture when dropped from the predetermined height, the survivability rate of the glass would be 70%.

The glass-based articles described herein may be transparent. In one or more the glass-based article may have a thickness of about 1 millimeter or less and exhibit a transmittance of about 88% or greater over a wavelength in the range from about 380 nm to about 780 nm.

The glass-based article may also exhibit a substantially white color. For example, the glass-based article may exhibit CIELAB color space coordinates, under a CIE illuminant F02, of L* values of about 88 and greater, a* values in the range from about −3 to about +3, and b* values in the range from about −6 to about +6. Alternatively, the glass-based article may exhibit CIELAB color space coordinates, under a CIE illuminant F02, of L* values of about 40 and less, a* values in the range from about −3 to about +3, and b* values in the range from about −6 to about +6. Such color space coordinates may be present under other CIE illuminants (e.g., D65).

Choice of substrates not particularly limited. In some examples, the glass-based article may be described as having a high cation diffusivity for ion exchange. In one or more embodiments, the glass or glass-ceramic has fast ion-exchange capability, i.e., the glass or glass-ceramic exhibits a monovalent ion diffusivity that is about 450 μm²/hour or greater at 460° C. or is about 500 μm²/hour or greater at 460° C.

At a certain temperature the diffusivity is calculated using Equation (3):

$$\text{Diffusivity} = DOL_{IOX}^2 / 5.6 * T \quad (3)$$

in which $DOL_{IOX}$ is depth of ion-exchange layer and T is the IOX time it takes to reach that $DOL_{IOX}$.

The glass-based article may include an amorphous substrate, a crystalline substrate or a combination thereof (e.g., a glass-ceramic substrate). In one or more embodiments, the glass-based article substrate (prior to being chemically strengthened as described herein) may include a glass composition, in mole percent (mole %), including: $SiO_2$ in the range from about 40 to about 80, $Al_2O_3$ in the range from about 10 to about 30, $B_2O_3$ in the range from about 0 to about 10, $R_2O$ in the range from about 0 to about 20, and RO in the range from about 0 to about 15. As used herein, $R_2O$ refers to the total amount of alkali metal oxides such as $Li_2O$, $Na_2O$, $K_2O$, $Rb_2O$, and $Cs_2O$. As used herein RO refers to the total amount of alkaline earth metal oxides such as MgO, CaO, SrO, BaO, ZnO and the like. In some instances, the composition may include either one or both of $ZrO_2$ in the range from about 0 mol % to about 5 mol % and $P_2O_5$ in the range from about 0 to about 15 mol %. $TiO_2$ can be present from about 0 mol % to about 2 mol %.

In some embodiments, the glass composition may include $SiO_2$ in an amount, in mol %, in the range from about 45 to about 80, from about 45 to about 75, from about 45 to about 70, from about 45 to about 65, from about 45 to about 60, from about 50 to about 70, from about 55 to about 70, from about 60 to about 70, from about 70 to about 75, from about 70 to about 72, from about 50 to about 65, or any sub-ranges contained therein.

In some embodiments, the glass composition may include $Al_2O_3$ in an amount, in mol %, in the range from about 5 to about 28, from about 5 to about 26, from about 5 to about 25, from about 5 to about 24, from about 5 to about 22, from about 5 to about 20, from about 6 to about 30, from about 8 to about 30, from about 10 to about 30, from about 12 to about 30, from about 12 to about 18, from about 12 to about 14, or any sub-ranges contained therein.

In one or more embodiments, the glass composition may include $B_2O_3$ in an amount, in mol %, in the range from about 0 to about 8, from about 0 to about 6, from about 0 to about 4, from about 0.1 to about 8, from about 0.1 to about 6, from about 0.1 to about 4, from about 1 to about 10, from about 2 to about 10, from about 4 to about 10, from about 2 to about 8, from about 0.1 to about 5, from about 1 to about 3, or any sub-ranges contained therein. In some instances, the glass composition may be free or substantially free of $B_2O_3$. As used herein, the phrase "substantially free" with respect to the components of the glass composition means that the component is not actively or intentionally added to the glass compositions during initial batching or subsequent ion exchange, but may be present as an impurity. For example, a glass may be described as being substantially free of a component, when the component is present in an amount of less than about 0.1 mol %.

In some embodiments, the glass composition may include one or more alkali earth metal oxides, such as MgO, CaO and ZnO. In some embodiments, the total amount of the one or more alkali earth metal oxides may be a non-zero amount up to about 15 mol %. In one or more specific embodiments, the total amount of any of the alkali earth metal oxides may be a non-zero amount up to about 14 mol %, up to about 12 mol %, up to about 10 mol %, up to about 8 mol %, up to about 6 mol %, up to about 4 mol %, up to about 2 mol %, or up about 1.5 mol %. In some embodiments, the total amount, in mol %, of the one or more alkali earth metal oxides may be in the range from about 0.1 to 10, from about 0.1 to 8, from about 0.1 to 6, from about 0.1 to 5, from about 1 to 10, from about 2 to 10, from about 2.5 to 8, or any sub-ranges contained therein. The amount of MgO may be in the range from about 0 mol % to about 5 mol %, from about 2 mol % to about 4 mol %, or any sub-ranges contained therein. The amount of ZnO may be in the range from about 0 to about 2 mol %, from about 0.1 mol % to about 2 mol %, from about 0.1 mol % to about 1 mol %, from about 0.5 mol % to about 1.5 mol %, or any sub-ranges contained therein. The amount of CaO may be from about 0 mol % to about 2 mol %. In one or more embodiments, the glass composition may include MgO and may be substantially free of CaO and ZnO. In one embodiment, the glass composition may include any one of CaO or ZnO and may be substantially free of the others of MgO, CaO and ZnO. In one or more specific embodiments, the glass composition may include only two of the alkali earth metal oxides of MgO, CaO and ZnO and may be substantially free of the third of the alkali earth metal oxides.

The total amount, in mol %, of alkali metal oxides $R_2O$ in the glass composition may be in the range from about 5 to about 20, from about 5 to about 18, from about 5 to about 16, from about 5 to about 15, from about 5 to about 14, from about 5 to about 12, from about 5 to about 10, from about 5 to about 8, from about 6 to about 20, from about 7 to about 20, from about 8 to about 20, from about 8 to about 18, from about 8 to about 16, from about 8 to about 14, from about 8 to about 12, from about 8 to about 11, or any sub-ranges contained therein.

In one or more embodiments, the glass composition includes $Na_2O$ in an amount in the range from about 0 mol % to about 18 mol %, from about 0 mol % to about 16 mol %, from about 0 mol % to about 14 mol %, from about 0 mol % to about 12 mol %, from about 1 mol % to about 18 mol %, from about 1 mol % to about 16 mol %, from about 1 mol % to about 14 mol %, from about 1 mol % to about 12 mol %, from about 1 mol % to about 10 mol %, from about 1 mol % to about 8 mol %, from about 1 mol % to about 5 mol %, from about 1 mol % to about 4 mol %, from about 1 mol % to about 3 mol %, or any sub-ranges contained therein. In some embodiments, the composition may include less than about 4 mol % $Na_2O$.

In some embodiments, the amount of $Li_2O$ and $Na_2O$ is controlled to a specific amount or ratio to balance formability and ion exchangeability. For example, as the amount of $Li_2O$ increases, the liquidus viscosity may be reduced, thus preventing some forming methods from being used; however, such glass compositions are ion exchanged to deeper DOC levels, as described herein. The amount of $Na_2O$ can modify liquidus viscosity but can inhibit ion exchange to deeper DOC levels. In one or more embodiments, for sufficient stress at depth in $Li_2O$ containing glass compositions (or those compositions where an Na+ for Li+ exchange is the primary strengthening mechanism), the glass composition of one or more embodiments includes the compositional ratio of $Li_2O/(R_2O)$ of greater than about 0.3, about 0.45 or greater, about 0.5 or greater, or about 0.7 or greater. To maintain higher CS values at deeper depths in the glass-based articles described herein, and especially in such glass-based articles that include $Na_2O$ (or those compositions where a K+ for Na+ exchange is the primary strengthening mechanism), the glass composition of one or more embodiments may include the compositional ratio of $Na_2O/(R_2O)$ of greater than about 0.3, about 0.5 or greater, or about 0.7 or greater.

In one or more embodiments, the glass composition may include $K_2O$ in an amount less than about 5 mol %, less than about 4 mol %, less than about 3 mol %, less than about 2 mol %, or less than about 1 mol %. In one or more alternative embodiments, the glass composition may be free or substantially free, as defined herein, of $K_2O$.

In one or more embodiments, the glass composition may include $Li_2O$ in an amount about 0 mol % to about 18 mol %, from about 0 mol % to about 15 mol % or from about 0 mol % to about 10 mol %, from about 0 mol % to about 8 mol %, from about 0 mol % to about 6 mol %, from about 0 mol % to about 4 mol %, from about 0 mol % to about 2 mol %, or any sub-ranges contained therein. In some embodiments, the glass composition may include $Li_2O$ in an amount about 2 mol % to about 10 mol %, from about 4 mol % to about 10 mol %, from about 6 mol % to about 10 mol %, from about 5 mol % to about 8 mol %, or any sub-ranges contained therein. In one or more alternative embodiments, the glass composition may be free or substantially free, as defined herein, of $Li_2O$.

In one or more embodiments, the glass composition may include $Fe_2O_3$. In such embodiments, $Fe_2O_3$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol % and all ranges and sub-ranges therebetween. In one or more alternative embodiments, the glass composition may be substantially free, as defined herein, of $Fe_2O_3$.

In one or more embodiments, the glass composition may include $ZrO_2$. In such embodiments, $ZrO_2$ may be present in an amount less than about 1 mol %, less than about 0.9 mol %, less than about 0.8 mol %, less than about 0.7 mol %, less than about 0.6 mol %, less than about 0.5 mol %, less than about 0.4 mol %, less than about 0.3 mol %, less than about 0.2 mol %, less than about 0.1 mol %, and all ranges and sub-ranges therebetween. In one or more alternative embodiments, the glass composition may be free or substantially free, as defined herein, of $ZrO_2$.

In one or more embodiments, the glass composition may include $P_2O_5$ in a range from about 0 mol % to about 10 mol %, from about 0 mol % to about 8 mol %, from about 0 mol % to about 6 mol %, from about 0 mol % to about 4 mol %, from about 0.1 mol % to about 10 mol %, from about 0.1 mol % to about 8 mol %, from about 2 mol % to about 8 mol %, from about 2 mol % to about 6 mol %, from about 2 mol % to about 4 mol %, or any sub-ranges contained therein. In some instances, the glass composition may be free or substantially free of $P_2O_5$.

In one or more embodiments, the glass composition may include $TiO_2$. In such embodiments, $TiO_2$ may be present in an amount less than about 6 mol %, less than about 4 mol %, less than about 2 mol %, or less than about 1 mol %. In one or more alternative embodiments, the glass composition may be free or substantially free, as defined herein, of $TiO_2$. In some embodiments, $TiO_2$ is present in an amount in the range from about 0.1 mol % to about 6 mol %, from about 0.1 mol % to about 4 mol %, or any sub-ranges contained therein.

In some embodiments, the glass composition may include various compositional relationships. For example, the glass composition may include a ratio of the amount of $Li_2O$ (in mol %) to the total amount of $R_2O$ (in mol %) in the range from about 0 to about 1, from about 0.4 to about 1, from about 0.45 to about 1, from about 0.5 to about 1, from about 0.6 to about 1, or any sub-ranges contained therein.

In some embodiments, the glass composition may include a difference between the total amount of $R_2O$ (in mol %) to the amount of $Al_2O_3$ (in mol %) ($R_2O-Al_2O_3$) in the range from about −5 to about 2, from about −5 to about 1.5, from about −5 to about 1, from about −5 to about 0, from about −5 to about −1, from about −5 to about −2, from about −4 to about 2, from about −3 to about 2, from about −2 to about 2, from about −3 to about −1, or any sub-ranges contained therein.

In some embodiments, the glass composition may include a difference between the total amount of $R_xO$ (in mol %) to the amount of $Al_2O_3$ (in mol %) ($R_xO-Al_2O_3$) in the range from about 0 to about 5, from about 0 to about 4, from about 0 to about 3, from about 0.1 to about 4, from about 0.1 to about 3, from about 1 to about 3, from about 1 to about 2, or any sub-ranges contained therein. As used herein, $R_xO$ includes $R_2O$ and RO, as defined herein.

In some embodiments, the glass composition may include a ratio of the total amount of $R_2O$ (in mol %) to the amount of $Al_2O_3$ (in mol %) ($R_2O/Al_2O_3$) in the range from about −4 to about 5, from about −2 to about 4, from about 0.1 to about 5, or any sub-ranges contained therein. For example, the ratio of the total amount of $R_2O$ (in mol %) to the amount of $Al_2O_3$ (in mol %) ($R_2O/Al_2O_3$) may be in the range from about −4 to about 4.5, from about −4 to about 4, from about −4 to about 3.5, from about −4 to about 3, from about −4 to about 2.5, from about −4 to about 2, from about −4 to about 1.5, from about −4 to about 1, from about −3.5 to about 5, from about −3 to about 5, from about −2.5 to about 5, from about −2 to about 5, from about −1.5 to about 5, from about −1 to about 5, from about 0 to about 5, from about 0 to about 4, from about 0 to about 3, from about 0.1 to about 4, from about 0.1 to about 3, from about 0.1 to about 2, or any sub-ranges contained therein.

In one or more embodiments, the glass composition includes a combined amount of $Al_2O_3$ and $Na_2O$ of about 15 mol % or less, 14 mol % or less, 13 mol % or less, 12 mol % or less, 11 mol % or less, or about 10.5 mol % or less. The combined amount of $Al_2O_3$ and $Na_2O$ may be greater than about 5 mol %.

The glass composition of one or more embodiments may exhibit a ratio of the amount of MgO (in mol %) to the total amount of RO (in mol %) in the range from about 0 to about 1. In some embodiments, the ratio MgO/RO is in the range from about 0 to about 0.9, from about 0 to about 0.8, from about 0 to about 0.7, from about 0 to about 0.6, from about 0 to about 0.5, from about 0.1 to about 1, from about 0.2 to about 1, from about 0.3 to about 1, from about 0.4 to about 1, from about 0.5 to about 1, or any sub-ranges contained therein.

In some embodiments, the glass composition may be free or substantially free of nucleating agents. Examples of typical nucleating agents are $TiO_2$, $ZrO_2$ and the like. Nucleating agents may be described in terms of function in that nucleating agents are constituents in the glass can initiate the formation of crystallites in the glass.

In some embodiments, the compositions used for the glass substrate may be batched with from about 0 mol % to about 2 mol % of at least one fining agent selected from any one or more of $Na_2SO_4$, NaCl, NaF, NaBr, $K_2SO_4$, KCl, KF, KBr, $As_2O_3$, $Sb_2O_3$, and $SnO_2$. The glass composition according to one or more embodiments may further include $SnO_2$ in the range from about 0 to about 2, from about 0 to about 1, from about 0.1 to about 2, from about 0.1 to about 1, from about 1 to about 2, or any sub-ranges contained therein. The glass compositions disclosed herein may be free or substantially free of $As_2O_3$ and/or $Sb_2O_3$.

In one or more embodiments, the composition may specifically include 62 mol % to 75 mol % $SiO_2$; 10.5 mol % to about 17 mol % $Al_2O_3$; 5 mol % to about 13 mol % $Li_2O$; 0 mol % to about 4 mol % ZnO; 0 mol % to about 8 mol % MgO; 2 mol % to about 5 mol % $TiO_2$; 0 mol % to about 4 mol % $B_2O_3$; 0 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % $MnO_x$; and 0.05 mol % to about 0.2 mol % $SnO_2$. As utilized herein, $MnO_x$ refers to all varieties of manganese oxides.

In one or more embodiments, the composition may include 67 mol % to about 74 mol % $SiO_2$; 11 mol % to about 15 mol % $Al_2O_3$; 5.5 mol % to about 9 mol % $Li_2O$; 0.5 mol % to about 2 mol % ZnO; 2 mol % to about 4.5 mol % MgO; 3 mol % to about 4.5 mol % $TiO_2$; 0 mol % to about 2.2 mol % $B_2O_3$; 0 mol % to about 1 mol % $Na_2O$; 0 mol % to about 1 mol % $K_2O$; 0 mol % to about 1 mol % $ZrO_2$; 0 mol % to about 4 mol % $P_2O_5$; 0 mol % to about 0.1 mol % $Fe_2O_3$; 0 mol % to about 1.5 mol % $MnO_x$; and 0.08 mol % to about 0.16 mol % $SnO_2$.

In one or more embodiments, the composition may include 70 mol % to 75 mol % $SiO_2$; 10 mol % to about 15 mol % $Al_2O_3$; 5 mol % to about 13 mol % $Li_2O$; 0 mol % to about 4 mol % ZnO; 0.1 mol % to about 8 mol % MgO; 0 mol % to about 5 mol % $TiO_2$; 0.1 mol % to about 4 mol % $B_2O_3$; 0.1 mol % to about 5 mol % $Na_2O$; 0 mol % to about 4 mol % $K_2O$; 0 mol % to about 2 mol % $ZrO_2$; 0 mol % to about 7 mol % $P_2O_5$; 0 mol % to about 0.3 mol % $Fe_2O_3$; 0 mol % to about 2 mol % $MnO_x$; and 0.05 mol % to about 0.2 mol % $SnO_2$.

Other exemplary compositions of glass-based articles prior to being chemically strengthened, as described herein, are shown in Table 1A. Table 1B lists selected physical properties determined for the examples listed in Table 1A. The physical properties listed in Table 1B include: density; low temperature and high temperature CTE; strain, anneal and softening points; $10^{11}$ Poise, 35 kP, 200 kP, liquidus, and zircon breakdown temperatures; zircon breakdown and liquidus viscosities; Poisson's ratio; Young's modulus; refractive index, and stress optical coefficient. In some embodiments, the glass-based articles and glass substrates described herein have a high temperature CTE of less than or equal to 30 ppm/° C. and/or an elastic modulus of at least 70 GPa and, in some embodiments, an elastic modulus of up to 80 GPa.

TABLE 1A

Exemplary compositions prior to chemical strengthening.

| Mol % | Ex. A | Ex. B | Ex. C | Ex. D | Ex. E | Ex. F |
|---|---|---|---|---|---|---|
| $SiO_2$ | 71.8 | 69.8 | 69.8 | 69.8 | 69.8 | 69.8 |
| $Al_2O_3$ | 13.1 | 13 | 13 | 13 | 13 | 13 |
| $B_2O_3$ | 2 | 2.5 | 4 | 2.5 | 2.5 | 4 |
| $Li_2O$ | 8 | 8.5 | 8 | 8.5 | 8.5 | 8 |
| MgO | 3 | 3.5 | 3 | 3.5 | 1.5 | 1.5 |
| ZnO | 1.8 | 2.3 | 1.8 | 2.3 | 2.3 | 1.8 |
| $Na_2O$ | 0.4 | 0.4 | 0.4 | 0.4 | 0.4 | 0.4 |
| $TiO_2$ | 0 | 0 | 0 | 1 | 1 | 1 |
| $Fe_2O_3$ | 0 | 0 | 0 | 0.8 | 0.8 | 0.8 |
| $SnO_2$ | 0.1 | 0.1 | 0.1 | 0.1 | 0.1 | 0.1 |

| Mol % | Ex. G | Ex. H | Ex. I | Ex. J | Ex. K | Ex. L | Ex. M | Ex. N |
|---|---|---|---|---|---|---|---|---|
| $SiO_2$ | 70.18 | 70.91 | 71.28 | 71.65 | 71.65 | 71.65 | 74.77 | 72.00 |
| $Al_2O_3$ | 12.50 | 12.78 | 12.93 | 13.07 | 13.07 | 13.07 | 10.00 | 12.50 |
| $B_2O_3$ | 1.91 | 1.95 | 1.98 | 2.00 | 2.00 | 2.00 | 1.99 | 2.00 |
| $Li_2O$ | 7.91 | 7.95 | 7.96 | 7.98 | 6.98 | 5.00 | 6.13 | 6.00 |
| $Na_2O$ | 4.43 | 2.43 | 1.42 | 0.41 | 1.41 | 3.40 | 3.97 | 0.50 |
| MgO | 2.97 | 2.98 | 2.99 | 3.00 | 3.00 | 3.00 | 2.94 | 2.10 |
| ZnO | 0.00 | 0.89 | 1.34 | 1.80 | 1.80 | 1.80 | 0.00 | 0.00 |
| CaO | 0.00 | 0.00 | 0.00 | 0.00 | 0.00 | 0.00 | 0.05 | 4.90 |
| $SnO_2$ | 0.10 | 0.10 | 0.10 | 0.10 | 0.10 | 0.10 | 0.10 | 0.10 |
| $Li_2O/R_2O$ | 0.64 | 0.77 | 0.85 | 0.95 | 0.83 | 0.60 | 0.61 | 0.92 |

TABLE 1A-continued

Exemplary compositions prior to chemical strengthening.

| | | | | | | | |
|---|---|---|---|---|---|---|---|
| $R_2O—Al_2O_3$ | −0.16 | −2.41 | −3.54 | −4.68 | −4.68 | −4.67 | 0.10 | −6.00 |
| $R_xO—Al_2O_3$ | 2.81 | 1.47 | 0.79 | 0.12 | 0.12 | 0.13 | 3.09 | 1.00 |
| $R_2O/Al_2O_3$ | 0.99 | 0.81 | 0.73 | 0.64 | 0.64 | 0.64 | 1.01 | 0.52 |
| MgO/RO | 1.00 | 0.77 | 0.69 | 0.63 | 0.63 | 0.63 | 1.00 | 1.00 |
| $R_2O$ | 12.34 | 10.38 | 9.39 | 8.39 | 8.39 | 8.40 | 10.10 | 6.50 |
| RO | 2.97 | 3.88 | 4.34 | 4.79 | 4.79 | 4.79 | 2.99 | 7.00 |
| $Na_2O + Al_2O_3$ | 16.93 | 15.21 | 14.35 | 13.48 | 14.48 | 16.47 | | |

TABLE 1B

Selected physical properties of Examples G-L.

| | Ex. G | Ex. H | Ex. I | Ex. J | Ex. K | Ex. L |
|---|---|---|---|---|---|---|
| Strain pt. (C. °) | 553 | 592 | 604 | 617 | 613 | 615 |
| Anneal pt.(C. °) | 602 | 642 | 654 | 667 | 666 | 668 |
| Softening pt. (C. °) | | | | 919 | 921 | 929 |
| Fulcher A | −3.277 | −2.717 | −2.47 | −3.039 | −3.216 | −3.212 |
| Fulcher B | 9103.3 | 7328.4 | 6642 | 7326.7 | 8338.1 | 8522.4 |
| Fulchur $T_0$ | 7.1 | 193.8 | 260 | 176.7 | 147 | 136.1 |
| $T^{200\,kP}$ (° C.) | 1640 | 1654 | 1652 | 1642 | | |
| Liquidus temperature (° C.) | 1175 | 1235 | 1240 | 1265 | 1280 | 1290 |
| Liquidus phase | spodumene | spodumene | spodumene | spodumene | gahnite | gahnite |
| Liquidus viscosity (P) | 33000 | 21000 | 20000 | 14000 | 13900 | 14500 |
| Low temperature CTE 25-300° C. (ppm/° C.) | | 4.6 | | | | |
| Density (g/cm³) | | 2.386 | | | | |
| Stress optical coefficient (nm/cm/MPa) | 30.47 | 30.9 | 30.75 | 30.83 | 31.07 | 31.44 |
| Refractive index at 589 nm | 1.5073 | 1.5087 | 1.51 | 1.5112 | 1.51 | 1.5076 |
| Young's (elastic) modulus (GPa) | 80.39 | 81.4 | 82.19 | 82.05 | 82.6 | 81.63 |
| Shear modulus (GPa) | 33.16 | 33.8 | 33.85 | 33.78 | 34.13 | 33.58 |
| Poisson's ratio | 0.211 | 0.205 | 0.213 | 0.215 | 0.209 | 0.214 |
| Specific modulus (GPa/g/cc) | | 34.1 | | | | |
| $K_{1C}$ (MPa · m$^{1/2}$)* | | 0.75 | | | | |
| Vicker's hardness (HVN)* | | 605 | | | | |

*indicates glass substrate property measured, before strengthening.

TABLE 1C

Properties of Example H after ion exchanging in molten salt bath including 80% $KNO_3$ and 20% $NaNO_3$, having a temperature of 430° C. for 16 hours.

| | Ex. H |
|---|---|
| Max CT (MPa) | 75 |
| Knoop Scratch Threshold* | from greater than about 4 to less than or equal to about 6 |
| Vicker's hardness (HVN) | 635 |
| Vicker's IFT (kgf) | from greater than about 10 to less than or equal to about 15 |

*indicates glass substrate property measured, before strengthening.

Where the glass-based article includes a glass-ceramic, the crystal phases may include β-spodumene, rutile, gahnite or other known crystal phases and combinations thereof.

The glass-based article may be substantially planar, although other embodiments may utilize a curved or otherwise shaped or sculpted substrate. In some instances, the glass-based article may have a three dimension ("3D") or two and one-half dimension ("2.5D") shape. In some embodiments, the glass-based article may have a 3D shape that is non-planar, dish-shaped, or sled-shaped, wherein both major surfaces of the substrate are non-planar. In some other embodiments, the glass-based article may have a 2.5D shape with at least one edge of the glass-article having an asymmetric profile, such that one of the major surfaces of the substrate is non-planar. The glass-based article may be substantially optically clear, transparent and free from light scattering. The glass-based article may have a refractive index in the range from about 1.45 to about 1.55. As used herein, the refractive index values are with respect to a wavelength of 550 nm.

Additionally or alternatively, the thickness of the glass-based article may be constant along one or more dimension or may vary along one or more of its dimensions for aesthetic and/or functional reasons. For example, the edges of the glass-based article may be thicker as compared to more central regions of the glass-based article. The length, width and thickness dimensions of the glass-based article may also vary according to the article application or use.

The glass-based article may be characterized by the manner in which it is formed. For instance, where the glass-based article may be characterized as float-formable (i.e., formed by a float process), down-drawable and, in particular, fusion-formable or slot-drawable (i.e., formed by a down draw process such as a fusion draw process or a slot draw process).

A float-formable glass-based article may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass-based article that can be lifted from the tin onto rollers. Once off the bath, the glass glass-based article can be cooled further and annealed to reduce internal stress. Where the glass-based article is a glass ceramic, the glass-based article formed from the float process may be subjected to a ceramming process by which one or more crystalline phases are generated.

Down-draw processes produce glass-based articles having a uniform thickness that possess relatively pristine surfaces. Because the average flexural strength of the glass-based article is controlled by the amount and size of surface flaws, a pristine surface that has had minimal contact has a higher initial strength. When this high strength glass-based article is then further strengthened (e.g., chemically), the resultant strength can be higher than that of a glass-based article with a surface that has been lapped and polished. Down-drawn glass-based articles may be drawn to a thickness of less than about 2 mm. In addition, down drawn glass-based articles have a very flat, smooth surface that can be used in its final application without costly grinding and polishing. Where the glass-based article is a glass ceramic, the glass-based article formed from the down draw process may be subjected to a ceramming process by which one or more crystalline phases are generated.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass-based article. The fusion draw method offers the advantage that, because the two glass films flowing over the channel fuse together, neither of the outside surfaces of the resulting glass-based article comes in contact with any part of the apparatus. Thus, the surface properties of the fusion drawn glass-based article are not affected by such contact. Where the glass-based article is a glass ceramic, the glass-based article formed from the fusion process may be subjected to a ceramming process by which one or more crystalline phases are generated.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass-based article and into an annealing region. Where the glass-based article is a glass ceramic, the glass-based article formed from the slot draw process may be subjected to a ceramming process by which one or more crystalline phases are generated.

In some embodiments, the glass-based article may be formed using a thin rolling process, as described in U.S. Pat. No. 8,713,972, entitled "Precision Glass Roll Forming Process and Apparatus", U.S. Pat. No. 9,003,835, entitled "Precision Roll Forming of Textured Sheet Glass", U.S. Patent Publication No. 20150027169, entitled "Methods And Apparatus For Forming A Glass Ribbon", and U.S. Patent Publication No. 20050099618, entitled "Apparatus and Method for Forming Thin Glass Articles", the contents of which are incorporated herein by reference in their entirety. More specifically the glass-based article may be formed by supplying a vertical stream of molten glass, forming the supplied stream of molten glass or glass-ceramic with a pair of forming rolls maintained at a surface temperature of about 500° C. or higher or about 600° C. or higher to form a formed glass ribbon having a formed thickness, sizing the formed ribbon of glass with a pair of sizing rolls maintained at a surface temperature of about 400° C. or lower to produce a sized glass ribbon having a desired thickness less than the formed thickness and a desired thickness uniformity. The apparatus used to form the glass ribbon may include a glass feed device for supplying a supplied stream of molten glass; a pair of forming rolls maintained at a surface temperature of about 500° C. or higher, the forming rolls being spaced closely adjacent each other defining a glass forming gap between the forming rolls with the glass forming gap located vertically below the glass feed device for receiving the supplied stream of molten glass and thinning the supplied stream of molten glass between the forming rolls to form a formed glass ribbon having a formed thickness; and a pair of sizing rolls maintained at a surface temperature of about 400° C. or lower, the sizing rolls being spaced closely adjacent each other defining a glass sizing gap between the sizing rolls with the glass sizing gap located vertically below the forming rolls for receiving the formed glass ribbon and thinning the formed glass ribbon to produce a sized glass ribbon having a desired thickness and a desired thickness uniformity.

In some instances, the thin rolling process may be utilized where the viscosity of the glass does not permit use of fusion or slot draw methods. For example, thin rolling can be utilized to form the glass-based articles when the glass exhibits a liquidus viscosity less than 100 kP.

The glass-based article may be acid polished or otherwise treated to remove or reduce the effect of surface flaws.

Figure 39:
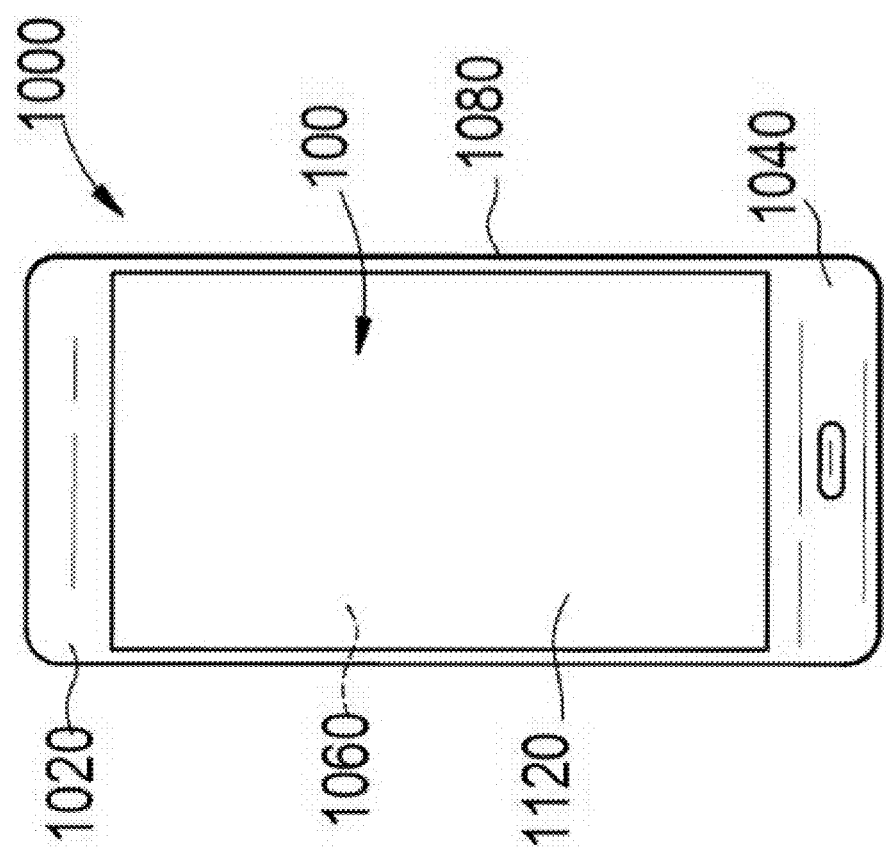
FIG. 39 is a front plan view of an electronic device incorporating one or more embodiments of the glass-based articles described herein.

Another aspect of this disclosure pertains to devices that include the glass-based articles described herein. For example, the devices may include any device including a display or requiring, strengthened thin glass. In one or more embodiments the devices are electronic devices, which can include mobile devices such as mobile phones, laptops, tablets, mp3 players, navigation devices and the like, or stationary devices such as computers, electronic displays, in vehicle information/entertainment systems, billboards, point of sale systems, navigation systems, and the like). In some embodiments, the glass-based articles described herein may be incorporated into architectural articles (walls, fixtures, panels, windows, etc.), transportation articles (e.g., glazing or interior surfaces in automotive applications, trains, aircraft, sea craft, etc.), appliances (e.g., washers, dryers, dishwashers, refrigerators and the like), or any article that requires some fracture resistance. As shown in FIG. 39, an electronic device 1000 may include a glass-based article 100 according to one or more embodiments described herein. The device 1000 includes a housing 1020 having front 1040, back 1060, and side surfaces 1080; electrical components (not shown) that are at least partially inside or entirely within the housing and including at least a controller, a memory, and a display 1120 at or adjacent to the front surface of the housing. The glass-based article 100 is shown as a cover substrate disposed at or over the front surface of the housing such that it is over the display 1120. In some embodiments, the glass-based article may be used as a back cover or as part of the housing 1020.

Another aspect of this disclosure pertains to a method of forming a fracture-resistant glass-based article. The method includes providing a glass-based substrate having a first surface and a second surface defining a thickness of about 1 millimeter or less and generating a stress profile in the glass-based substrate, as described herein to provide the fracture-resistant glass-based article. In one or more embodiments, generating the stress profile comprises ion exchanging a plurality of alkali ions into the glass-based substrate to form a non-zero alkali metal oxide concentration that varies along a substantial portion of the thickness (as described herein) or along the entire thickness. In one example, generating the stress profile includes immersing the glass-based substrate in a molten salt bath including nitrates of Na+, K+, Rb+, Cs+ or a combination thereof, having a temperature of about 350° C. or greater (e.g., about 350° C. to about 500° C.). In one example, the molten bath may include $NaNO_3$, $KNO_3$ or a combination thereof, and may have a temperature of about 485° C. or less. In another example, the bath may include a mixture of $NaNO_3$ and $KNO_3$ and have a temperature of about 460° C. The glass-based substrate may be immersed in the bath for about 2 hours or more, up to about 48 hours (e.g., from about 2 hours to about 10 hours, from about 2 hours to about 8 hours, from about 2 hours to about 6 hours, from about 3 hours to about 10 hours, or from about 3.5 hours to about 10 hours).

In some embodiments, the method may include chemically strengthening or ion exchanging the glass-based substrate in a single bath or in more than one step using successive immersion steps in more than one bath. For example, two or more baths may be used successively. The composition of the one or more baths may include a single metal (e.g., Ag+, Na+, K+, Rb+, or Cs+) or a combination of metals in the same bath. When more than one bath is utilized, the baths may have the same or different composition and/or temperature as one another. The immersion times in each such bath may be the same or may vary to provide the desired stress profile.

In one or more embodiments of the method, a second bath or subsequent baths may be utilized to generate a greater surface CS. In some instances, the method includes immersing the glass-based substrate in the second or subsequent baths to generate a greater surface CS, without significantly influencing the chemical depth of layer and/or the DOC. In such embodiments, the second or subsequent bath may include a single metal (e.g., $KNO_3$ or $NaNO_3$) or a mixture of metals ($KNO_3$ and $NaNO_3$). The temperature of the second or subsequent bath may be tailored to generate the greater surface CS. In some embodiments, the immersion time of the glass-based substrate in the second or subsequent bath may also be tailored to generate a greater surface CS without influencing the chemical depth of layer and/or the DOC. For example, the immersion time in the second or subsequent baths may be less than 10 hours (e.g., about 8 hours or less, about 5 hours or less, about 4 hours or less, about 2 hours or less, about 1 hour or less, about 30 minutes or less, about 15 minutes or less, or about 10 minutes or less).

In one or more alternative embodiments, the method may include one or more heat treatment steps which may be used in combination with the ion-exchanging processes described herein. The heat treatment includes heat treating the glass-based article to obtain a desired stress profile. In some embodiments, heat treating includes annealing, tempering or heating the glass-based substrate to a temperature in the range from about 300° C. to about 600° C. The heat treatment may last for 1 minute up to about 18 hours. In some embodiments, the heat treatment may be used after one or more ion-exchanging processes, or between ion-exchanging processes.

Another aspect of the disclosure pertains to a method of forming a chemically strengthened glass-based article, the method comprising providing a glass-based substrate comprising a first surface and a second surface opposing the first surface defining a thickness (t), a length dimension, a width, and a weight; ion exchanging a plurality of alkali ions into the glass-based substrate to form a non-zero alkali metal oxide concentration that varies along at least a substantial portion of the thickness (t), wherein ion exchanging comprises immersing a glass-based substrate in a molten salt bath comprising at least about 90% by weight of a potassium salt (e.g., $KNO_3$), and less than about 10% by weight of a sodium salt (e.g., $NaNO_3$) for less than about 12 hours. Details of this method may be combined with any of the embodiments described above.

Glass compositions that can be ion-exchanged to achieve deep depths of compression (>10% of thickness), with or without a surface spike of compression, exhibit improved mechanical performance in drop testing, abraded ring-on-ring and four point bend testing. The stress profiles achieved in this manner are a result of ion exchange deep into the glass. In some cases, the exchanging ions diffuse sufficiently such that the center point or near center point of the part undergoes ion exchange resulting in a very deep depth of compression.

The process of exchanging a large, heavy atom into the glass for a smaller ion can also result in increases in part weight and dimensions. In glass or glass-ceramic parts that have, for example, beveled edges or other asymmetric features, can present various problems. In such glass-based articles, the weight and dimensional changes can induce undesired warping of the part in two to three dimensions. Such warpage may be problematic for the system assembly and so a process is needed to reduce ion-exchange induced warp. Ion-exchanged induced dimensional change and/or warp is proportional to how many ions are exchanged into the part. With deep ion exchange profiles, there can be significant weight gain during ion exchange, greater than 0.3%. The presence of a surface spike in compressive stress (which can be obtained by using a two-step or mixed bath ion exchange) has a measurable but less significant impact on weight gain/dimensional change and warp.

Additionally, where a glass-based article is able to achieve very high CT values, the glass-based substrate is ion exchanged for significantly longer times than the time necessary to achieve maximum CT, until the CT decreases enough to achieve a preferred ("non-frangible") final fracture pattern of the glass having a small number of fragments. Consequently the glass-based substrate spends prolonged time in the ion exchange bath in order to achieve this lower CT value and accumulates a significant weight gain from Na to Li substitution, for example, 2% by weight. The weight gain can result in excessive deformation/warp of the ion exchanged part.

It has been discovered that one or more embodiments of the methods described herein mitigate dimensional changes and/or warping in "2.5D" (e.g., beveled) and 3D parts. The ion exchange conditions are defined such that stress profiles with maximized or near-maximum DOC as outlined above are achieved while minimizing ion exchange time, and therefore the number of ions exchanged into the glass. These methods significantly reduce the challenges for, or even obviate the need for any secondary, post-ion exchange processing to manage dimensional change and/or warp. In order to simultaneously optimize mechanical performance and warp control, ion exchange bath compositions, times and temperatures have to be carefully selected.

One or more embodiments generally pertain to glass-based article substrates with a thickness dimension of less than about 3 mm, less than about 2.5 mm, less than about 2 mm, less than about 1.5 mm, less than about 1.4 mm, less than about 1.3 mm, less than about 1.2 mm, less than about 1.1 mm, less than about 1 mm, less than about 0.9 mm, less than about 0.8 mm, less than about 0.7 mm, less than about 0.6 mm, or less than about 0.5 mm. In some embodiments, the thickness of the glass-based article is from about 0.3 mm to about 1.3 mm. In some embodiments, the thickness is about 1 mm or about 0.8 mm. In some embodiments, the glass-based article may have a non-uniform thickness, such that localized regions of the glass-based article may have a thickness that is less than or greater than the thickness of the majority of the glass-based article. In one or more embodiments, the method provides a glass-based article that is non-frangible, such that the glass-based article breaks into relatively few fragments.

Glasses with relatively fast ionic diffusivity (>300 um$^2$/hr) can be ion-exchanged using the methods described herein. In one or more embodiments, the glass-based articles include lithium-containing glasses. In some embodiments, the methods apply to glass-based articles having $Li_2O/R_2O > 0.65$.

The temperature of the molten salt bath may range from 380° C. up to about 450° C. In further embodiments, the temperature ranges from about 400° C. up to about 460° C., or 420° C. up to about 440° C., about 430° C., or any sub-ranges contained therein.

The molten salt bath may be varied. In one or more embodiments, the molten salt bath further comprises a lithium salt, (e.g., $LiNO_3$) in a non-zero amount of less than about 2%, 1.5%, or 1% by weight. In some embodiments, the potassium salt (e.g., $KNO_3$) is present in an amount of at least 90%, 91%, 92%, 93%, 94%, 95%, or 96% by weight, with the remainder being sodium salt and optionally lithium salt. In one or more embodiments, the potassium salt (e.g., $KNO_3$) is present in an amount of about 90%, 91%, 92%, 93%, 94%, 95%, 96%, or 97% by weight. In further embodiments, a molten bath consisting essentially of potassium salt (e.g., $KNO_3$) is used. An exemplary range of potassium salt (e.g., $KNO_3$) is at least about 90% by weight, such as from about 90% to about 97% by weight. The amount of sodium salt (e.g., $NaNO_3$) may also be varied. In one or more embodiments, the sodium salt (e.g., $NaNO_3$) is present in an amount of less than about 70%, 9%, 8%, 7%, 6%, or 5% by weight. In some embodiments, the sodium salt (e.g., $NaNO_3$) is present in an amount of 8%, 7%, 6%, 5%, 4%, or 3% by weight. An exemplary range of sodium salt (e.g. $NaNO_3$) is less than about 10% by weight, such as from about 10% to about 3% by weight. In some embodiments, the weight ratio of a potassium salt to a sodium salt in the molten salt bath is greater than the lesser of (a) 2.5:1 and (b) a molar ratio of $(Li_2O+K_2O):Na_2O$ in the glass-based substrate. Stated differently, the composition of the molten salt bath may be determined in part based on the composition of the glass-substrate. Where the amount of the potassium salt in the bath is lower than described herein, excessive sodium diffusion into the glass-based article may occur, producing undesired warp and weight gain.

Likewise, the bath time may be varied. In one or more embodiments, the glass-based article is ion exchanged for less than about 12 hours, 11 hours, 10 hours, 9 hours, 8 hours, 7 hours, 6 hours, 5 hours, or 4 hours, and more than 1 hour. In some embodiments, the glass-based article is ion exchanged for about 7 hours. In some embodiments, the bath time may be defined relative to the bath time that produces the maximum central tension in the glass-based article for the same glass substrate and bath conditions (composition and temperature). In such circumstances, the bath time may be from about 50% to about 130% of the bath time that produces the maximum central tension, such as about 55% to about 130% of the maximum central tension bath time, about 60% to about 130% of the maximum central tension bath time, about 65% to about 130% of the maximum central tension bath time, about 70% to about 130% of the maximum central tension bath time, about 75% to about 125% of the maximum central tension bath time, about 80% to about 120% of the maximum central tension bath time, about 85% to about 115% of the maximum central tension bath time, about 90% to about 110% of the maximum central tension bath time, about 95% to about 105% of the maximum central tension bath time, about 100% of the maximum central tension bath time, or any sub-ranges contained therein or defined by these endpoints. Where the bath time is less than 50% of the maximum central tension bath time, the glass-based article exhibits a central tension and the corresponding total compressive stress that is too low to provide the desired damage resistance and drop performance. Where the bath time is greater than 130% of the maximum central tension bath time, the glass-based article exhibits a central tension and the corresponding total compressive stress that is too low to provide the desired damage resistance and drop performance due to the drop in central tension associated with extended ion-exchange time and a degree of warp and weight gain that is above the desired range due to the additional metal ion diffusion into the glass-based article. Additionally, a bath time of greater than 130% of the maximum central tension bath time does not provide increases in depth of compression that offset the undesired warp and weight gain.

In some embodiments, the method further comprises a second ion exchange, which may be performed either before or after the ion exchanges described above. The second ion exchange can include any of the embodiments described herein. An exemplary method includes a first ion exchange for, e.g., 7 hours, 6 hours, 5 hours, or 4 hours, in 80 wt. % potassium salt/20 wt. % sodium salt (e.g., 80 wt. % $KNO_3$/20 wt. % $NaNO_3$) at 430° C., followed by a second step in a mixed potassium salt/sodium salt (e.g., $KNO_3/NaNO_3$) or pure sodium salt (e.g., $KNO_3$) bath. Another exemplary method includes a first ion exchange in pure $KNO_3$ and follow with, for example, 95 wt. % potassium salt/5 wt. % sodium salt (e.g., 95 wt. % $KNO_3$/5 wt. % $NaNO_3$) for e.g., 7 hours, 6 hours, 5 hours, or 4 hours.

As discussed above, the above methods provide glass-based articles that exhibit relatively little weight gain, changes in length or width dimension or warping as compared to the pre-ion exchanged article substrate, while maintaining a desirable stress profile. In one or more embodiments, there is a less than 1.6%, 1.5%, 1.4%, 1.3%, 1.2%, 1.1%, 1%, or 0.9% gain in weight after ion exchanging compared to before ion exchanging. In further embodiments, there is at least a 0.3% gain in weight. In some embodiments, there is a less 0.24%, 0.23%, 0.20%, 0.19%, 0.18%, 0.17%, 0.16%, 0.15%, 0.14%, 0.13%, 0.12%, 0.11%, or 0.10% change in the length dimension after ion exchanging compared to before ion exchanging. In further embodiments, there is at least a 0.1% change in the length dimension, such as at least a 0.2% change in the length dimension. In some embodiments, the change in length dimension is from about 0.1% to about 0.2%, such as from about 0.15% to about 0.0.2%. In one or more embodiments, there is a less than 0.24%, 0.23%, 0.20%, 0.19%, 0.18%, 0.17%, 0.16%, 0.15%, 0.14%, 0.13%, 0.12%, 0.11%, or 0.10% change in the width after ion exchanging compared to before ion exchanging. In further embodiments, there is at least a 0.1% change in the width dimension, such as a 0.2% change in the width dimension. In one or more embodiments, the glass-based article warps less than 200 µm after ion exchanging compared to the glass-based substrate before ion exchange, such as less than 180 µm, 160 µm, 150 µm, 130 µm, or 120 µm after ion exchanging compared to the glass-based substrate before ion exchange. In some embodiments, the glass-based article may exhibit a warp of less than about 200 µm as measured from a flat plane defined by a fit to the major axis of the glass-based article, such as less than about 180 µm, about 160 µm, about 150 µm, about 130 µm, or about 120 µm.

One advantage of these methods is that distortion of the glass-based article is minimized while maintaining the desirable properties (CT, CS, DOC and DOL values that yield excellent mechanical performance attributes) of the glass-based article. While ion-exchange induced warp of a glass part could be reduced through the judicious use of post-ion exchange polishing or etching, this scheme can be limited by how much material could be removed without compromising important features of the stress profile. Even in cases where post-ion exchange polishing or etching does work, these methods are extra steps that complicate the manufacturing process. These additional steps cost time and money and also introduce an additional handling step that could negatively impact final part yields. The methods described herein address the issue of ion-exchange induced glass deformation at the root, by prescribing ion exchange recipes (time, temperature, bath compositions) that minimize warp in the ion exchange process itself. The invented ion exchange processes also allow for short times in the ion exchange bath, thereby realizing operational efficiencies in terms of ion exchange time and bath life with respect to lithium poisoning. The methods described herein are particularly advantageous for glass-based articles with beveled or otherwise shaped features, which tend to warp when significantly ion exchanged.

Another aspect of the disclosure pertains to glass-based articles prepared by the methods described herein. In one or more embodiments, the glass-based article is an ion-exchanged glass-based article comprising: a length dimension; a width dimension; a weight; a first surface and a second surface opposing the first surface defining a thickness (t); a concentration of an ion-exchanged metal oxide that is both non-zero and varies along a thickness range from about 0·t to at least about 0.3·t; and a central tension (CT) region comprising a maximum CT greater than or equal to $71.5/\sqrt{(t)}$, where the thickness t is given in mm. In one or more embodiments, when the thickness (t) of the glass-based article is 0.8 mm, there is less than 1.6% gain in weight of the glass-based article resulting from the ion-exchanged metal oxide compared to the weight of the glass-based article prior to ion exchange. In some embodiments, when the thickness (t) of the glass-based article is 0.8 mm, there is less than 0.24% change in the length dimension of the ion-exchanged glass-based article compared to the length dimension of the glass-based article prior to ion exchange. In one or more embodiments, when the thickness (t) of the glass-based article is 0.8 mm, there is less than 0.24% change in the width dimension of the glass-based article compared to the width dimension of the glass-based article prior to ion exchange. The measurement of the properties may be carried out at room temperature (e.g., between about 25° C. and about 35° C.).

Variants as described above are applicable to the ion-exchanged glass-based article. For example, in some embodiments, there is less than 1.4% gain in weight of the glass-based article resulting from the ion-exchanged metal oxide compared to the weight of the glass-based article prior to ion exchanging. In one or more embodiments, there is less than 0.15% change in the length dimension of the ion-exchanged glass-based article compared to the length dimension of the glass-based article prior to ion exchange. In some embodiments, there is a less than 0.15% change in the width dimension of the glass-based article compared to the width dimension of the glass-based article prior to ion exchange.

In one or more embodiments, the article further comprises a surface compressive stress (CS) of about 300 MPa or greater. In some embodiments, the surface CS is about 400 MPa, 450 MPa, or 500 MPa or greater. In one or more embodiments the surface CS ranges from about 400 MPa to about 750 MPa, from 450 MPa to about 750 MPa, from 500 MPa to about 750 MPa, or any sub-ranges contained therein.

In some embodiments, the CT may range from about 50 MPa to about 100 MPa, from about 60 MPa to about 90 MPa, from about 70 MPa to about 80 MPa, or any sub-ranges contained therein. In further embodiments, the CT may range from about 50 MPa to about 100 MPa, from about 60 MPa to about 90 MPa, from about 70 MPa to about 80 MPa, or any sub-ranges contained therein, for a glass-based article having a thickness of about 0.8 mm.

In one or more embodiments, the glass-based article may have a DOC of at least 15%. In further embodiments, the DOC may be at least 15% for a glass-based article having a thickness of about 0.8 mm.

Figure 33:
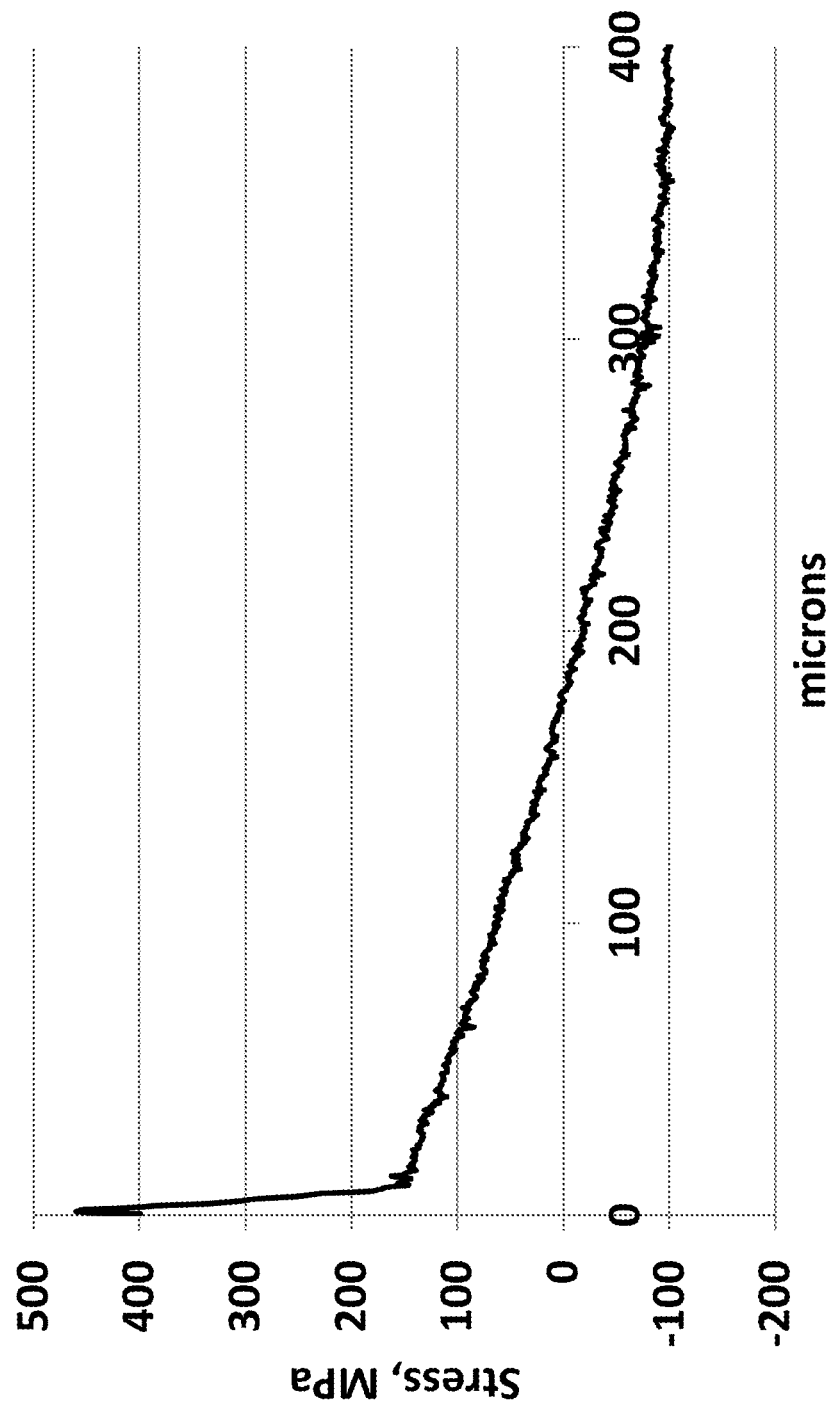
FIG. 33 is a graph showing the measured stress of Example 10D as a function of depth extending from the surface of the glass-based article of Example 10D into the glass-based article.

In some embodiments, the glass-based article may have a compressive stress spike depth of layer ($DOL_{spike}$) of about 5 µm to about 15 µm. In further embodiments, the glass-based article may have a $DOL_{spike}$ of about 5 µm to about 15 µm for a glass-based article having a thickness of about 0.8 mm. In some embodiments, the glass-based article may have a $DOL_{spike}$ of about 0.625% to about 1.875% of the thickness. In some embodiments, the glass-based article may have a $DOL_{spike}/t$ in the range of about 0.006 to about 0.014, such as about 0.008 to about 0.012, about 0.009 to about 0.011, about 0.01, or any sub-ranges contained therein or formed from these endpoints. As used herein, the $DOL_{spike}$ refers to the depth of the compressive stress spike formed in the glass-based article. The $DOL_{spike}$ may be defined based on the depth of potassium ion exchange within the glass-based article ("Potassium DOL") as measured by FSM, and may also be approximately the depth of the knee stress. Where $DOL_{spike}/t$ is less than 0.006, the glass-based article exhibits undesirably low damage resistance and drop performance. Where $DOL_{spike}/t$ is greater than 0.014, the glass-based article undergoes excessive ion-exchange, which may produce undesired warp and weight gain. In one or more embodiments, the glass-based article may have a knee stress ($CS_{knee}$) of greater than 100 MPa, 110 MPa, 120 MPa, or 130 MPa. The $CS_{knee}$ as used herein refers to the compressive stress at the "knee" of the stress profile, which is the location at which the slope of the stress profile changes drastically. As illustrated in FIG. 33, the $DOL_{spike}$ is about 12 μm, and the $CS_{knee}$ is about 151 MPa.

Another aspect of the disclosure pertains to a device comprising a housing having front, back, and side surfaces; electrical components that are at least partially inside the housing; a display at or adjacent to the front surface of the housing; and a cover substrate disposed over the display, wherein the cover substrate comprises any of the ion-exchanged glass-based articles described above.

EXAMPLES

Various embodiments will be further clarified by the following examples. In the Examples, prior to being strengthened, the Examples are referred to as "substrates". After being subjected to strengthening, the Examples are referred to as "articles" or "glass-based articles".

Example 1

Glass-ceramic substrates having a nominal composition as shown below in Table 2 was provided. The glass-ceramic substrates had a thickness of 0.8 millimeters (mm) and included a crystal phase assemblage comprising a β-spodumene solid solution as a predominant crystalline phase and one or more minor phases including rutile. The glass-ceramic substrates were immersed in a molten salt bath including $NaNO_3$ having a temperature of 485° C. for 10 hours (Condition A), 13 hours (Condition B) or 24 hours (Condition C), or a molten salt bath including $NaNO_3$ having a temperature of 430° C. for 2 hours (Comparative Condition D) to form strengthened glass-ceramic articles.

TABLE 2

| Composition of the glass-ceramic substrate of Example 1, prior to chemical strengthening. | |
|---|---|
| Example = ▶ Oxide [mole %] | 1 |
| $SiO_2$ | 69.2 |
| $Al_2O_3$ | 12.6 |
| $B_2O_3$ | 1.8 |
| $Li_2O$ | 7.7 |
| $Na_2O$ | 0.4 |
| MgO | 2.9 |
| ZnO | 1.7 |
| $TiO_2$ | 3.5 |
| $SnO_2$ | 0.1 |
| $\frac{[Li_2O + Na_2O + MgO + ZnO + K_2O]}{[Al_2O_3 + B_2O_3]}$ | $\frac{12.7}{14.4} = 0.88$ |
| $\frac{[TiO_2 + SnO_2]}{[SiO_2 + B_2O_3]}$ | $\frac{3.6}{71} = 0.051$ |

Figure 9:
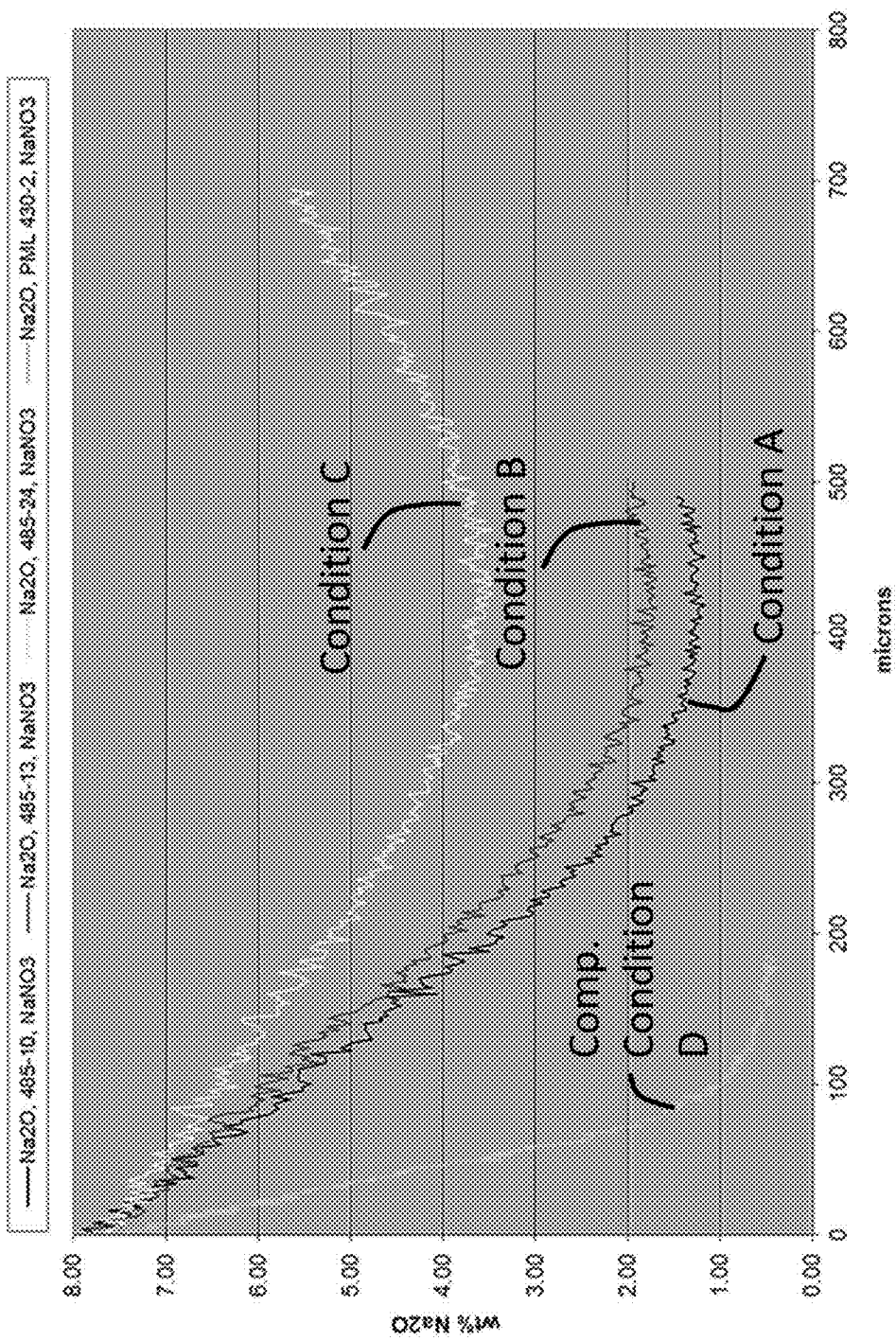
FIG. 9 is a graph showing the concentration of $Na_2O$ in known chemically strengthened glass-based articles and glass-based articles according to one or more embodiments of this disclosure.

The chemical profiles of the glass-ceramic articles were measured by microprobe and are shown in FIG. 9. Stress (σ) is proportional to concentration (z) at a location along the thickness of the sample through Equation (4):

$$\sigma(z) = BE/1 - \nu(C_{avg} - C(z)) \quad (4)$$

In Equation (4), B is the lattice dilation coefficient, E is the elastic modulus, ν is Poisson's ratio, and $C_{avg}$ is the integral of the concentration across the sample. As shown in FIG. 9, the Na+ ions are ion exchanged through almost the entire thickness of the articles when a higher temperature bath is utilized (i.e., Conditions A-C). In such glass-ceramics, $Na_2O$ is present in the CT region in an amount of about 1.2 mol % or greater. The glass-ceramic article ion exchanged in a lower temperature bath (Comparative Condition D) exhibited a stress profile that resembles known stress profiles.

Example 2

Figure 10:
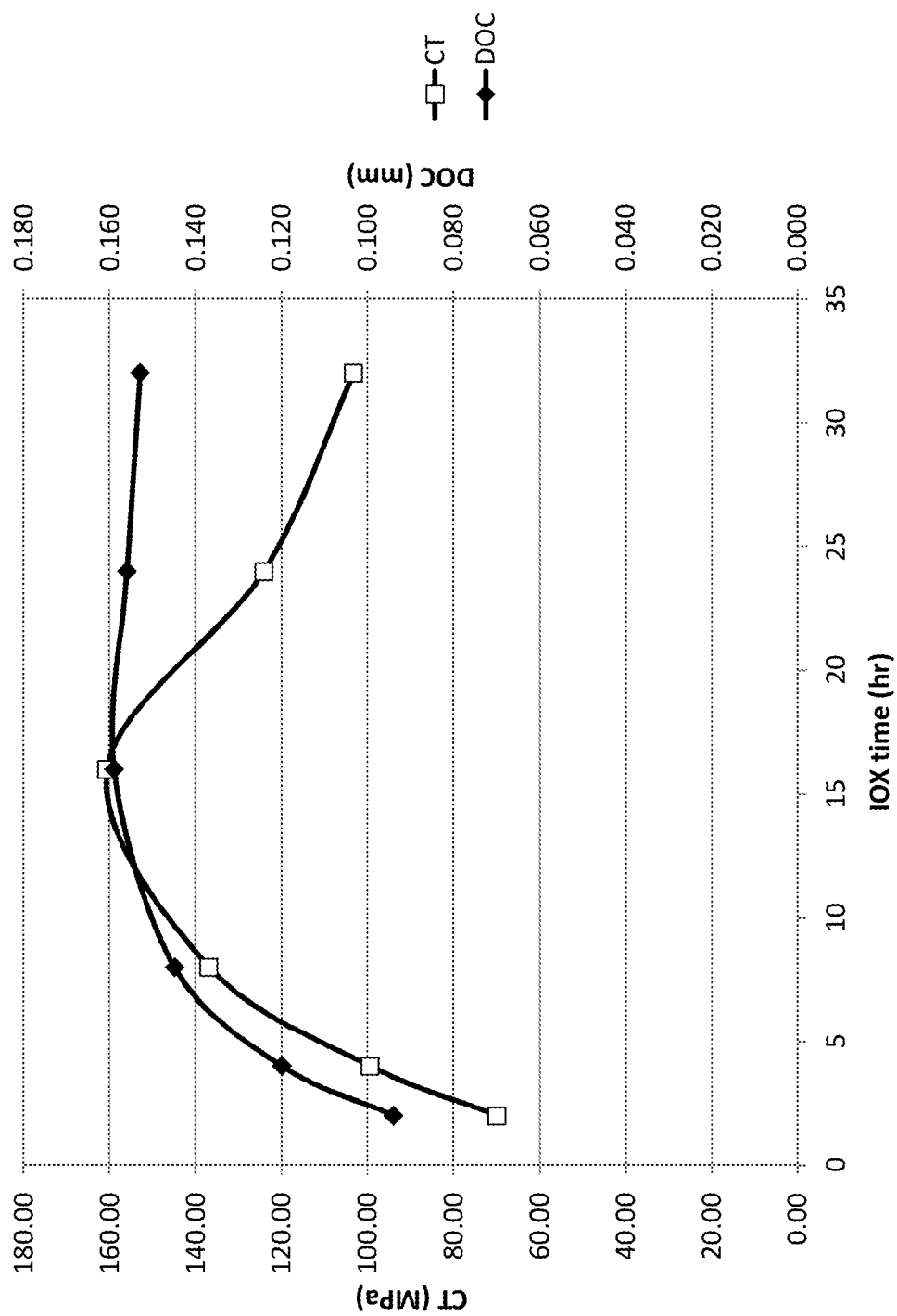
FIG. 10 is a graph showing CT values and DOC values as a function of ion exchange time, according to one or more embodiments of this disclosure.

Glass substrates having the same composition as shown in Table 2 and a thickness of 0.8 mm, but having an amorphous structure (and no crystal phases) were chemically strengthened by immersing in a molten salt bath including 100% $NaNO_3$ having a temperature of about 430° C. for various durations to provide glass-based articles. The DOC and the maximum CT value of the glass-based articles were measured using a scattered light polariscope (SCALP). As shown in FIG. 10, the DOC and the maximum CT increases are dependent on the length of immersion or ion exchange. The greatest CT values were observed after immersing the glasses for about 16 hours.

Figure 11:
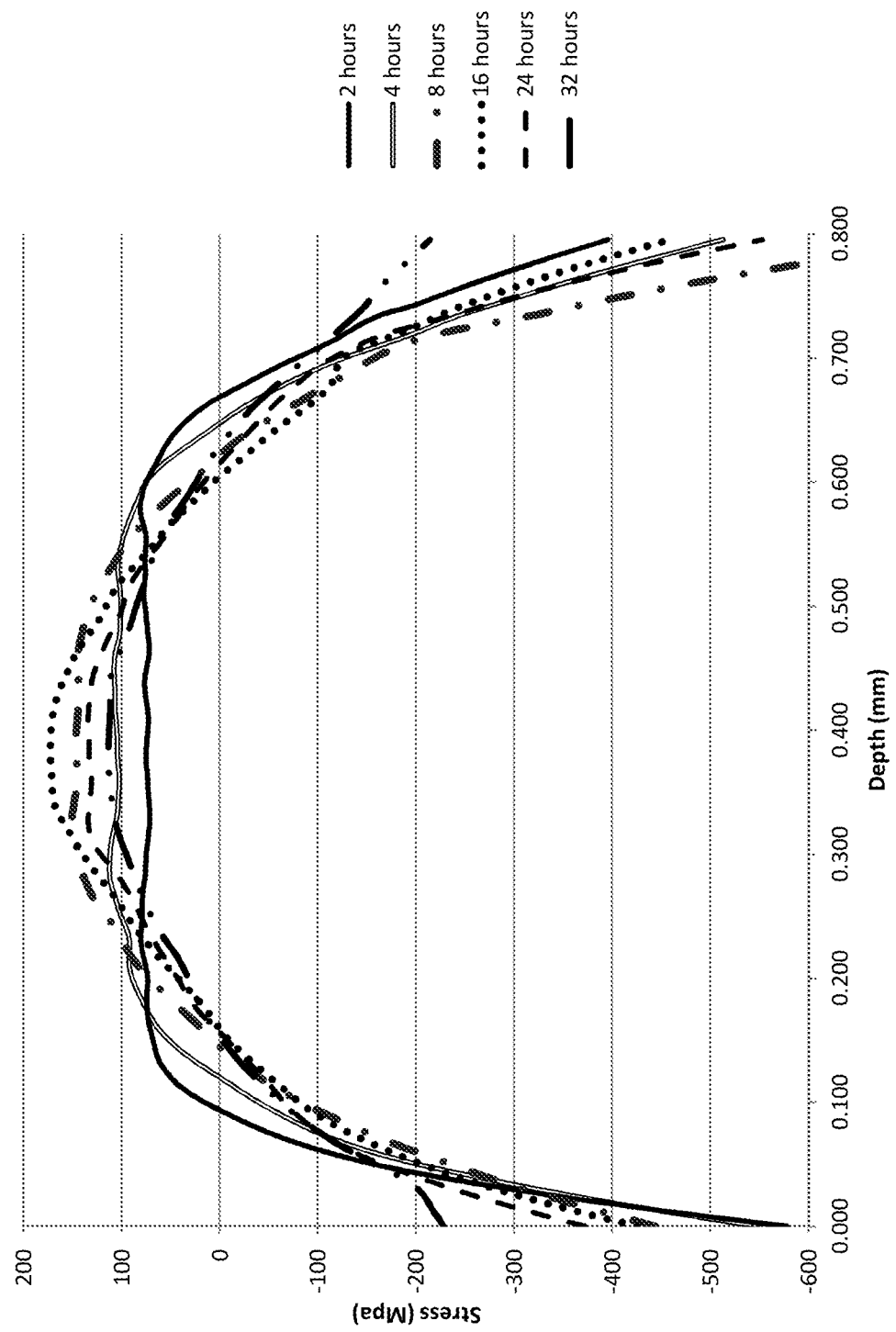
FIG. 11 is a graph comparing the stress profiles as a function of depth of known chemically strengthened glass-based articles and glass-based articles, according to one or more embodiments of this disclosure with the CT region having positive stress and the CS region having negative stress.

The stress profiles of the glass-based articles of Example 2 were measured using SCALP and are shown in FIG. 11. The upper portion of the x-axis indicating a positive stress value is the CT layer and the lower portion of the x-axis indicating a negative stress value are the CS values. The stress profile of the glass-based article that was chemically strengthened for 16 hours exhibited the greatest CT value (i.e., 175 MPa) and a shape that was parabolic-like, which included substantially no linear portions, in a depth direction, of 100 micrometers (μm). The surface CS measured by SCALP was about 410 MPa. Accordingly, the ratio of maximum CT to surface CS of Example 2 is about 0.4375.

Example 3

Figure 12:
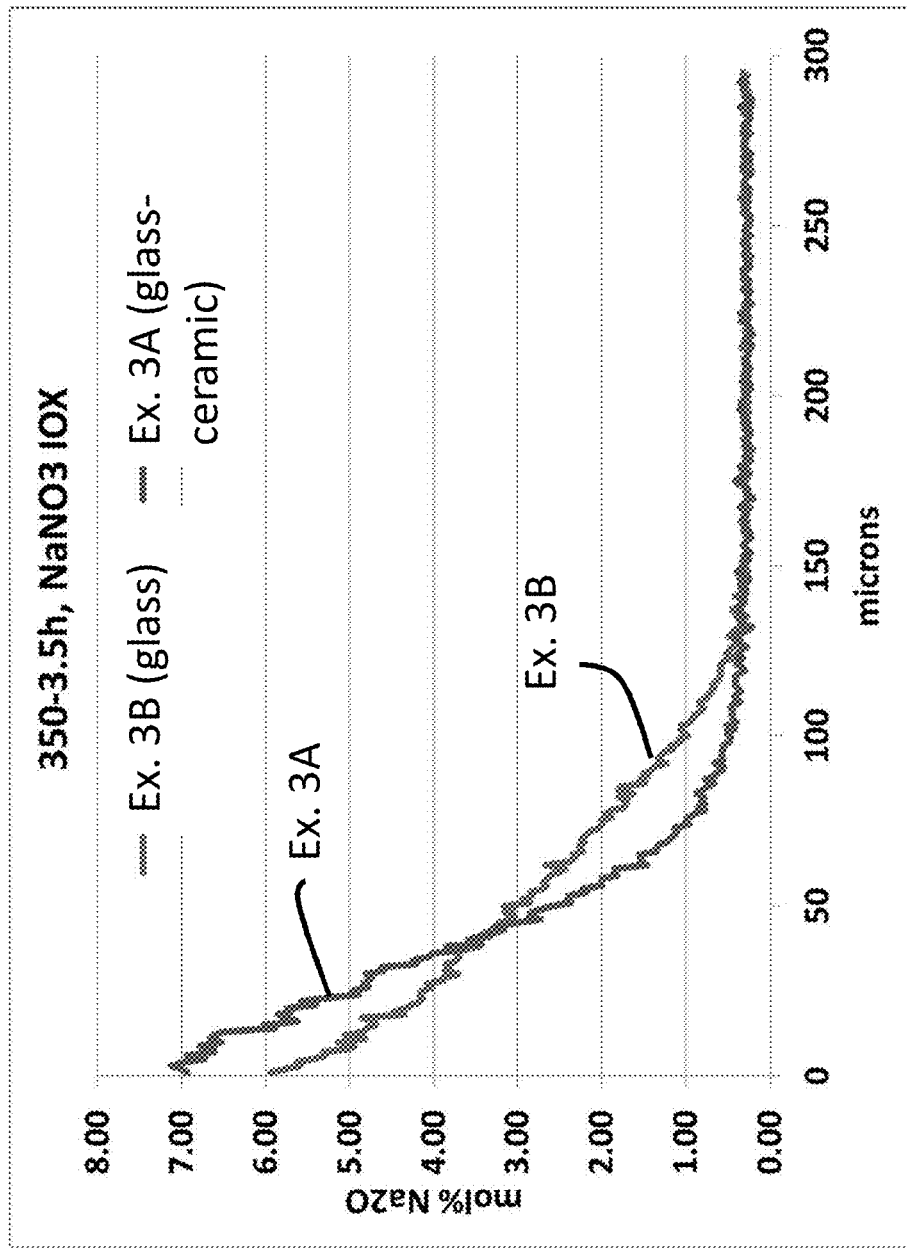
FIG. 12 shows a graph of the stress profiles of a known chemically strengthened glass and glass-ceramic.

For comparison, the glass-ceramic substrate of Example 1 and the glass substrate of Example 2, each having a thickness of about 0.8 mm, were subjected to chemical strengthening by immersing in a molten salt bath of $NaNO_3$ having a temperature of 350° C. for 3.5 hours (Example 3A and 3B, respectively). The resulting stress profiles (as approximated by the chemical profile measured by microprobe using Equation 4) of the glass-ceramic article and glass-based article shown in FIG. 12 resemble an error function (erfc) or quasi-linear shape. Moreover, the DOC is less than the depth of the alkali ion exchanged into the glass or glass-ceramic (or the chemical ion exchange depth).

Figure 13:
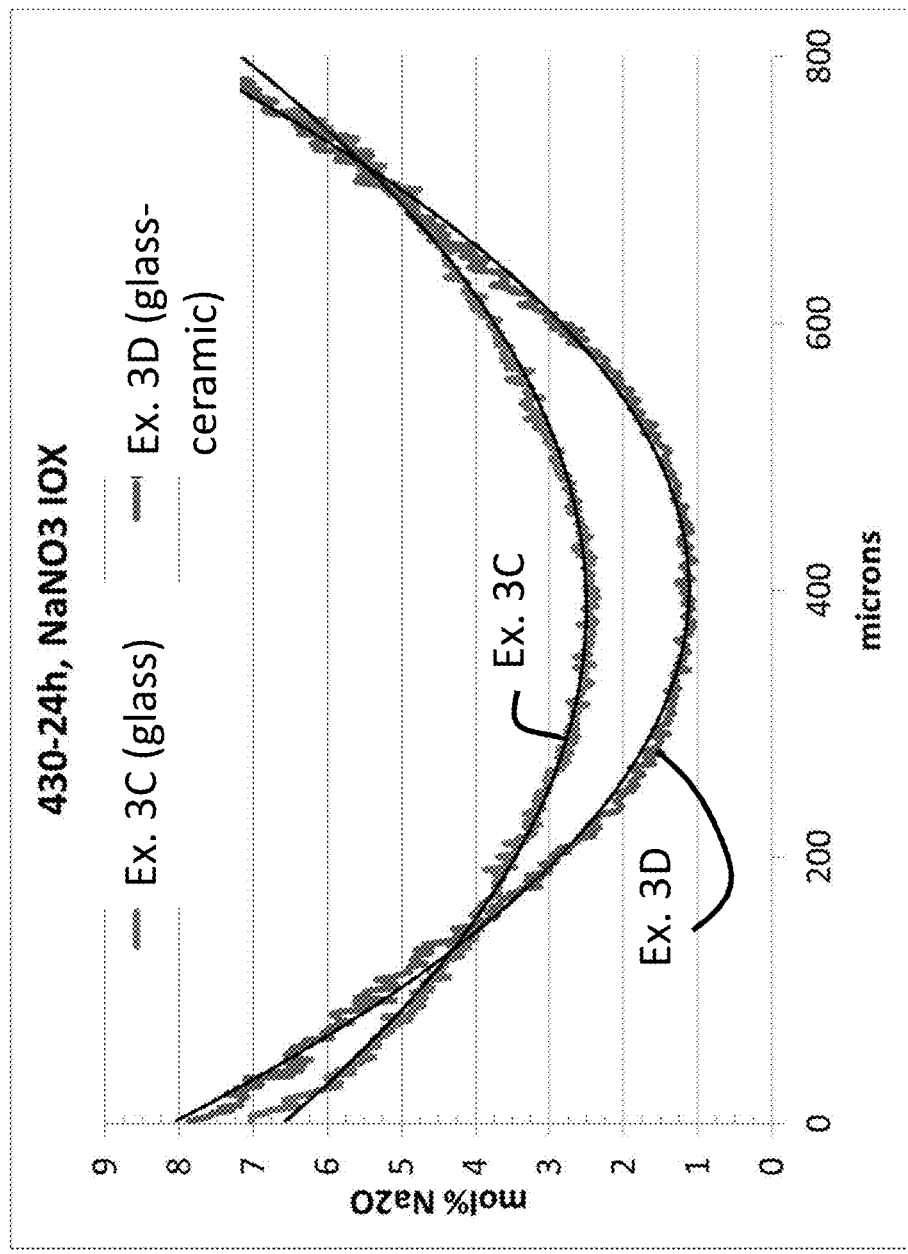
FIG. 13 shows a graph of the stress profiles of a glass and glass-ceramic according to one or more embodiments of this disclosure.
Figure 13A:
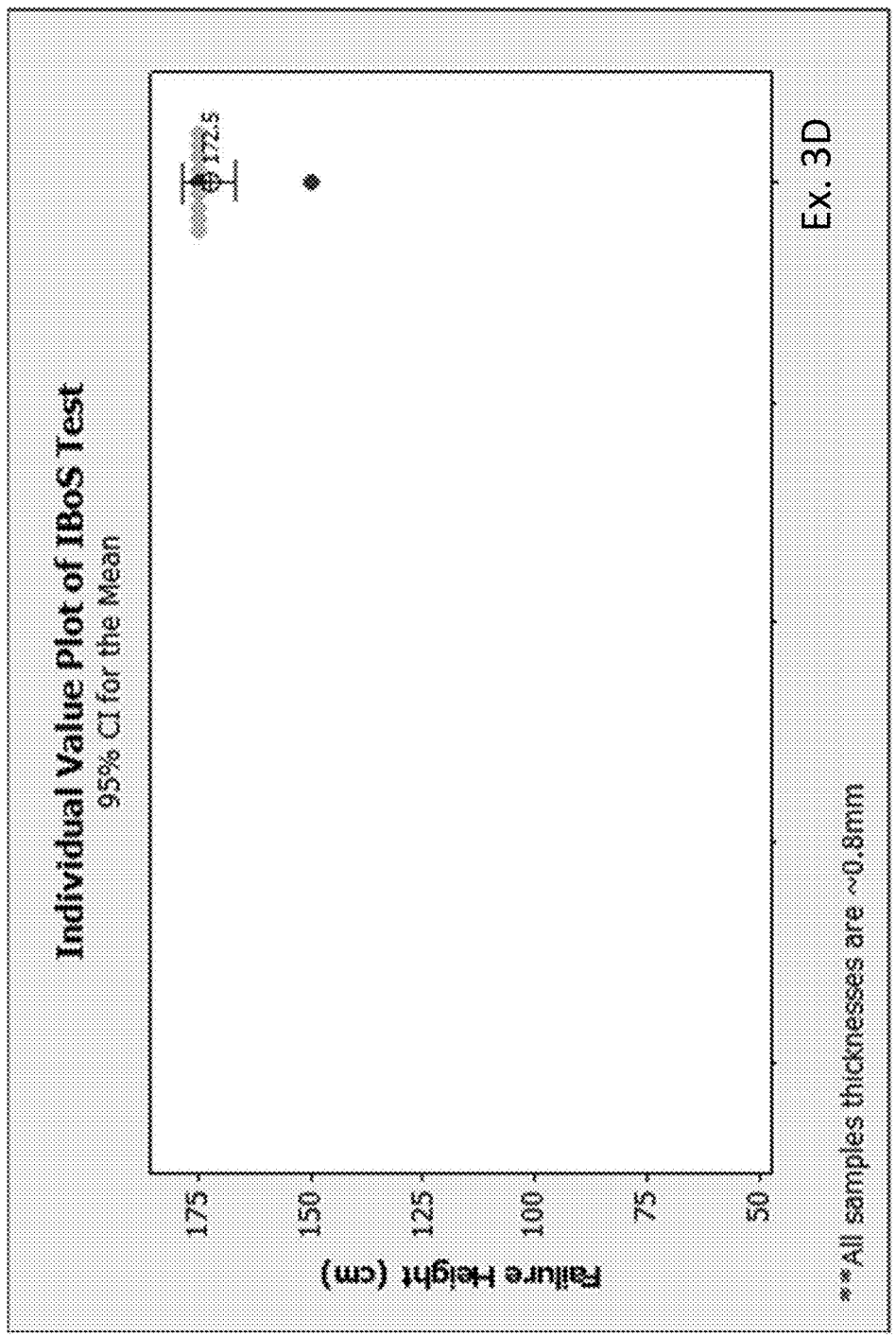
FIG. 13A shows a graph of the failure height in drop testing of Example 3D.

When the glass-ceramic substrate of Example 1 and the glass substrate of Example 2, each having a thickness of about 0.8 mm were subjected to the chemical strengthening described herein by immersing in a molten salt bath of $NaNO_3$ having a temperature of 430° C. for 24 hours (Examples 3C and 3D, respectively), the resulting glass-based articles exhibited metal oxide concentration profiles (obtained by EPMA) as shown in FIG. 13. The metal oxide concentration profiles are parabolic-like and show an ion exchange of Na+ ions throughout the entire thickness. The chemical profiles were measured using EMPA and the chemical depth of $Na_2O$ diffusion is shown as equal to or larger than 400 micrometers. Moreover, $Na_2O$ is present in a concentration of about 1 mol % or greater throughout the thickness, including in the CT layer. The resulting glass-ceramic articles of Example 3D exhibited superior fracture resistance in a drop test in which the glass-ceramic substrates were retrofitted into identical mobile phone housings. Specifically, five samples of Example 3D were assembled in a mobile phone device and dropped onto sandpaper for successive drops starting at a height of 50 cm. As each sample survived the drop from a height, it was dropped again from an increase height until it fractured, at which point the failure height of that sample was recorded in FIG. 13A. Example 3D exhibited an average failure height of 172.5 cm.

Figure 14:
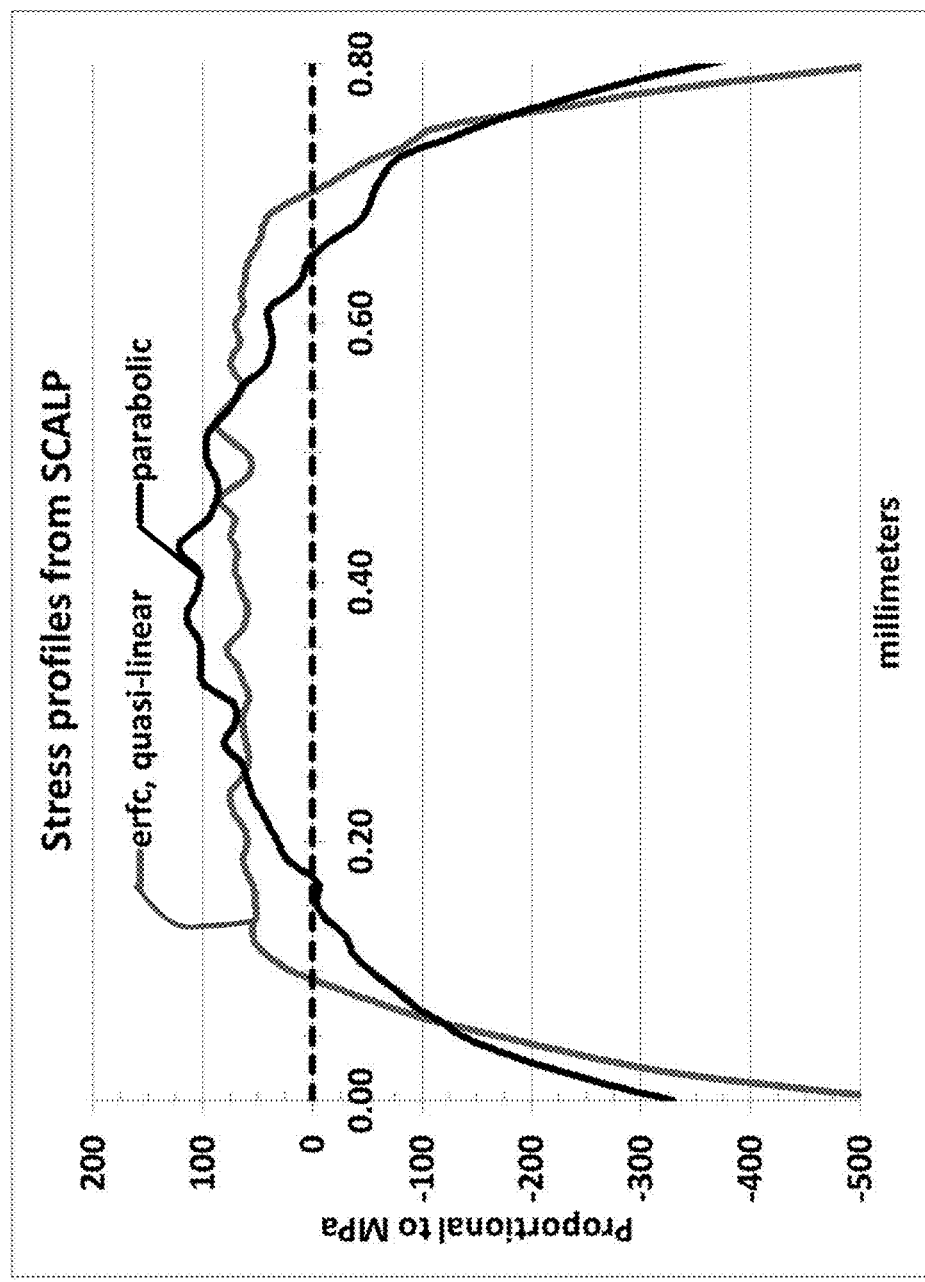
FIG. 14 is a graph comparing a known stress profile as a function of depth of a chemically strengthened glass-based article and a glass-based article according to one or more embodiments of this disclosure.

FIG. 14 shows stress profiles of a glass-based substrate chemically strengthened according to known processes and a glass-based substrate chemically strengthened according to the methods described herein. As shown in FIG. 14, the stress profile of the glass-based articles of the embodiments described herein have a parabolic shape that is substantially free of linear segments (having a length or absolute depth greater than about 50 micrometers) and exhibits a DOC of about 0.2·t, while the known stress profile with an erfc, quasi-linear shape exhibits a substantially linear portion from a depth of about 0.1 millimeters to about 0.7 millimeters (for a total length of about 0.6 millimeters or 600 micrometers). The known stress profile also exhibits a lower CT value and a lower DOC.

Example 4

Figure 15:
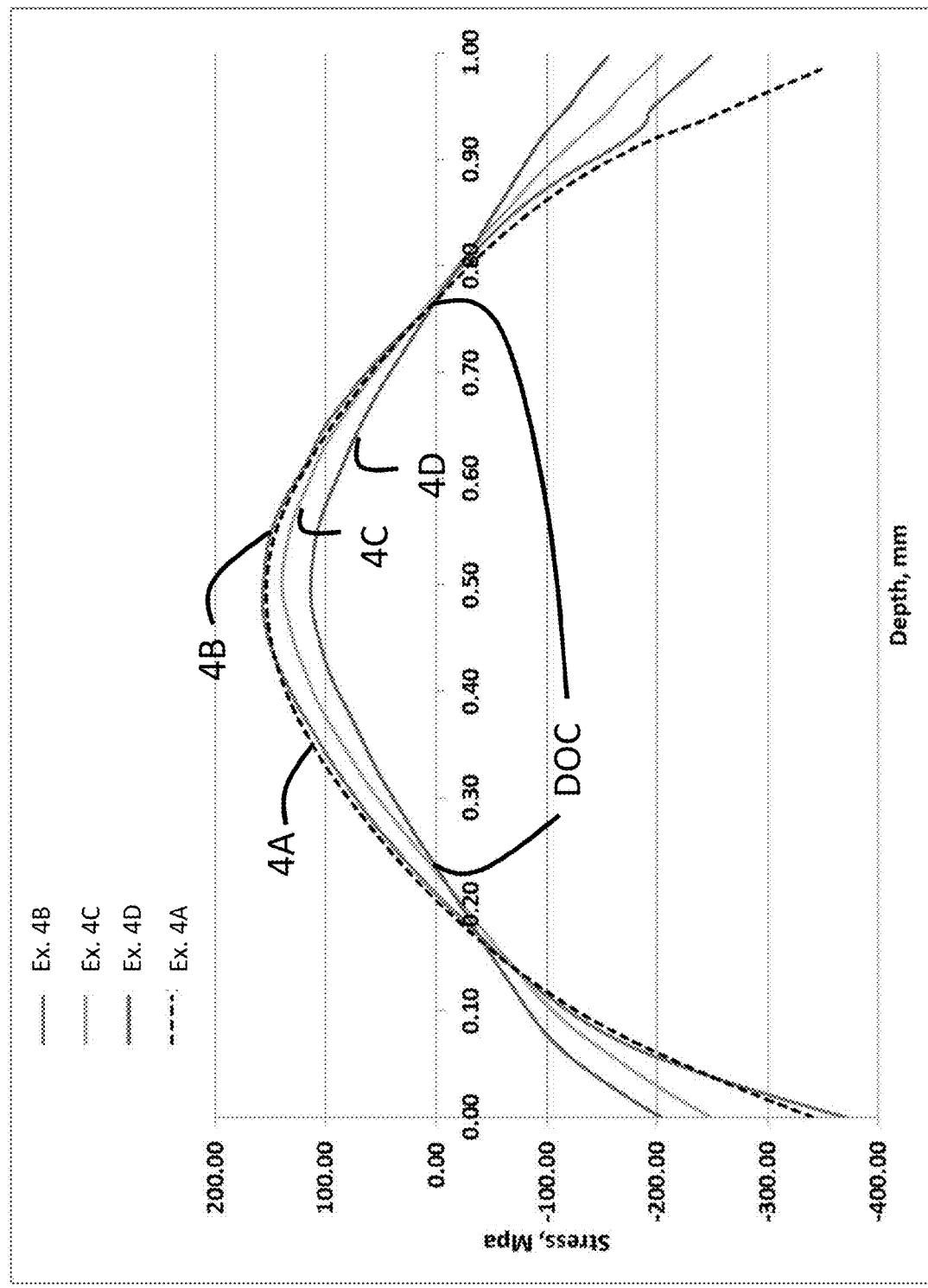
FIG. 15 is a graph showing the stress profiles of Examples 4A-4D as function of depth with the CT region having positive stress and the CS region having negative stress.

Glass substrates (each having a thickness of about 1 mm) having the composition of Table 2 were subjected to chemical strengthening by immersing in a first molten salt bath of $NaNO_3$ having a temperature of 430° C. for 24 hours. One glass-based article was not subjected to any additional strengthening steps (Example 4A). Three glass-based articles were subjected to a second strengthening step by immersion in a second molten salt bath of $KNO_3$ having a temperature of about 430° C. for either 0.75 hours, 4 hours, or 8 hours (Examples 4B, 4C and 4D, respectively). The stress profiles as measured by SCALP of the resulting glass-based articles are shown in FIG. 15, with depth or thickness of the glass-based articles plotted on the x-axis and stress plotted on the y-axis. The positive stress values are CT values and the negative stress values are the CS values. Spatial resolution of the instrument prohibits measurement of the CS associated with the second $KNO_3$ ion exchange step. The glass-based articles of Examples 4A and 4B exhibited similar profiles. The glass-based articles of Examples 4C and 4D exhibited decreasing CT (as compared to Examples 4A and 4B) and decreasing CS (as compared to Examples 4A and 4B), with time and after the immersion at second strengthening step. The glass-based articles of Examples 4C and 4D also exhibited increased DOC, as compared to Examples 4A and 4B, and such DOC values were greater than 0.2·t.

Figure 16:
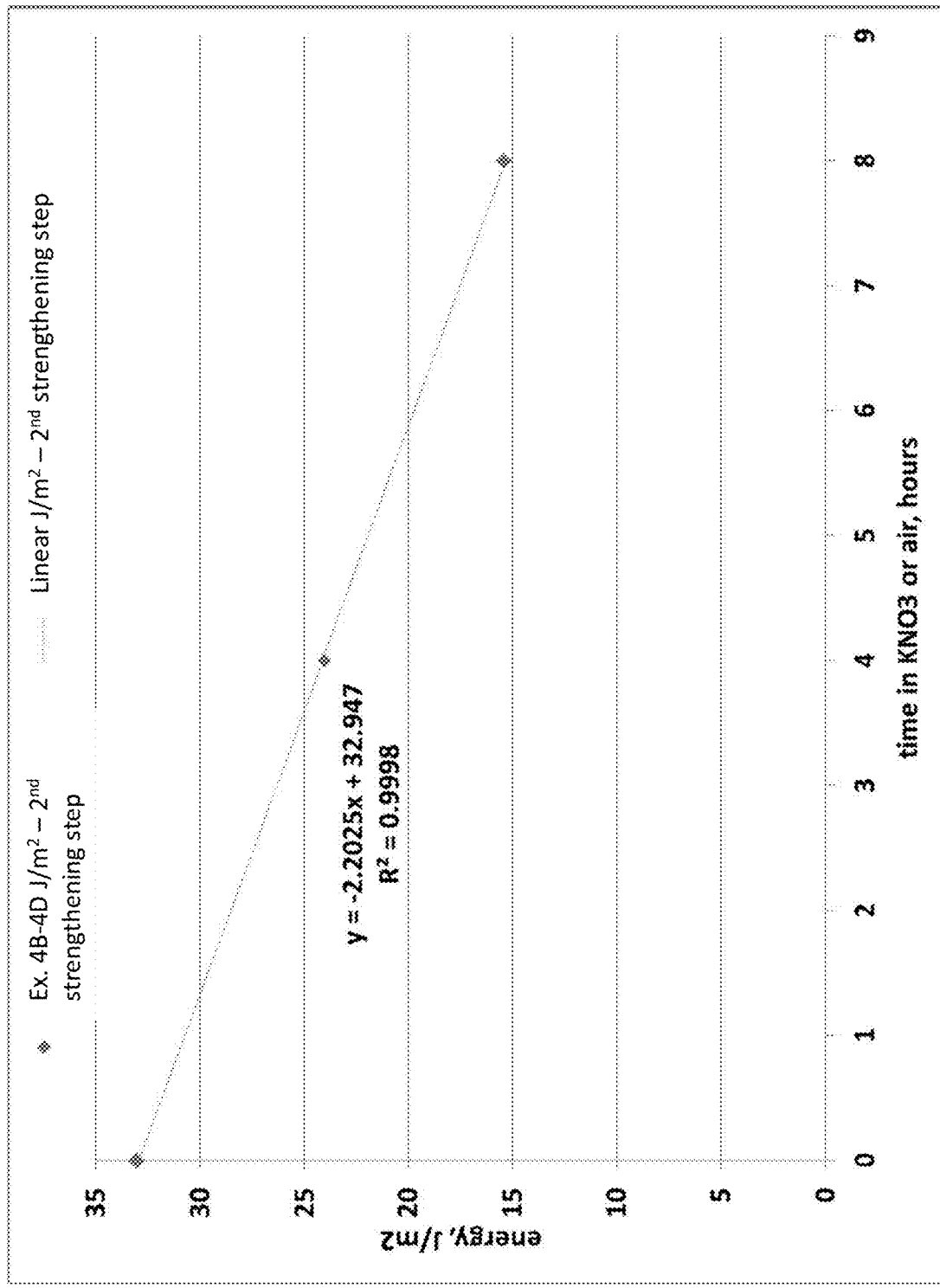
FIG. 16 is a graph showing discrete stored tensile energy data points for Examples 4B-4D.

FIG. 16 shows the stored tensile energy in $J/m^2$ for each of Examples 4B-4D, which are greater than 15 $J/m^2$ depending on time immersed in the second molten salt bath of $KNO_3$. The stored tensile energy can be calculated from the measured SCALP stress profile data and using Equation (3) above.

Figure 17:
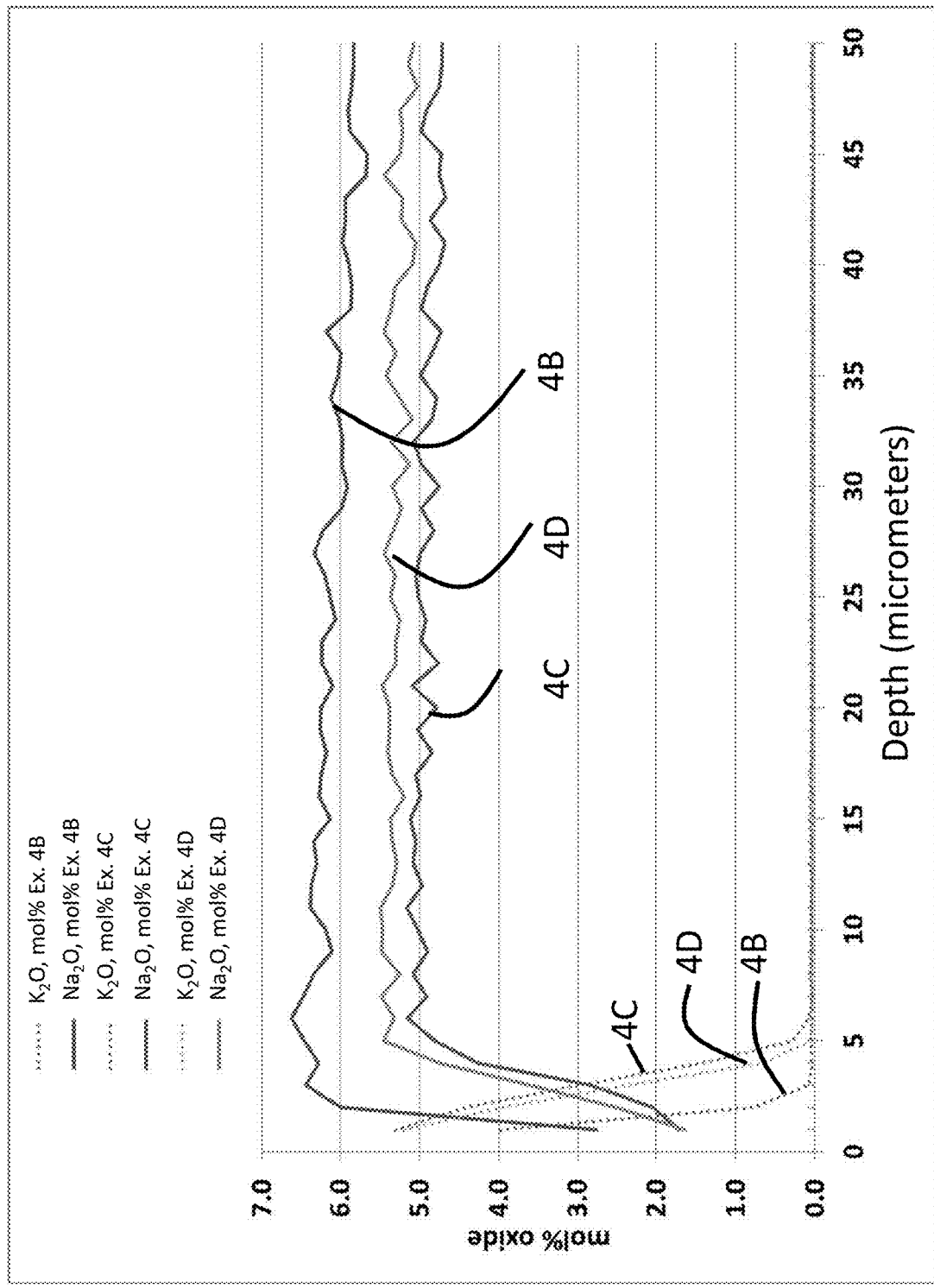
FIG. 17 is a graph showing the concentration of $K_2O$ and $Na_2O$ as a function of depth in Examples 4A-4D.
Figure 18:
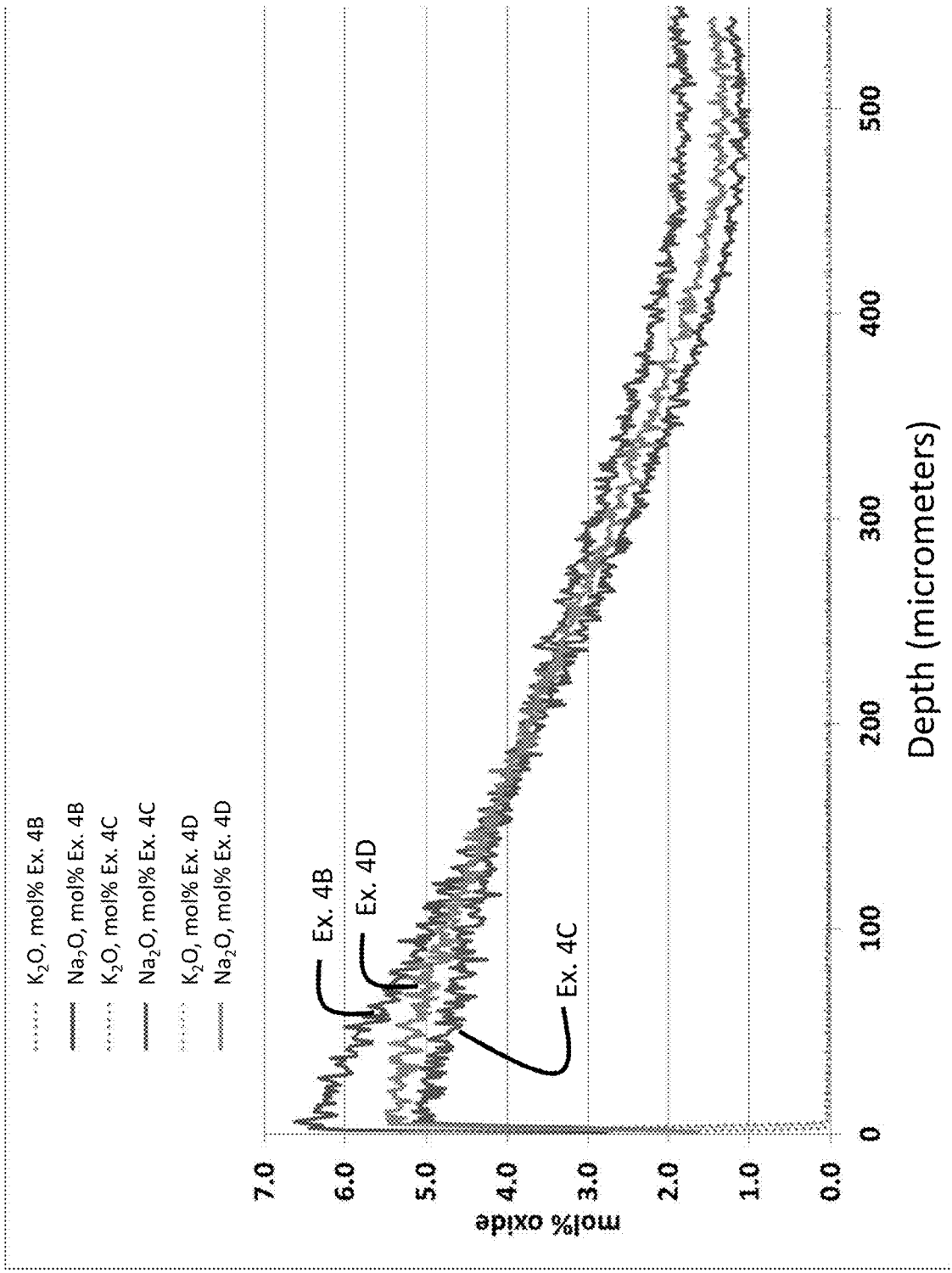
FIG. 18 is a graph showing the same data as FIG. 17, but with a different scale to more clearly illustrate the concentration of $Na_2O$ as a function of depth.

FIGS. 17 and 18 show the concentration profiles of each of $K_2O$ and $Na_2O$ as a function of depth (in micrometers) for each of Examples 4B-4D. As shown in FIG. 17, the chemical depth of $K_2O$ is 3 micrometers for Ex. 4B (immersion for 0.75 hours in a $KNO_3$ bath), 6 micrometers for Ex. 4C (immersion for 4 hours in a $KNO_3$ bath), and 5 micrometers for Ex. 4D (immersion for 8 hours in a $KNO_3$ bath). As shown in FIG. 18, $Na_2O$ penetrates the entire depth and has a concentration of about 1 mol % or greater for each of Examples 4B-4D along the entire depth of the glass-based article.

Figure 19:
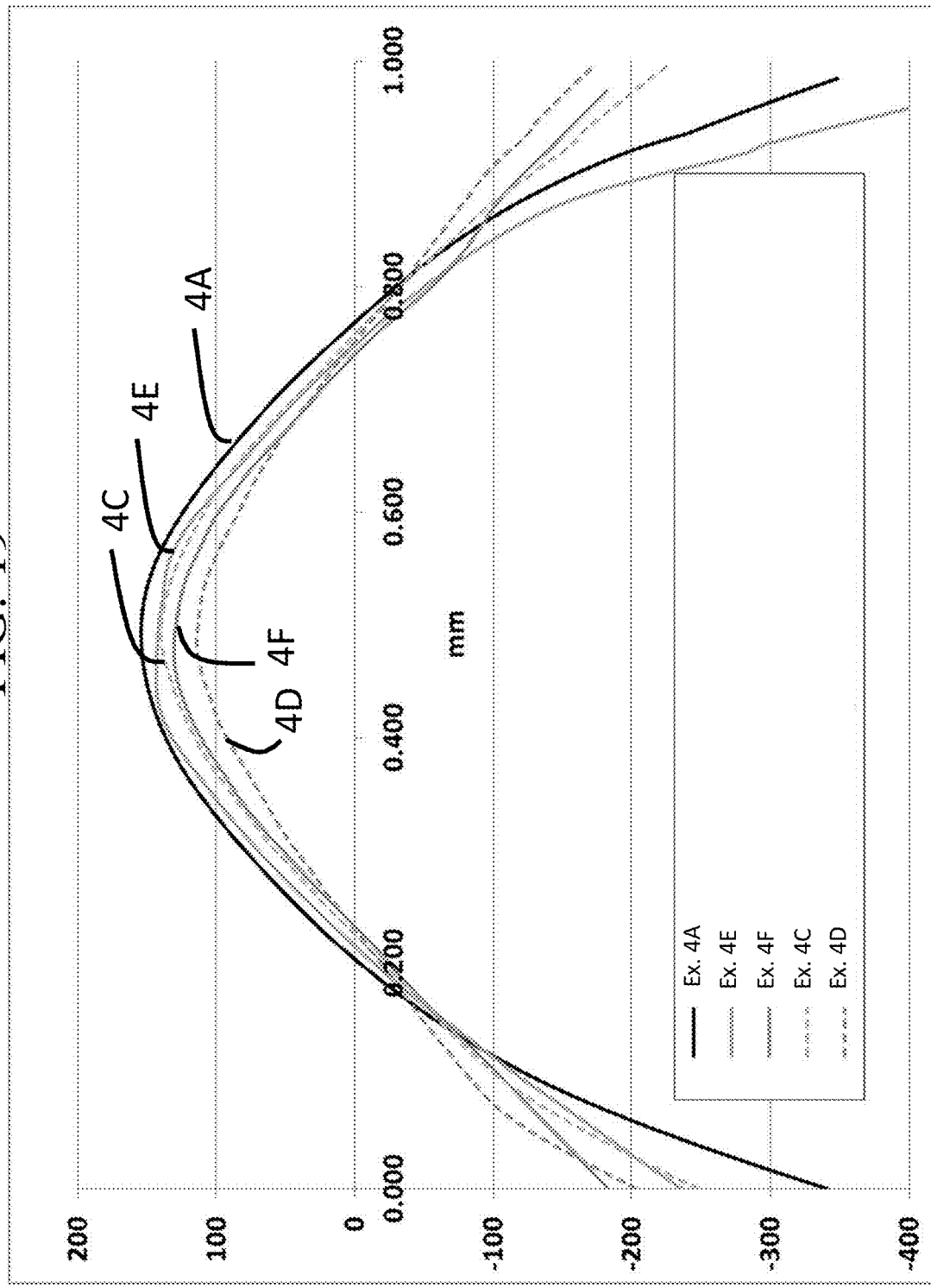
FIG. 19 is a graph showing the stress profiles of Examples 4A and 4C-4F as a function of depth with the CT region having positive stress and the CS region having negative stress.
Figure 20:
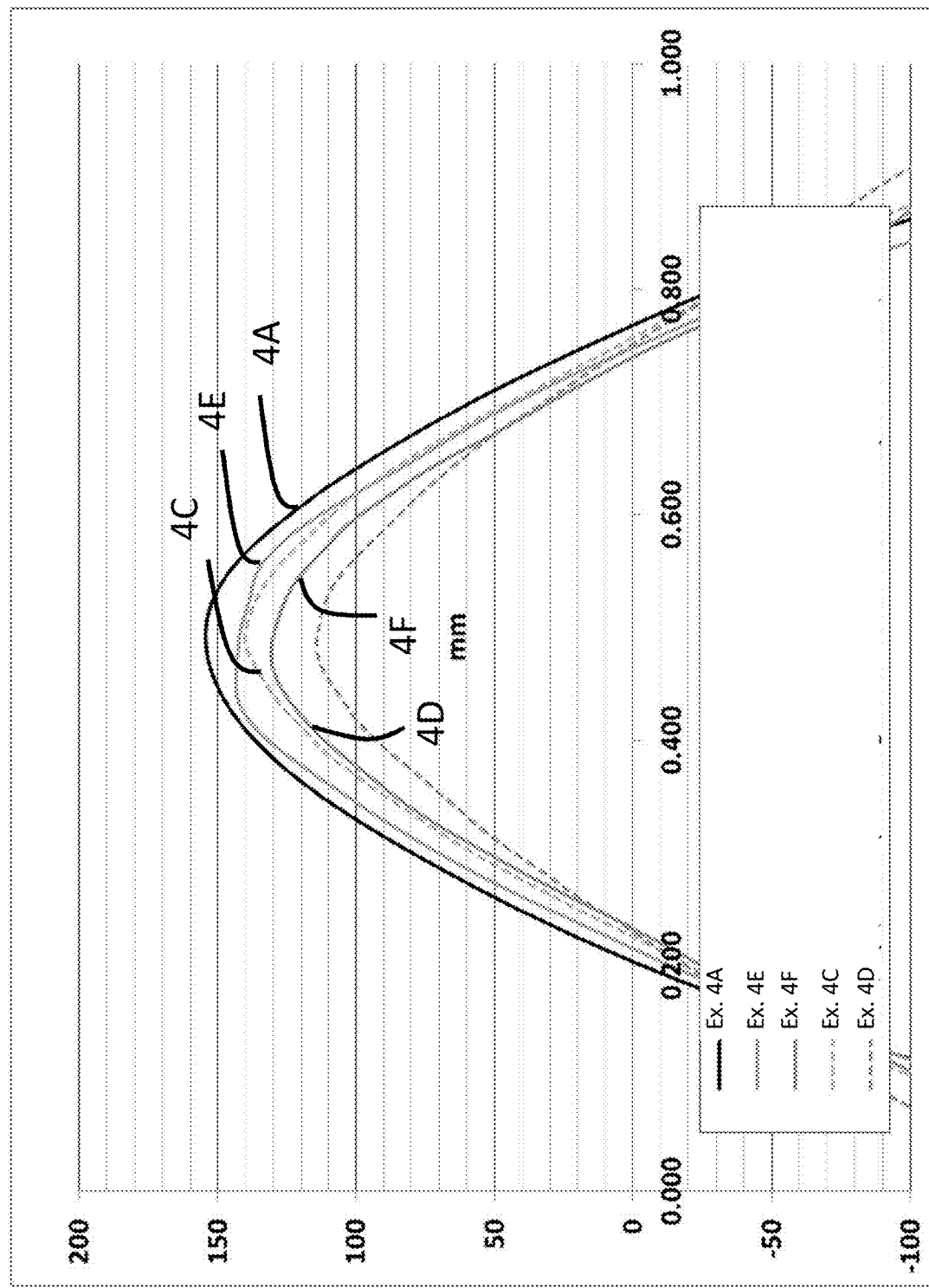
FIG. 20 is a graph showing the same data as FIG. 19 at a different scale with the CT region having positive stress and the CS region having negative stress.

Examples 4E and 4F included glass substrates (each having a thickness of about 1 mm) having the composition of Table 2, which were subjected to chemical strengthening by immersing in a first molten salt bath of $NaNO_3$ having a temperature of 430° C. for 24 hours, followed by heat treatment to a temperature of 430° C. in air for 4 hours or 8.25 hours, respectively. The stress profiles of the glass-based articles of Examples 4E and 4F are shown in FIG. 19, with the stress profiles for Examples 4A, 4C and 4D shown for comparison. FIG. 20 shows the same graph as FIG. 19, at a smaller scale to illustrate the differences in the stress profiles at or near a depth of 0.5·t.

Example 5

Glass substrates (each having a thickness of about 1 mm) having the composition of Table 2 were subjected to chemical strengthening by immersing in a first molten salt bath of $NaNO_3$ having a temperature of 430° C. for 24 hours. One glass-based article was not subjected to any additional strengthening steps (Example 5A). Two glass-based articles were subjected to a second strengthening step by placing the glass-based articles in a furnace at 390° C. and maintaining the glass-based articles in the furnace for about 8 hours or 28 hours, Examples 5B and 5C, respectively. Four glass-based articles were subjected to a third strengthening step (after the first strengthening step and either of the different second strengthening steps) by immersing in a second molten salt bath of $KNO_3$ having a temperature of 430° C. for 4 hours or 8 hours, Examples 5D and 5G, respectively. The strengthening steps for each of Examples 5A-5G is shown in Table 3. The measured CT values are also shown in Table 3.

TABLE 3

Strengthening steps for Examples 5A-5G.

| Step | Ex. 5A | Ex. 5B | Ex. 5C | Ex. 5D | Ex. 5E | Ex. 5F | Ex. 5G |
|---|---|---|---|---|---|---|---|
| 1st Step | $NaNO_3$, 430° C., 24 hours | $NaNO_3$, 430° C., 24 hours | $NaNO_3$, 430° C., 24 hours | $NaNO_3$, 430° C., 24 hours | $NaNO_3$, 430° C., 24 hours | $NaNO_3$, 430° C., 24 hours | $NaNO_3$, 430° C., 24 hours |
| 2nd Step | | Air, 390° C., 8 hours | Air, 390° C., 28 hours | Air, 390° C., 8 hours | Air, 390° C., 28 hours | Air, 390° C., 8 hours | Air, 390° C., 28 hours |
| 3rd Step | | | | $KNO_3$, 430° C., 4 hours | $KNO_3$, 430° C., 4 hours | $KNO_3$, 430° C., 8 hours | $KNO_3$, 430° C., 8 hours |
| CT | 174 MPa | 148 MPa | 96 MPa | 129 MPa | 82 MPa | 103 MPa | 72 MPa |

Figure 21:
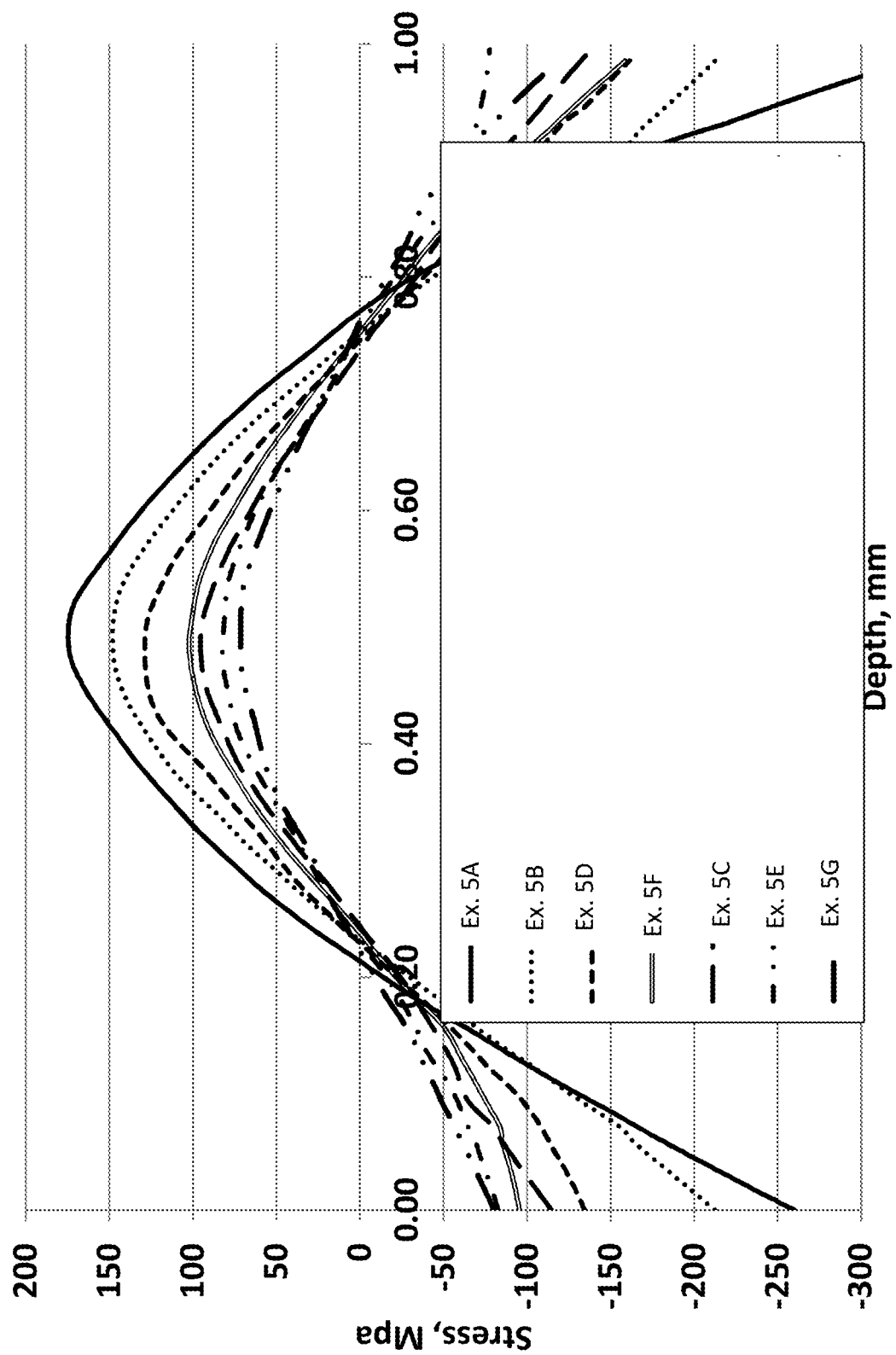
FIG. 21 is a graph showing the stress profiles of Examples 5A-5G as a function of depth with the CT region having positive stress and the CS region having negative stress.
Figure 22:
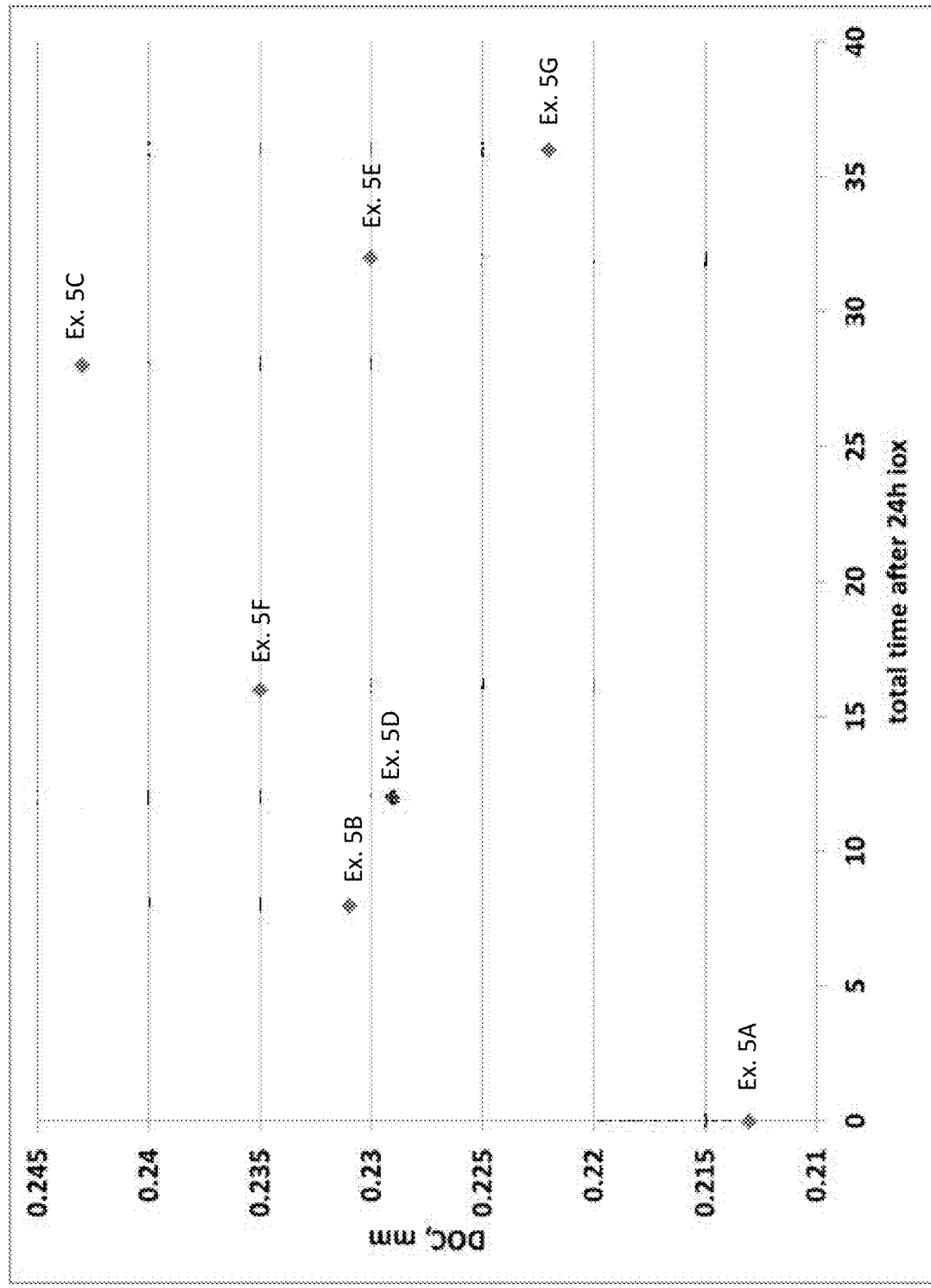
FIG. 22 is a graph showing the DOC values for Examples 5A-5G as a function of duration of the second and/or third ion exchange steps.
Figure 23:
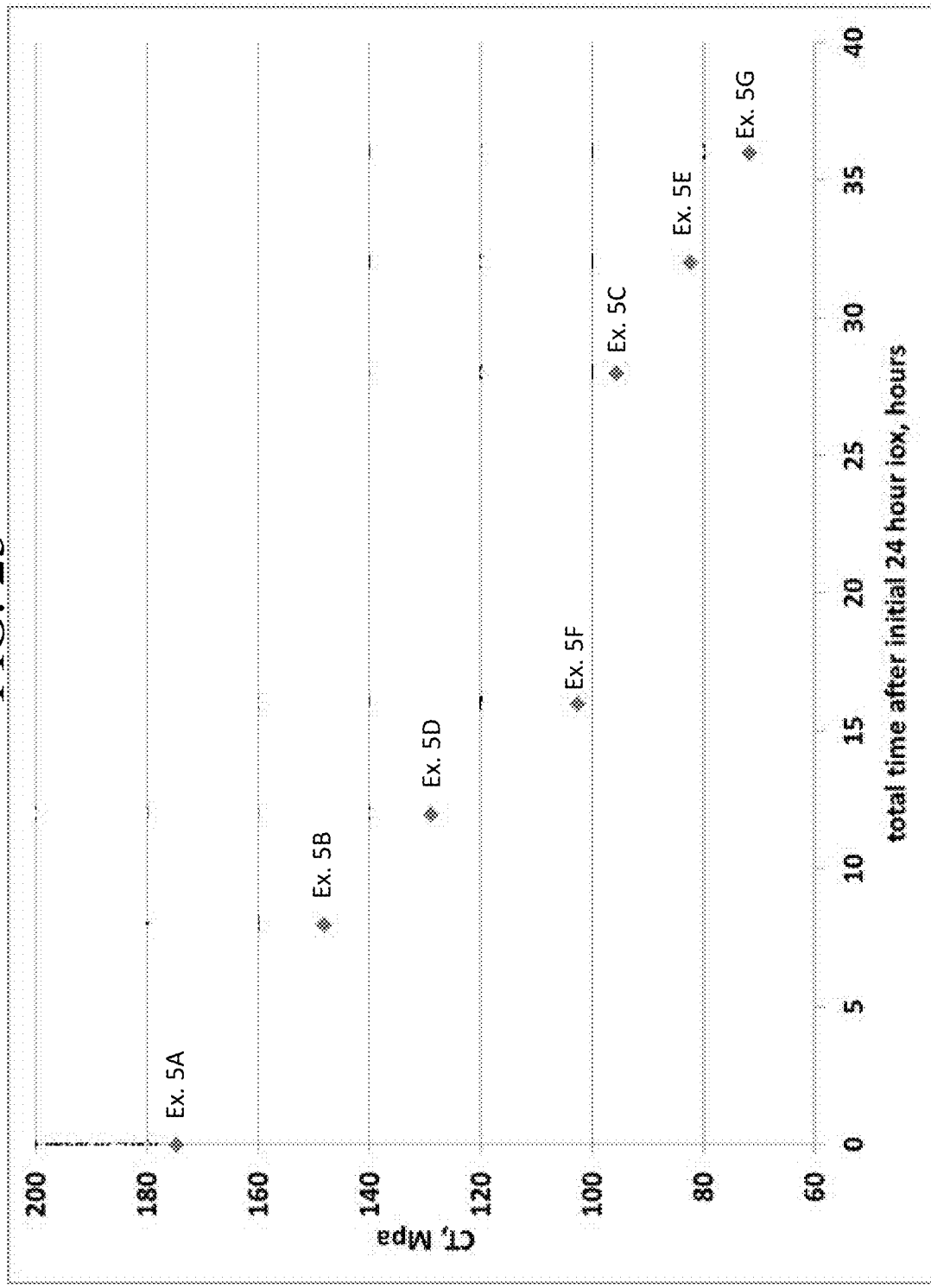
FIG. 23 is a graph showing the CT values for Examples 5A-5G as a function of duration of the second and/or third ion exchange steps.

The stress profiles of the resulting glass-based articles are shown in FIG. 21, with depth or thickness of the glass-based articles plotted on the x-axis and stress plotted on the y-axis. The positive stress values are CT values and the negative stress values are the CS values. As shown in FIG. 21, as the duration of the second and/or third heat treatments is increased, the DOC increased and the CT decreased. The decrease in DOC and CT are shown more clearly in FIGS. 22 and 23, respectively, as a function of total heat treatment time after ion exchange.

The glass-based articles of Examples 5A-5G were then subjected to a poke test in which one side of the glass-based article is adhered to tape and the opposite bare side is impacted with sharp implement and fractured. The resulting number of fragments can be correlated to the stored tensile energy of the glass-based article. Examples 5A, 5B and 5D exhibited numerous fragments (i.e., in excess of 50 and even 100), while Example 5F exhibited 10 fragments, Example 5C exhibited 3 fragments, and Example 5E and 5G exhibited 4 fragments. Examples 5A, 5B and 5D, which fractured into numerous fragments, exhibited higher CT (greater than about 100 MPa) than Examples 5C, 5E, 5F and 5G which all had CT values of about 100 MPa or less.

Example 7

Glass substrates having a nominal composition as shown in Table 2 and each having a thickness of about 1 mm were subjected to chemical strengthening in a molten salt bath including 100% $NaNO_3$ and a temperature of 430° C. The duration for which the glass substrates were immersed in the molten salt bath are shown in Table 5.

TABLE 4

Chemical strengthening duration (ion exchange times) for Examples 7A-7G.

| Example | IOX Time (hours) |
| --- | --- |
| 7A | 2 |
| 7B | 4 |
| 7C | 8 |
| 7D | 16 |
| 7E | 24 |
| 7F | 32.5 |
| 7G | 48 |

Figure 24:
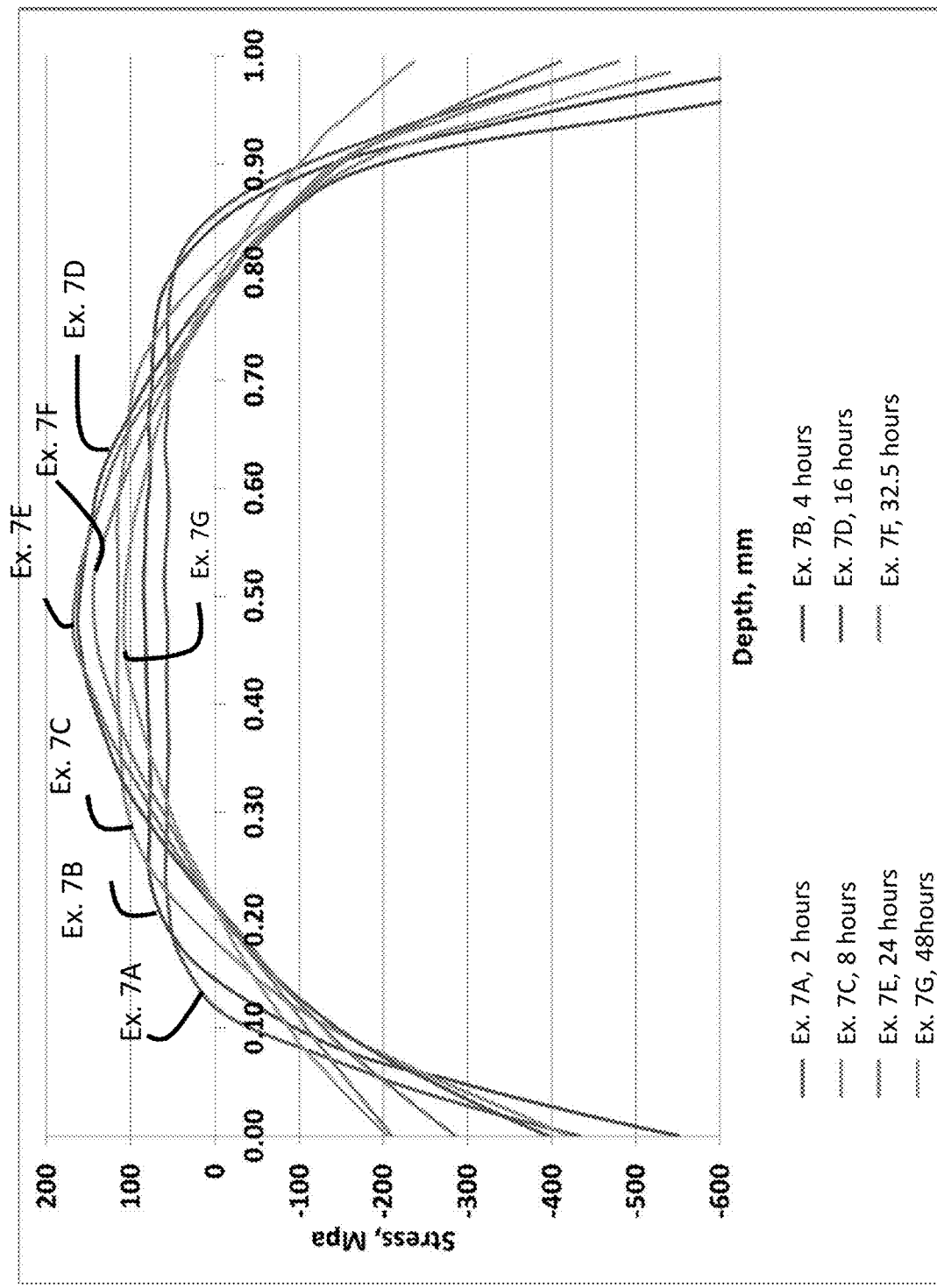
FIG. 24 is a graph showing the stress profiles as a function of depth for Examples 7A-7G with the CT region having positive stress and the CS region having negative stress.
Figure 25:
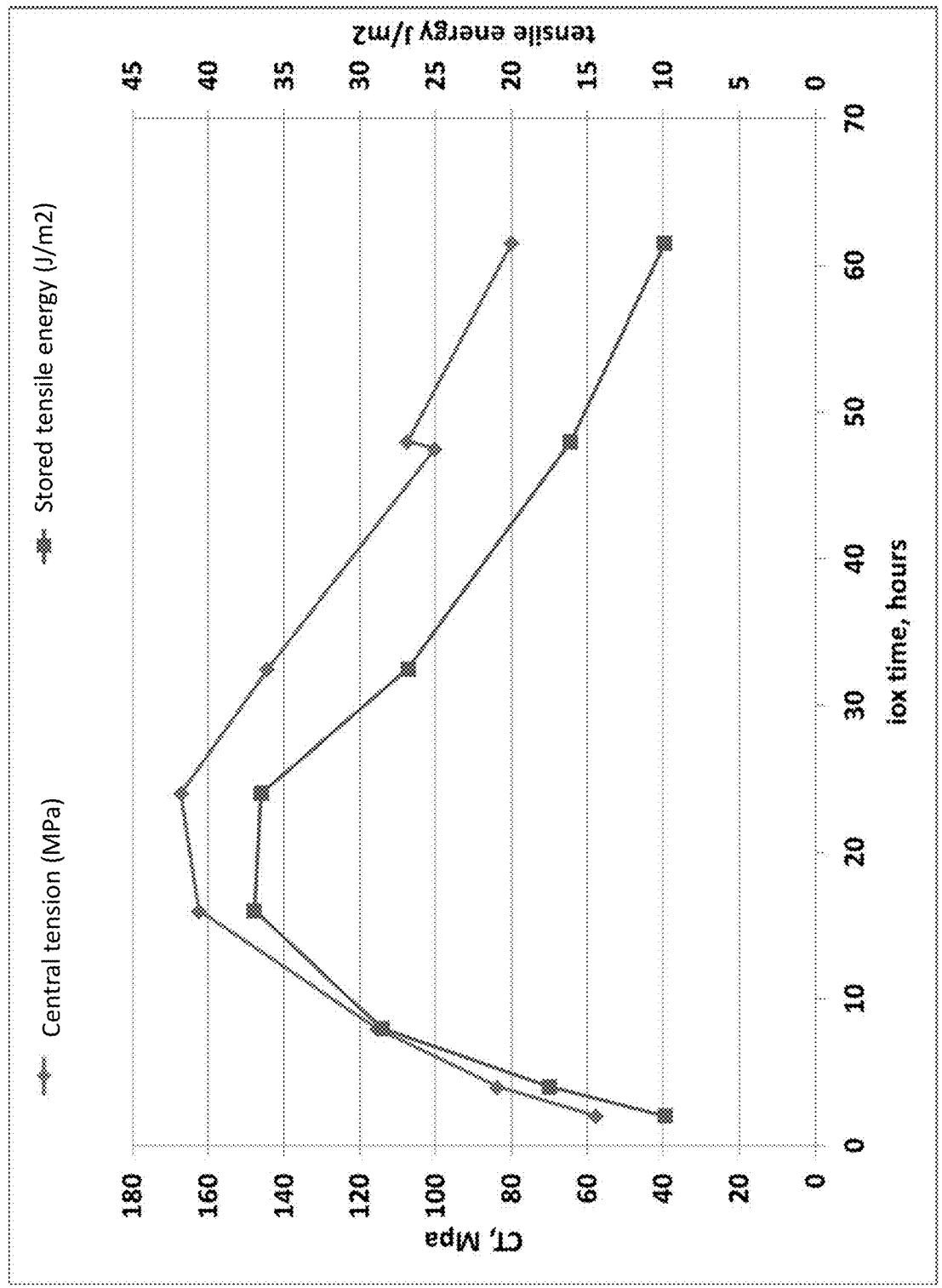
FIG. 25 is a graph showing the central tension values and stored tensile energy, both as a function of ion exchange time, for Examples 7A-7G.

The stress profiles of the glass-based articles of Examples 7A-7G are shown in FIG. 24. The stress profiles were measured using SCALP. A graph showing the change in CT values and stored tensile energy, both as a function of ion exchange time is shown in FIG. 25. As shown in FIG. 25, immersion of the glass substrates in the molten salt bath for 16 hours and 24 hours results in glass-based articles exhibiting the greatest surface CS values and the greatest CT values, in absolute terms.

Example 8

Figure 26:
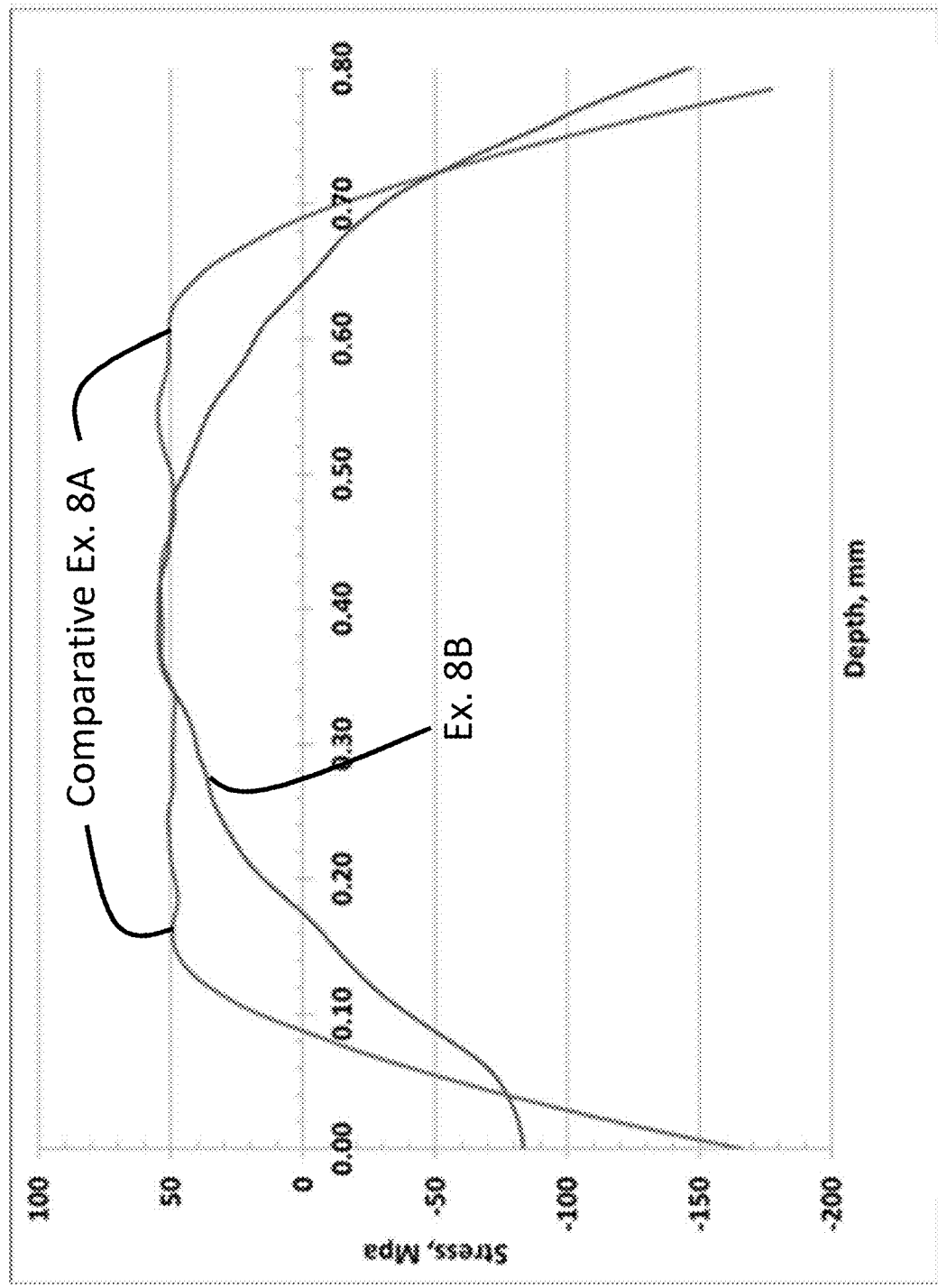
FIG. 26 is a graph showing the stress profiles of Comparative Example 8A and Example 8B as a function of depth with the CT region having positive stress and the CS region having negative stress.

Glass substrates having a nominal composition as shown in Table 2 and having a thicknesses of about 0.8 mm each were subjected to chemical strengthening in a molten salt bath including a mixture of $NaNO_3$ and $NaSO_4$ and a temperature of 500° C. for 15 minutes (Comparative Example 8A) and for 16 hours (Example 8B). The stress profile of the glass-based articles of Examples 8A and 8B are shown in FIG. 26. A shown in FIG. 26, Comparative Example 8A exhibited a known stress profile, whereas, Example 8B showed a stress profile according to one or more embodiments of this disclosure. The stored tensile energy of the glass-based articles of Examples 8A and 8B was calculated in the same manner as Examples 4B-4D. The calculated stored tensile energy is plotted as a function of measured CT (MPa), as shown in FIG. 27.

Figure 27:
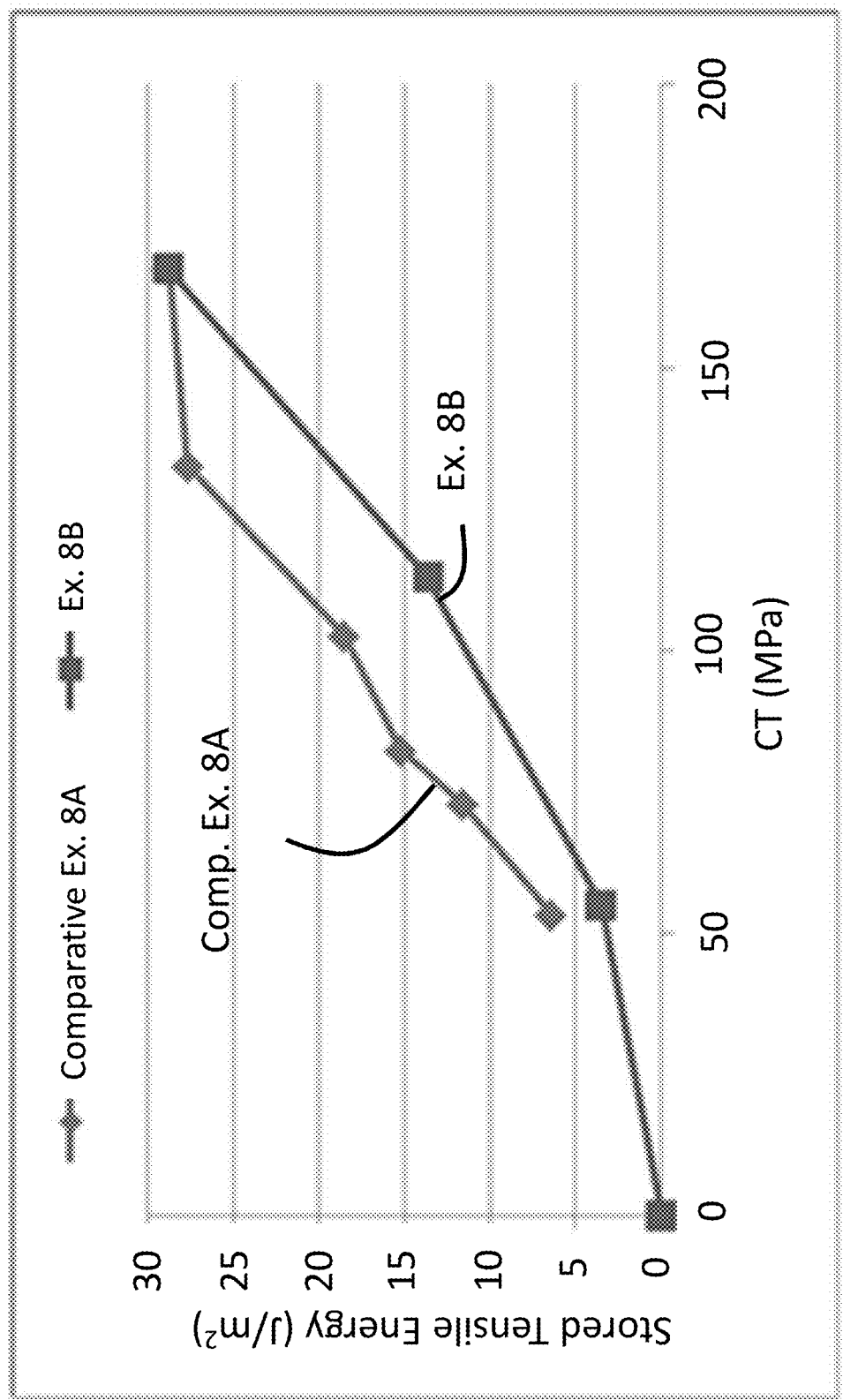
FIG. 27 is a graph showing the stored tensile energy of Comparative Example 8A and Example 8B as a function of CT.

As shown in FIG. 27, Comparative Example 8A exhibited much greater stored tensile energy values for a given CT value than Example 8B (for the same CT value). Specifically, at a CT of about 55 MPa, Comparative Example 8A exhibited a stored tensile energy of about 8 $J/m^2$, whereas Example 8B exhibited a stored tensile energy of about 3.5 $J/m^2$. Comparative Example 8A and Example 8B were fractured and Example 8B fractured into fewer pieces than Comparative Example 8A, which fractured into a significantly greater number of pieces. Accordingly, without being bound by theory, it is believed that controlling the stored tensile energy may provide a way to control or predict fragmentation patterns or the number of fragments that result from fracture.

Glass substrates having a nominal composition as shown in Table 2 and having a thicknesses of about 1 mm each were subjected to chemical strengthening in a molten salt bath including $NaNO_3$ and a temperature of 430° C. for 4 hours (Comparative Example 8C) and for 61.5 hours (Example 8D). Comparative Example 8C exhibited a known stress profile, whereas, Example 8D showed a stress profile according to one or more embodiments of this disclosure. The stored tensile energy of Examples 8C and 8D was calculated using the same method used with Examples 4B-4D and plotted as a function of measured CT (MPa), as shown in FIG. 28.

Figure 28:
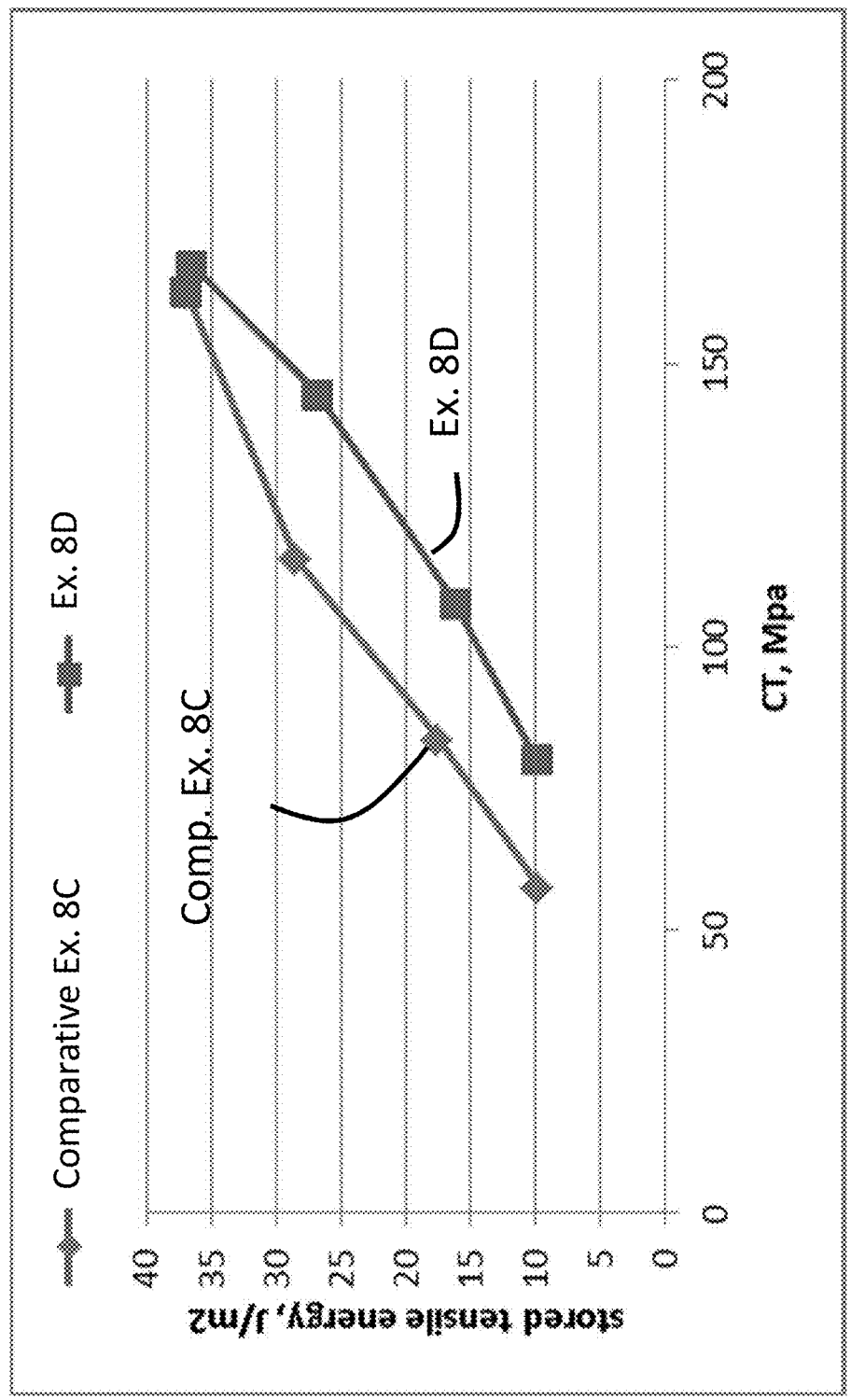
FIG. 28 is a graph showing stored tensile energy of Comparative Example 8C and Example 8D as a function of CT.

As shown in FIG. 28, Comparative Example 8C exhibited much greater stored tensile energy values for a given CT value than Example 8D (for the same CT value). Comparative Example 8C and Example 8D were fractured and Example 8D fractured into fewer pieces than Comparative Example 8C, which fractured into a significantly greater number of pieces.

Example 9

Glass substrates having a nominal composition of 70.9 mol % $SiO_2$, 12.8 mol % $Al_2O_3$, 1.95 mol % $B_2O_3$, 7.95 mol % $Li_2O$, 2.43 mol % $Na_2O$, 2.98 mol % MgO, 0.89 mol % ZnO, and 0.1 mol % $SnO_2$ and having a thicknesses of about 0.8 mm were subjected the ion exchange conditions of Table 5. Various properties of Example 9 are compared to Example 2 in Table 6.

TABLE 5

Ion exchange conditions for Example 9.

| Condition | Bath Composition | Bath Temperature (° C.) | Immersion time |
| --- | --- | --- | --- |
| 1 | 100% $NaNO_3$ | 430° C. | 16 hours |
| 2 | 20% $NaNO_3$, 80% $KNO_3$ | 430° C. | 11 hours |
| 3 | 100% $NaNO_3$ | 430° C. | 24 hours |
| 4 | 20% $NaNO_3$, 80% $KNO_3$ | 430° C. | 12.5 hours |

TABLE 6

Comparison of properties for Example 9 and Example 2.

| Property | Units | Ex. 9 | Ex. 2 |
| --- | --- | --- | --- |
| Strain point | ° C. | 592 | 615 |
| Anneal point | ° C. | 642 | 663 |
| Elastic Modulus | GPa | 81.4 | 83.8 |
| Shear Modulus | GPa | 33.8 | 34.3 |

TABLE 6-continued

Comparison of properties for Example 9 and Example 2.

| Property | Units | Ex. 9 | Ex. 2 |
|---|---|---|---|
| Poisson's ratio | | 0.211 | 0.222 |
| CTE (RT-300° C.) | ppm/° C. | 4.58 | 3.84 |
| Thermal Conductivity | W/cm*K | | |
| SOC | nm/cm/MPa | 30.94 | 32.65 |
| Refractive Index (at 550 nm) | | 1.5087 | 1.532 |

The stress profiles of the glass-based articles of Example 9 were measured and exhibited the shapes described herein.

Glass substrates according to Example 2, Comparative Examples 9A and 9B were provided having the same thickness as Example 9. The glass substrates according to Example 2 were ion exchanged in a molten bath of 100% NaNO$_3$, having a temperature of 430° C. for 33 hours. Comparative Example 9A was ion exchanged in a molten bath of 100% NaNO$_3$, having a temperature of 390° C. for 16 hours and also exhibited a known error function stress profile. The glass substrates according to Example 9B included a nominal composition of 57.5 mol % SiO$_2$, 16.5 mol % Al$_2$O$_3$, 16.7 mol % Na$_2$O, 2.5 mol % MgO, and 6.5 mol % P$_2$O$_5$ and were ion exchanged to exhibit a known error function stress profile. As used herein, the term "error function stress profile" refers to a stress profile resembling FIG. 1.

Figure 29:
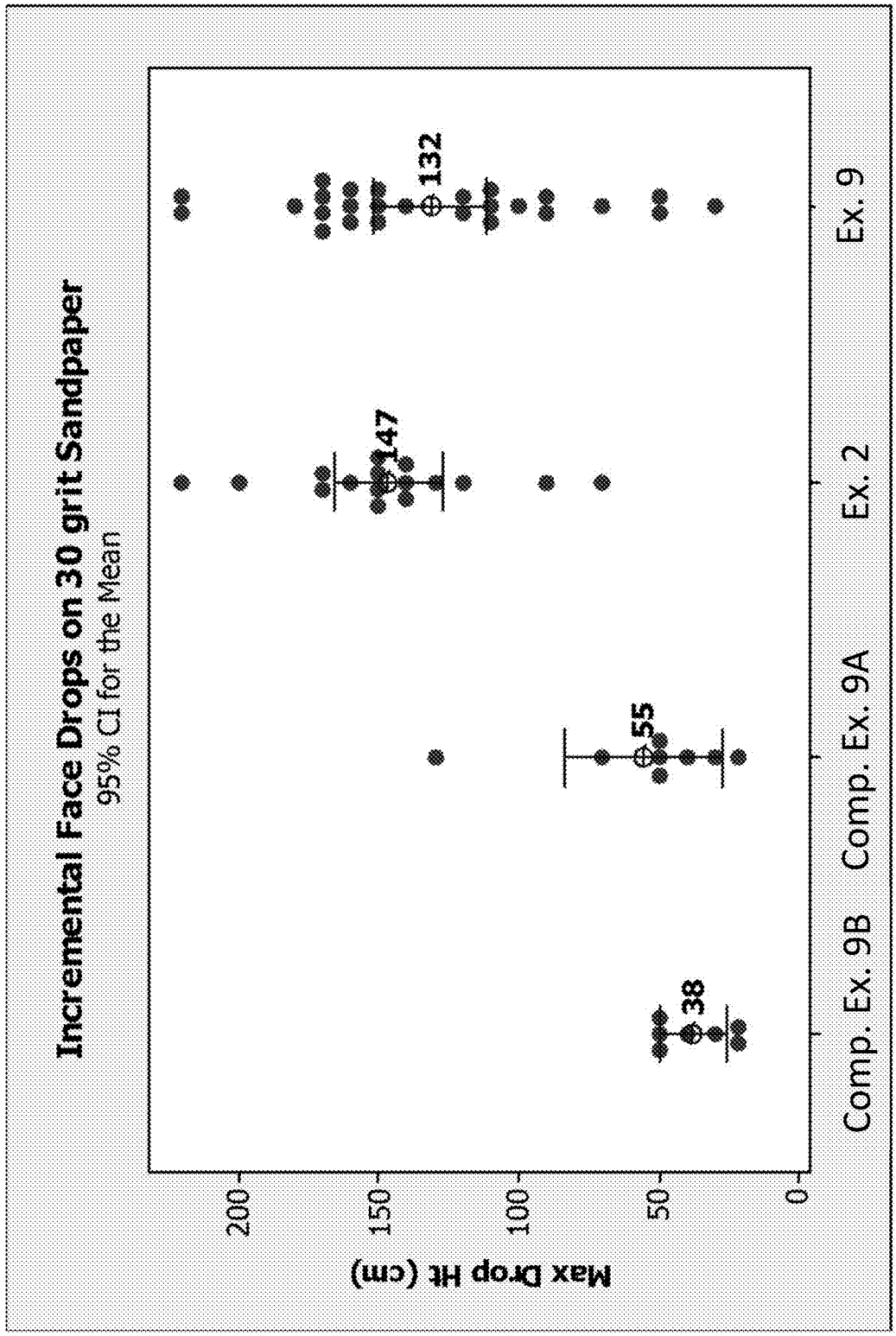
FIG. 29 is a graph showing the failure drop height for Examples 2 and 9, and Comparative Examples 9A and 9B.

The glass-based articles from Example 2, Example 9 and Comparative Examples 9A and 9B were then retrofitted onto identical mobile phone devices. The phone devices were dropped from incremental heights starting at 20 centimeters onto 30 grit sandpaper. If a glass-based article survived the drop from one height (e.g., 20 cm), the mobile phone was dropped again from a greater height (e.g., 30 cm, 40 cm, 50 cm, etc.). The height at which the glass-based article failed is plotted in FIG. 29, which also shows the average failure height for the samples of Examples 2, and 9 and Comparative Examples 9A and 9B. As shown in FIG. 29, Examples 2 and 9 exhibited failures at significantly greater drop height than Comparative Examples 9A and 9B. Specifically, Comparative Examples 9A and 9B exhibited failures at drop heights of about 38 cm and 55 cm, respectively, while Example 2 and 9 exhibited failures at drop heights of about 147 cm and 132 cm, respectively.

The same test was repeated with new samples using the same mobile phone device onto 180 grit sandpaper. The average failure height for Comparative Example 9A was 204 cm, the average failure height for Comparative Example 9B was 190 cm, the average failure height for Example 2 was 214 cm, and the average failure height for Example 9 was 214 cm.

Glass substrates according to Comparative Example 9C, having a nominal composition of 65 mol % SiO$_2$, 5 mol % B$_2$O$_3$, 14 mol % Al$_2$O$_3$, 14 mol % Na$_2$O, 2 mol % MgO, and 0.1 mol % SnO$_2$ and a thickness of 0.8 mm, were ion exchanged to exhibit a known error function stress profile The glass-based article samples of Example 2 and Comparative Example 9B (exhibiting the stress profile described above in this Example), Comparative Example 9C and the glass-based articles of Example 9 ion exchanged according to Condition 4, as shown in Table 5, were subjected to AROR testing as described herein.

Figure 30:
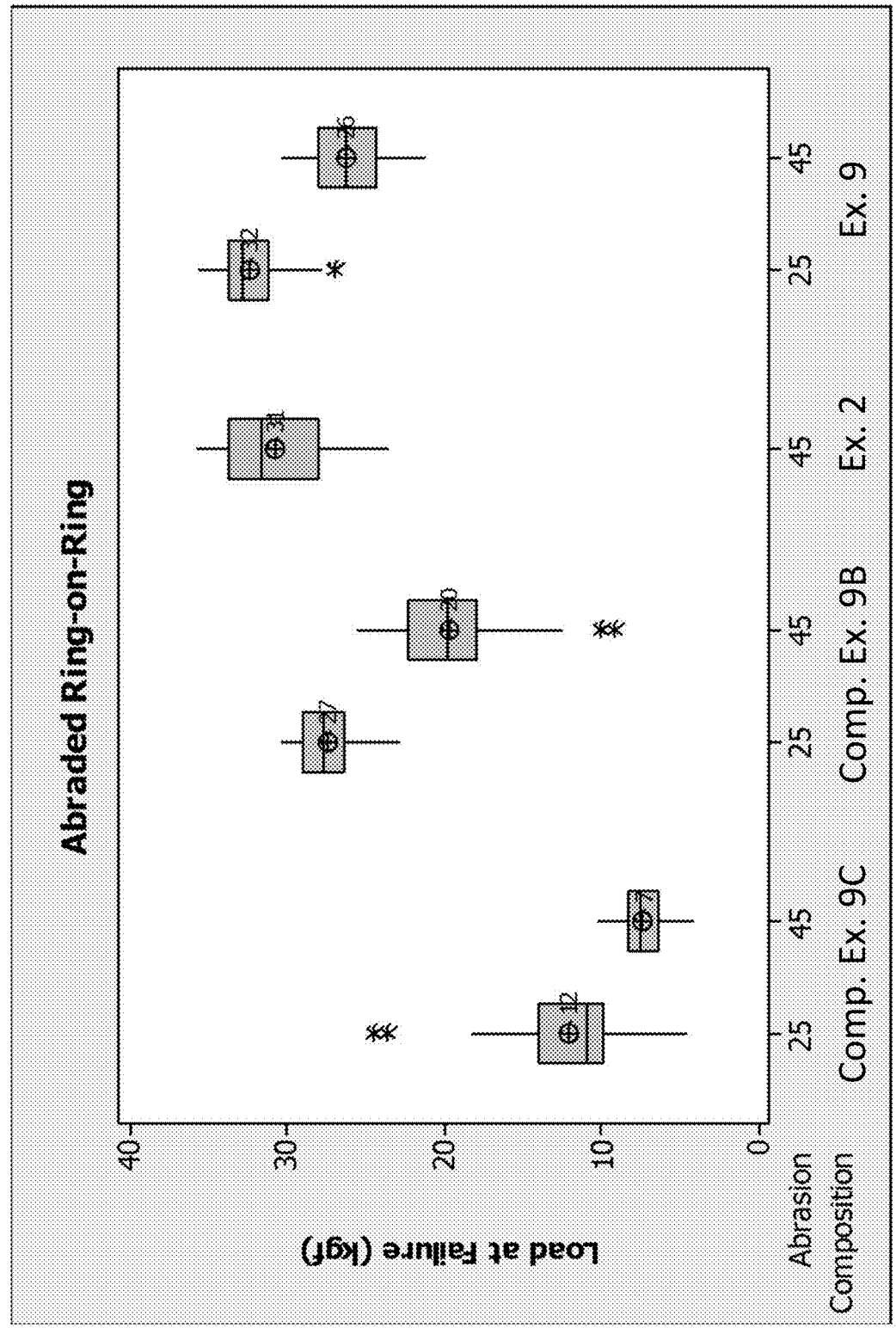
FIG. 30 is a graph showing the abraded ring-on-ring results for Examples 2 and 9, and Comparative Examples 9B and 9C.

Examples 6 and 9 and Comparative Example 9C were abraded using a load or pressure of 25 psi and 45 psi, and Example 2 was abraded using a load of 25 psi, only. The AROR data is shown in FIG. 30. As shown in FIG. 30, Examples 2 and 9 exhibited higher load to failure than Comparative Example 9B and Comparative Example 9C at the respective abrasion load or pressure.

Figure 31:
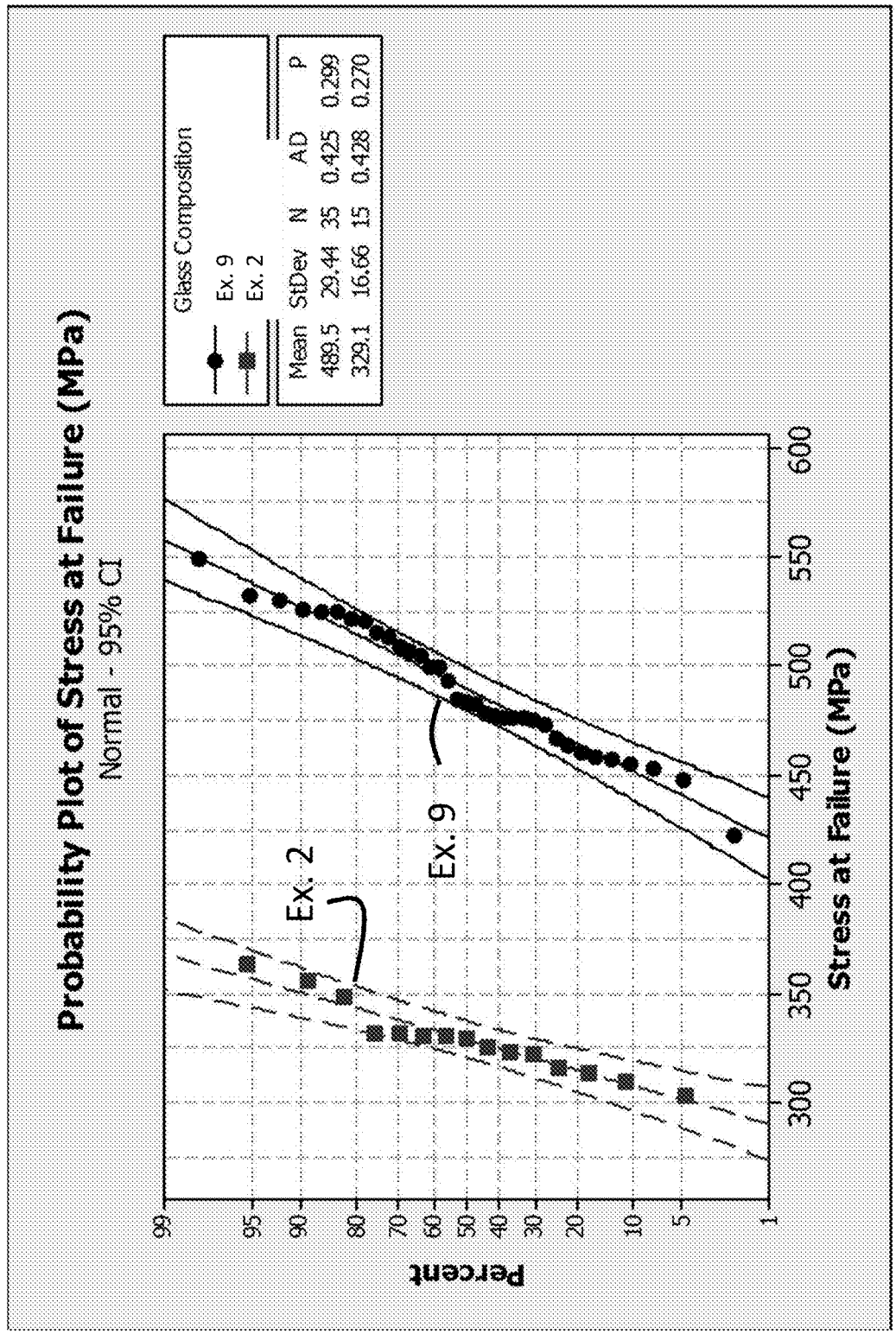
FIG. 31 is a Weibull distribution plot showing the 4-point bend test results for Examples 2 and 9.

Glass-based article samples of Examples 2 (ion exchanged as described above in this Example) and 9 (ion exchanged according to Condition 4) were subjected to a 4-point bend test. The results are shown in the Weibull distribution plot of FIG. 31. As shown in FIG. 31, Example 9 exhibited higher stress or load to failure (e.g., greater than about 400 MPa).

As shown above, glass-based articles made from compositions having a strain point greater than 525° C. enable ion exchange temperatures (or ion exchange bath temperatures) in the range from about 350° C. to about 480° C. In some embodiments, glass compositions exhibiting a monovalent ion diffusivity greater than about 800 square micrometers/hour enable the metal oxides diffusing into the glass based article to penetrate the entire depth or thickness of the article quickly such that stress relaxation is minimized, Excessive stress relaxation can reduce the surface compressive stress of the glass-based article.

It will be apparent to those skilled in the art that various modifications and variations can be made without departing from the spirit or scope of the disclosure.

Example 10

Figure 32:
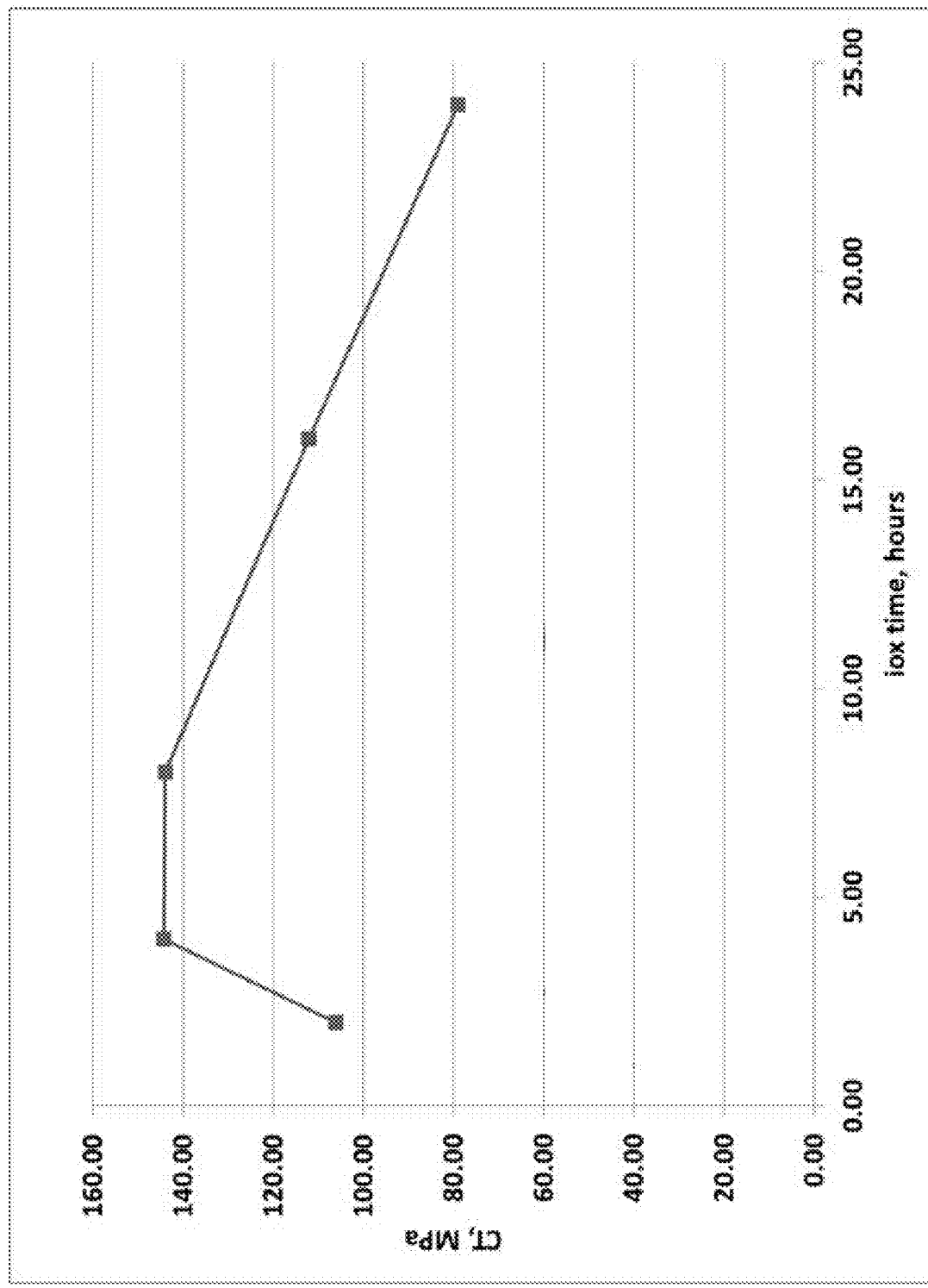
FIG. 32 is a graph showing the maximum CT values for Examples 10A-10E as a function of ion exchange time.

Glass substrates having the same composition as Example 9 and a thickness of about 0.8 mm, were subjected the ion exchange by immersing in a 100% NaNO$_3$ molten salt bath having a temperature of 430° C. according to the conditions provided in Table 7. The resulting glass-based articles exhibited maximum CT values, which are plotted as a function of ion exchange time in FIG. 32.

TABLE 7

Ion exchange conditions for Examples 10A-10E.

| Example | Time immersed in bath (hours) | Maximum CT (MPa) |
|---|---|---|
| 10A | 2 hours | 105 |
| 10B | 4 hours | 145 |
| 10C | 8 hours | 144 |
| 10D | 16.5 hours | 115 |
| 10E | 24 hours | 79 |

The stress profile for Example 10D was measured using a refracted near-field (RNF) measurement, as described in U.S. Pat. No. 8,854,623, entitled "Systems and methods for measuring a profile characteristic of a glass sample", which is incorporated herein by reference in its entirety. FIG. 33 shows the measured stress as a function of depth extending from the surface of the glass-based article of Example 10D into the glass-based article. The stress at specific depths is shown in Table 8, including at the "knee" which is the depth at which the slope of the stress changes drastically.

TABLE 8

Stress at specific depths of Example 10D.

| Depth (μm) | Stress (MPa) |
|---|---|
| 12 ("knee") | 151 |
| 50 | 105 |
| 100 | 66 |
| 150 | 20 |

Example 11

Example 11A included a glass substrate having the same composition as Example 1 and a thickness of 0.8 mm. The glass substrate was ion exchanged in a single molten salt bath including 80% $KNO_3$ and 20% $NaNO_3$, and having a temperature of about 430° C., for 16 hours. The resulting glass-based article exhibited the stress profile as described in Table 9.

TABLE 9

Stress profile of Example 11A.

| | |
|---|---|
| Surface Compressive Stress | 500 MPa |
| Depth of layer for potassium (as measured by FSM) | 12 micrometers |
| Stress at DOL of potassium | 151 MPa |
| Maximum CT | 90 MPa |
| DOC | 160 micrometers |

Figure 34:
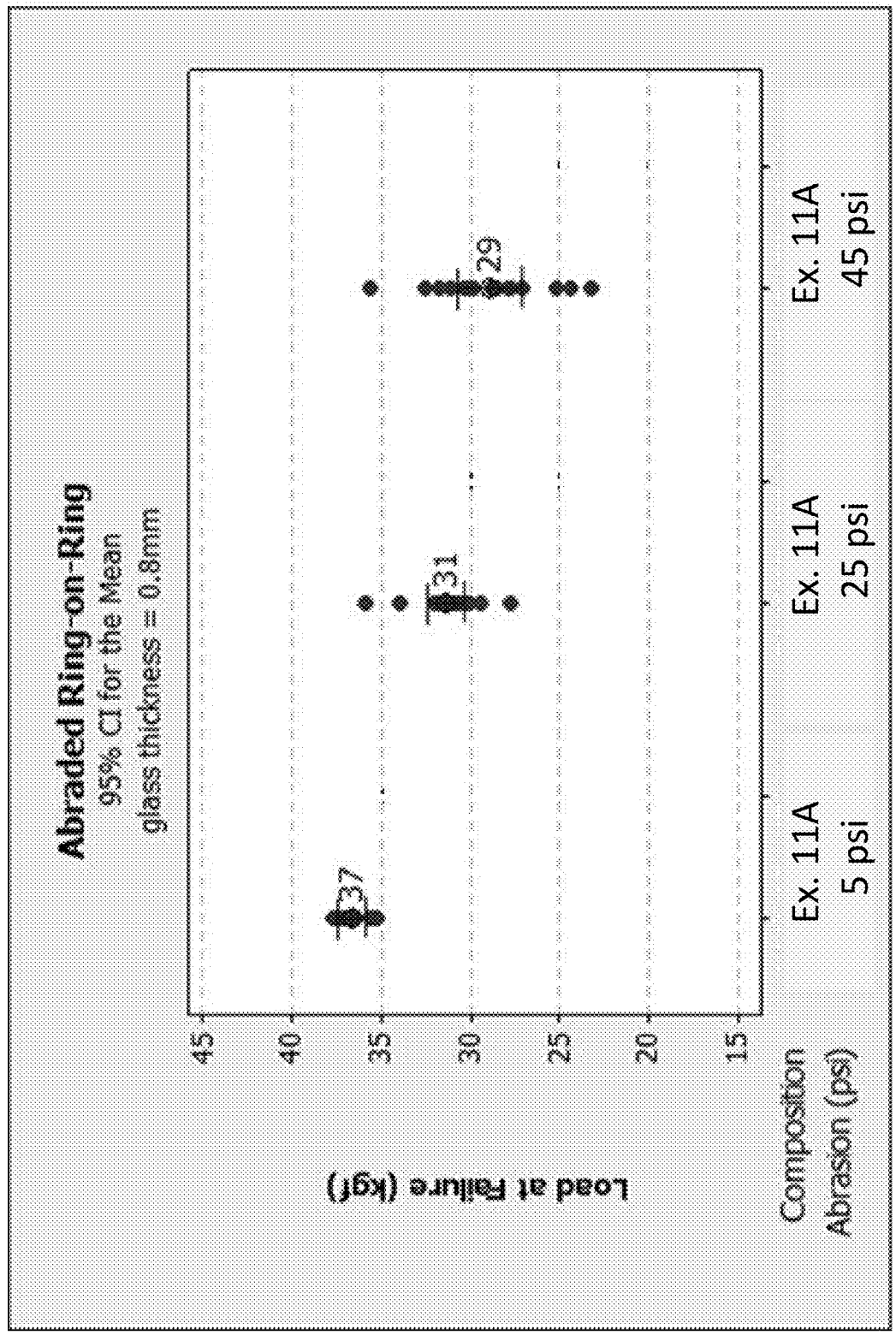
FIG. 34 is a graph showing the load to failure values for glass-based articles according to Example 11A after being abraded at different loads or pressures.

Glass-based articles according to Example 11A were subjected to AROR testing as described herein. One set of glass-based articles was abraded using a load or pressure of 5 psi, a second set of glass-based articles was abraded using a load or pressure of 25 psi, and a third set of glass-based articles was abraded using a load or pressure of 45 psi. The AROR data is shown in FIG. 34. As shown in FIG. 34, all of the glass-based articles according to Example 11A exhibited an average load to failure of greater than about 25 kgf.

Figure 35:
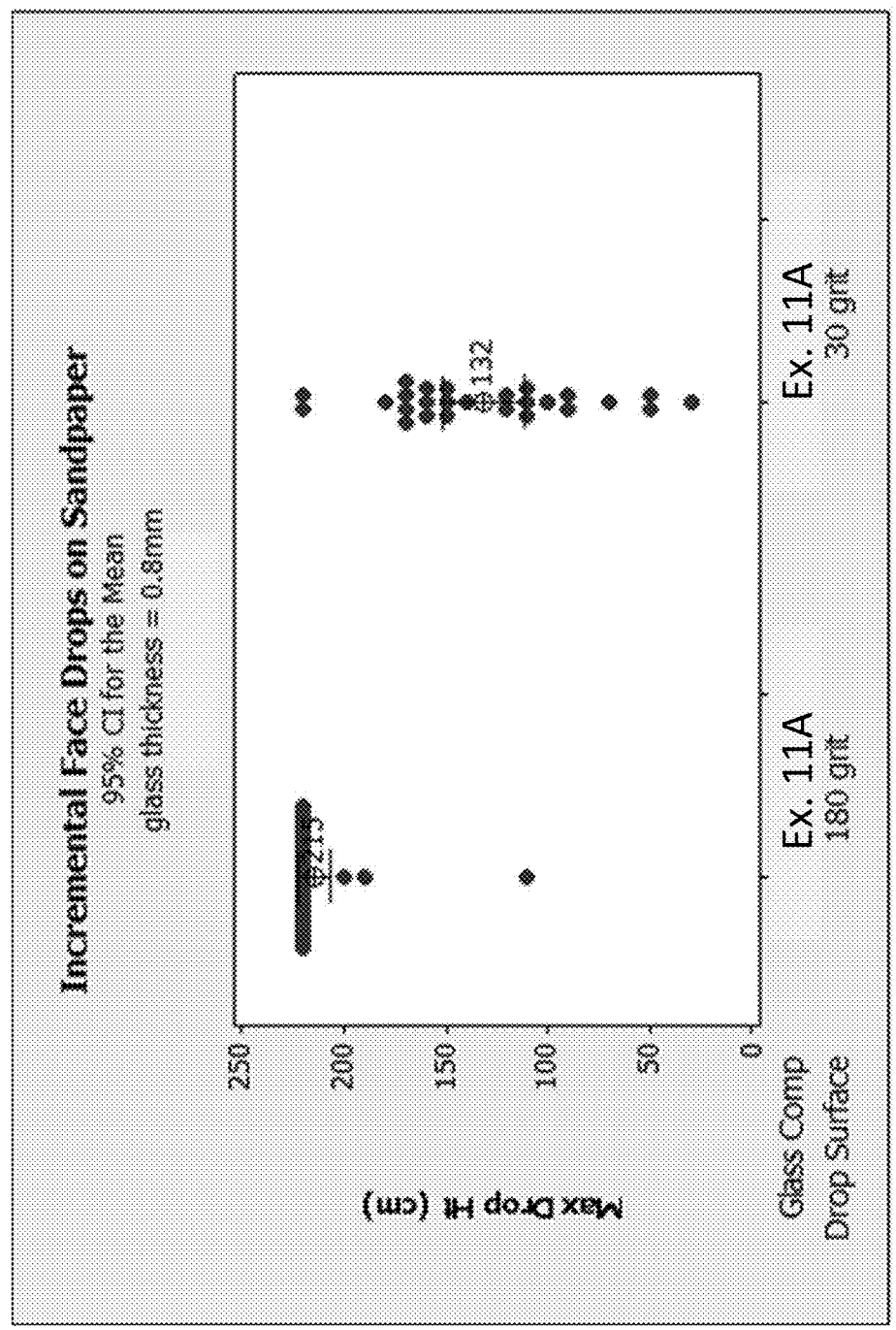
FIG. 35 is a graph showing the heights at which the glass-based articles according to Example 11A failed after being dropped onto 180 grit sandpaper and onto 30 grit sandpaper.

Glass-based articles according to Example 11A were retrofitted onto identical mobile phone devices. The phone devices were dropped from incremental heights starting at 20 cm onto 180 grit sandpaper. If a glass-based article survived the drop from one height (e.g., 20 cm), the mobile phone was dropped again from a greater height (e.g., 30 cm, 40 cm, 50 cm, etc.) up to a height of 225 cm. The surviving glass-based articles were then dropped onto 30 grit sandpaper (in the same phone devices). The height at which the glass-based article failed on both 180 grit sandpaper and 30 grit sandpaper is plotted in FIG. 35. As shown in FIG. 35, all but three glass-based article of Example 11A survived being dropped onto 180 grit sandpaper up to heights of about 225 cm (providing an average survival drop height of about 215 cm). The average survival drop height onto 30 grit sandpaper was 132 cm.

The glass based articles according to Example 11A exhibited a dielectric constant of about 5.8 to about 6 over a frequency range from about 480 mHz to about 3000 mHz. The glass-based articles according to Example 11A exhibited a dielectric loss tangent in the range from about 0.010 to about 0.013 over a frequency range from about 480 mHz to about 3000 mHz.

The refractive index of the glass-based articles according to Example 11A is in the range from about 1.496 to about 1.523 over a range from about 380 nm to about 1550 nm, and from about 1.496 to about 1.503 over a wavelength range from about 380 nm to about 800 nm.

The glass-based articles according to Example 11A were subjected to various chemical treatments as shown in Table 10. The chemical durability of the glass-based articles was compared to Comparative Examples 11B, 11C and 11D. Comparative Example 11B was a glass substrate having a nominal composition of 64.3 mol % $SiO_2$, 7.02 mol % $B_2O_3$, 14 mol % $Al_2O_3$, 14 mol % $Na_2O$, 0.5 mol % $K_2O$, 0.03 mol % $Fe_2O_3$, and 0.1 mol % $SnO_2$. Comparative Example 11C was a glass substrate having a nominal composition of 64.75 mol % $SiO_2$, 5 mol % $B_2O_3$, 14 mol % $Al_2O_3$, 13.75 mol % $Na_2O$, 2.4 mol % MgO, and 0.08 mol % $SnO_2$. Comparative Example 11D included a glass substrate having a nominal composition of 57.5 mol % $SiO_2$, 16.5 mol % $Al_2O_3$, 16.71 mol % $Na_2O$, 2.8 mol % MgO, 0.05 mol % $SnO_2$ and 6.5 mol % $P_2O_5$.

TABLE 10

Chemical durability of Example 11A and Comparative Examples 11B, 11C and 11D.

| | Weight loss (mg/cm2) | | | |
|---|---|---|---|---|
| Chemical Treatment | Comparative Ex. 11B | Comparative Ex. 11C | Comparative Ex. 11D | Ex. 11A |
| 5% w/w HCl, 95° C., 24 hours | 29.3 | 6.7 | 50 | 5.77 |
| 5% w/w NaOH, 95° C., 6 hours | 2.8 | 2.4 | 5.8 | 2.68 |
| 10% HF, room temperature, 20 minutes | 20.8 | 18.1 | 37.4 | 24.03 |
| 10% ammonium bifluoride (ABF), room temperature, 20 minutes | 2 | 2.7 | 3.2 | 0.98 |

Example 12

Example 12A included glass substrates having the same composition as Example 1 and a thickness of 0.8 mm. Comparative Example 12B included glass substrates having the same composition as Comparative Example 11D and a thickness of 0.8 mm. The glass substrates of Example 12A were chemically strengthened in a single step using a single bath, as described in Table 11. The glass substrates of Comparative Example 12B was ion exchanged in a two-step process, as described in Table 11.

TABLE 11

Ion exchange conditions for Example 12A and Comparative Example 12B.

| | | Ex. 12A | Comparative Ex. 12B |
|---|---|---|---|
| 1st Step | Molten salt bath composition | 20% NaNO3/80% KNO3 | 49% NaNO3/51% KNO3 |
| | Bath Temperature | 430° C. | 460° C. |
| | Immersion time | 16 hours | 14 hours |
| 2nd Step | Molten salt bath composition | — | 99.5% KNO3/0.5% NaNO3 |
| | Bath Temperature | — | 390° C. |
| | Immersion time | — | 0.25 hours |
| Properties of resulting glass-based article | Surface CS | 500 MPa | 825 MPa |
| | DOL of potassium | 12 micrometers | 10 micrometers |
| | Stress at DOL of potassium | 150 MPa | 220 MPa |
| | DOC | 160 micrometers | 100 micrometers |

Figure 36:
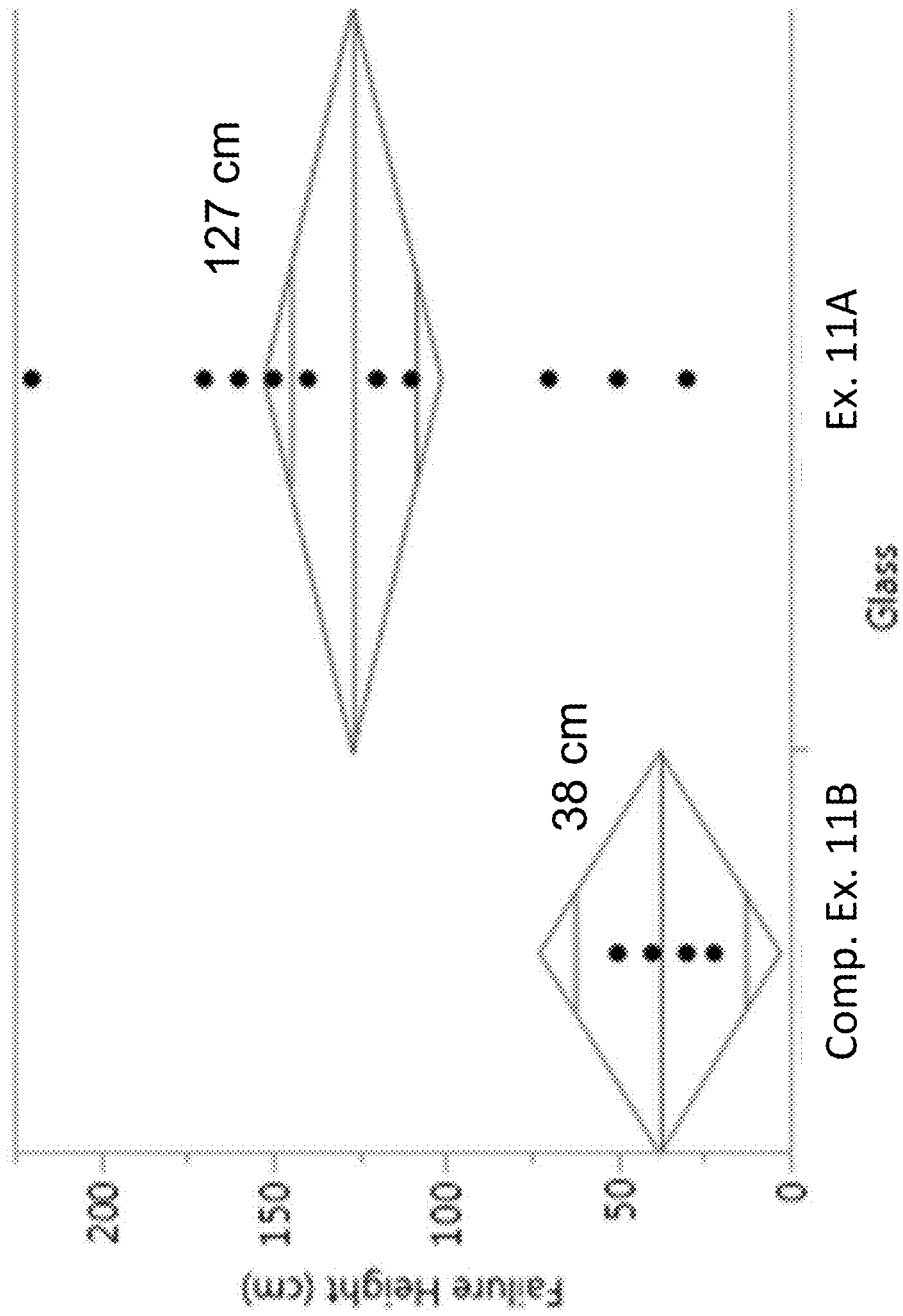
FIG. 36 is a graph showing the heights at which the glass-based articles according to Example 11A and Comparative Example 11B failed after being dropped onto 30 grit sandpaper.

The glass-based articles according to Example 12A and Comparative Example 12B were retrofitted onto identical mobile phone devices. The phone devices were dropped from incremental heights starting at 20 centimeters onto 30 grit sandpaper. The height at which the glass-based article failed on 30 grit sandpaper is plotted in FIG. 36. As shown in FIG. 36, the glass-based articles of Example 12A exhibited an average survival drop height that is more than three times (i.e., 127 cm) the average survival drop height of Comparative Example 12B (i.e., 38 cm).

Figure 37:
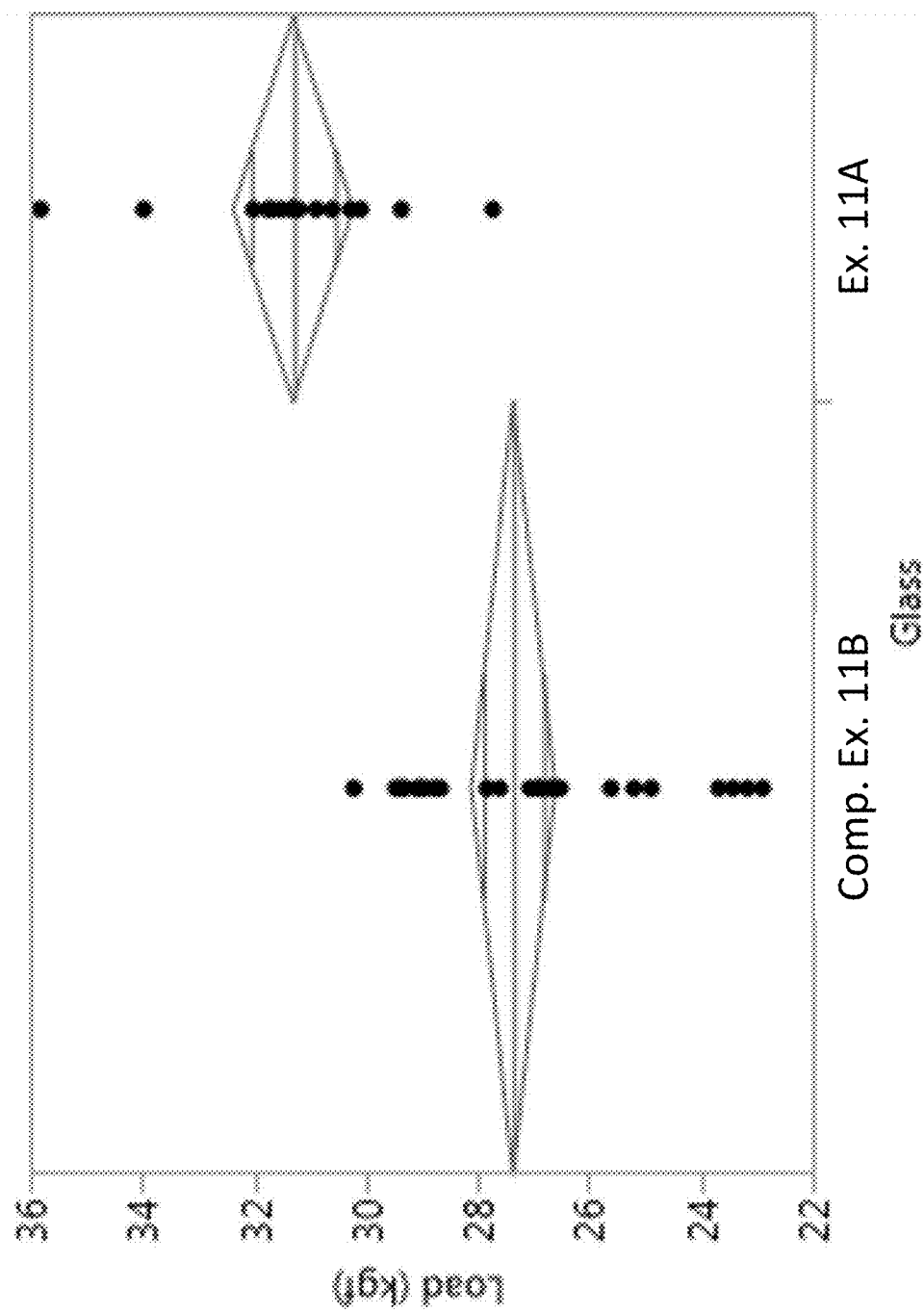
FIG. 37 is a graph comparing the average load to failure of glass-based articles according to Example 11A and Comparative Example 11B, after being abraded at a load or pressure of 25 psi.
Figure 38:
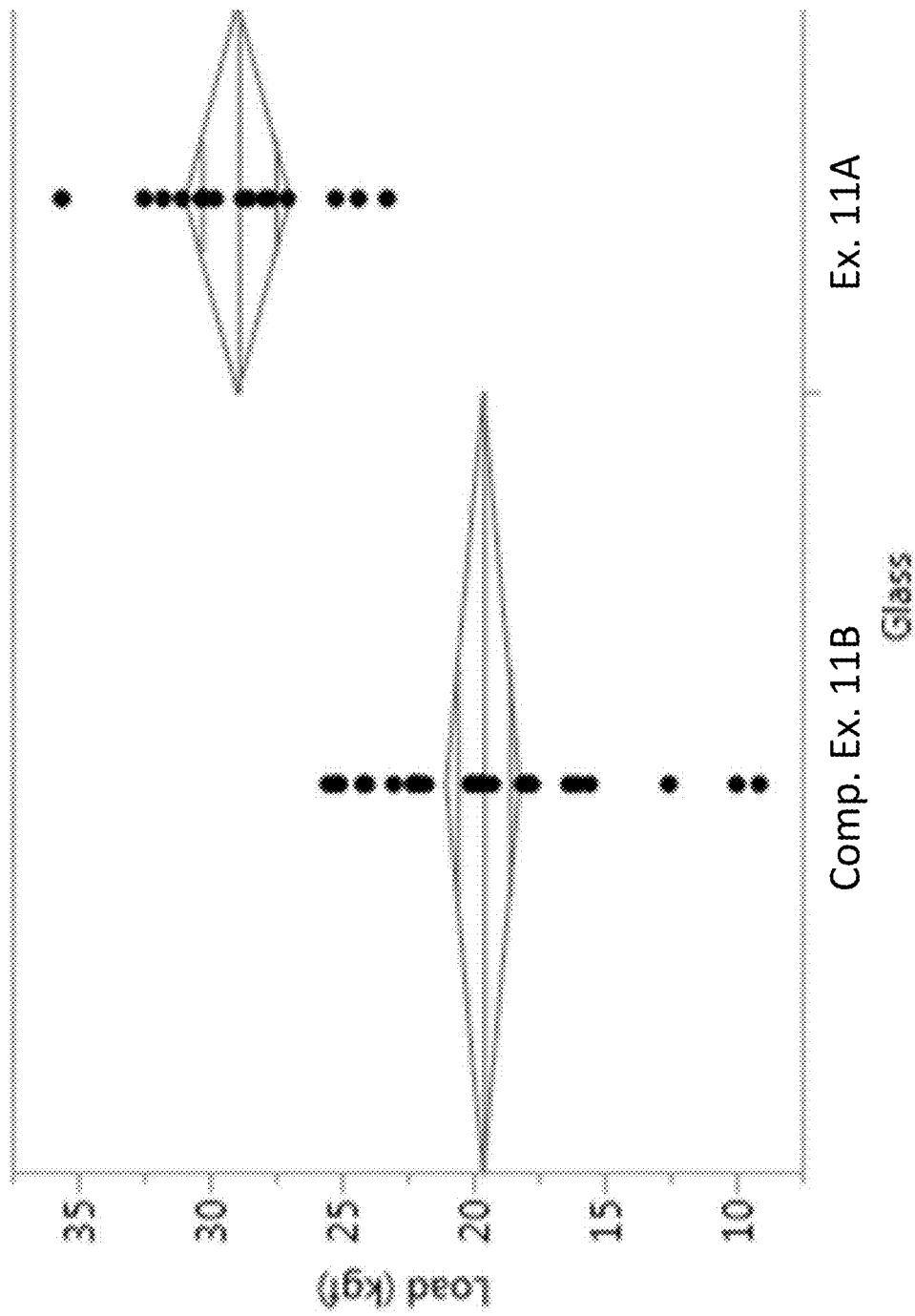
FIG. 38 is a graph comparing the average load to failure of glass-based articles according to Example 11A and Comparative Example 11B, after being abraded at a load or pressure of 45 psi.

Glass-based articles according to Example 12A and Comparative Example 12B were subjected to AROR testing, as described herein, using a load or pressure of 25 psi. The glass-based substrates of Example 12A exhibited an average load to failure of about 31.3 kgf, while the glass-based substrates of Comparative Example 12B exhibited an average load to failure of about 27.4 kgf, as shown in FIG. 37. When the abrasion load or pressure was increased to 45 psi, the difference in average load to failure for Example 12A and Comparative Example 12B increased. Specifically, under a 45 psi load or pressure, Example 12A exhibited an average load to failure of about 28.9 kgf, while Comparative Example 12B exhibited an average load to failure of about 19.6 kgf, as shown in FIG. 38.

Example 13

Examples 13A-E featured glass substrates having a thickness of 0.8 mm and a mutual Na/Li diffusivity of ~900 um$^2$/hr and Li$_2$O/R$_2$O of 0.77. The chemical composition shown in Table 12 below:

TABLE 12

Chemical composition of glass substrates used in Examples 13A-E prior to ion exchange.

| Oxide | Mole % |
|---|---|
| SiO$_2$ | 70.60 |
| Al$_2$O$_3$ | 12.70 |
| B$_2$O$_3$ | 1.98 |
| Li$_2$O | 8.24 |
| Na$_2$O | 2.40 |
| MgO | 2.90 |
| ZnO | 0.86 |
| P$_2$O$_5$ | 0 |
| SnO$_2$ | 0.12 |

Figure 40:
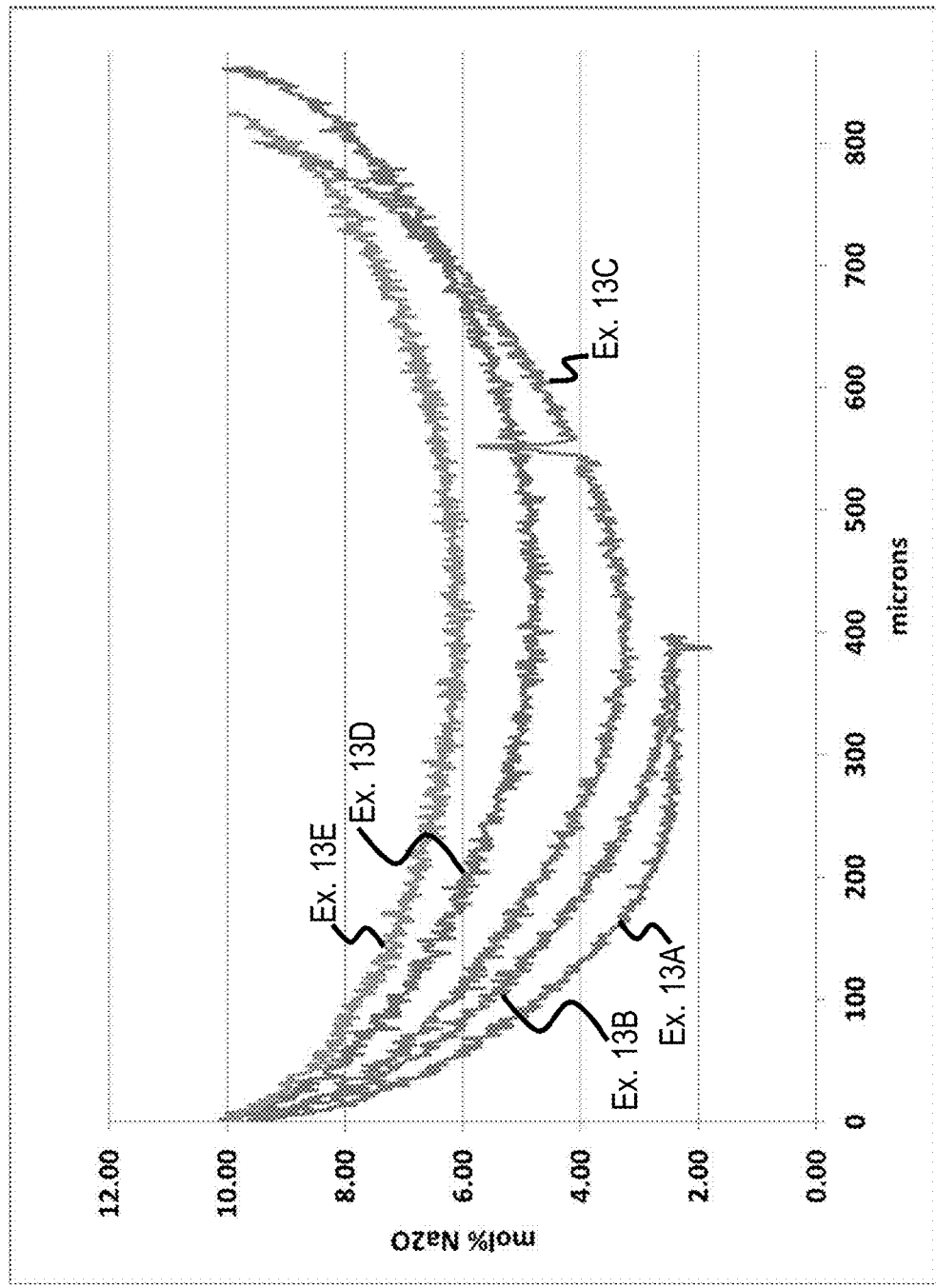
FIG. 40 is a graph showing the $Na_2O$ composition profiles as a function of depth for glass-based articles according to Examples 13A-E.
Figure 41:
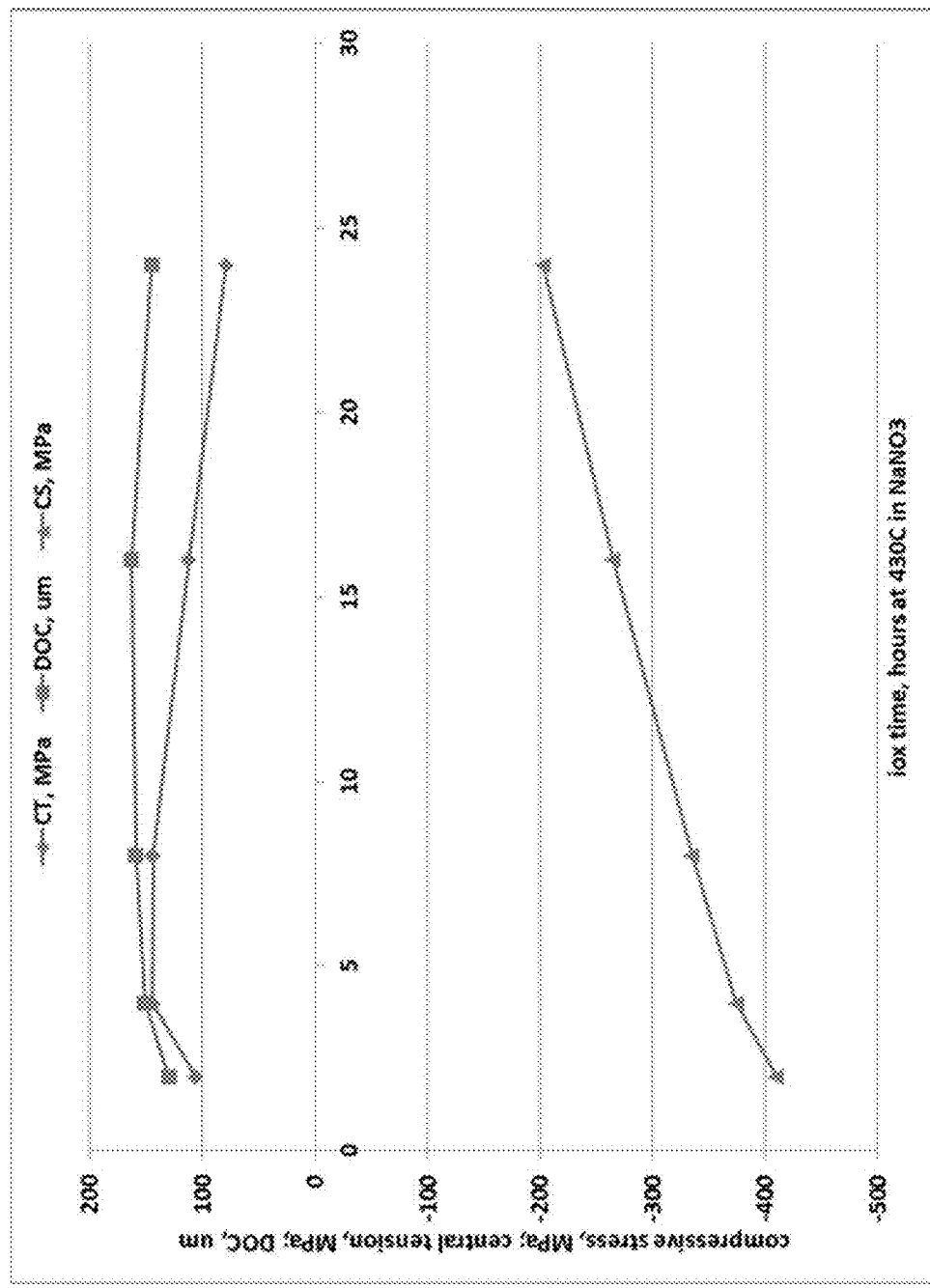
FIG. 41 is a graph showing CT, DOC and CS for glass-based articles according to Examples 13A-E.

The glass substrates in Examples 13A, 13B, 13C, 13D and 13E were then ion exchanged at 430° C. in a molten salt bath comprising NaNO$_3$ for 2 hours, 4 hours, 8 hours, 16 hours, and 24 hours, respectively. The Na$_2$O composition profiles for Examples 13A-E are shown in FIG. 40. As can be seen from the figure, the composition profiles evolve with an increase in ion exchange time. The CT, DOC and CS for the ion exchange conditions of Examples 13A-E are shown in FIG. 41. Negative numbers are compressive stress; positive numbers are CT and DOC.

FIG. 41 shows a plot of CT and DOC for the glass shown in FIG. 40 as a function of ion exchange time. Similar data are obtained on samples ion exchanged in mixed baths (for example 95% KNO$_3$/5% NaNO$_3$ or 80% KNO$_3$/20% NaNO$_3$). In terms of stress profiles, central tension (CT) is found to go through a maximum as a function of ion exchange time, and the depth of compression (DOC) stabilizes at depths exceeding about 15% of thickness as the peak CT is approached and surpassed as shown in FIG. 41. Using a pure Na-bath for ion exchange of a Li-containing glass, surface compression (CS) decreases with increased ion exchange time.

Example 14

Examples 14A1-14A5 and 14B1-14B4 featured glass substrates having a thickness of 0.8 mm and the same composition shown in Table 12 above. The glass substrates in Examples 14A1, 14A2, 14A3, 14A4, and 14A5 were then ion exchanged at 430° C. in a molten salt bath comprising 80% KNO$_3$/20% NaNO$_3$ for 2 hours, 4 hours, 8 hours, 16 hours, and 24 hours, respectively. The glass substrates in Examples 14B1, 14B2, 14B3, and 14B4 were ion exchanged at 430° C. in a molten salt bath comprising 95% KNO$_3$/5% NaNO$_3$ for 5 hours, 6 hours, 7 hours, and 8 hours, respectively.

Figure 42:
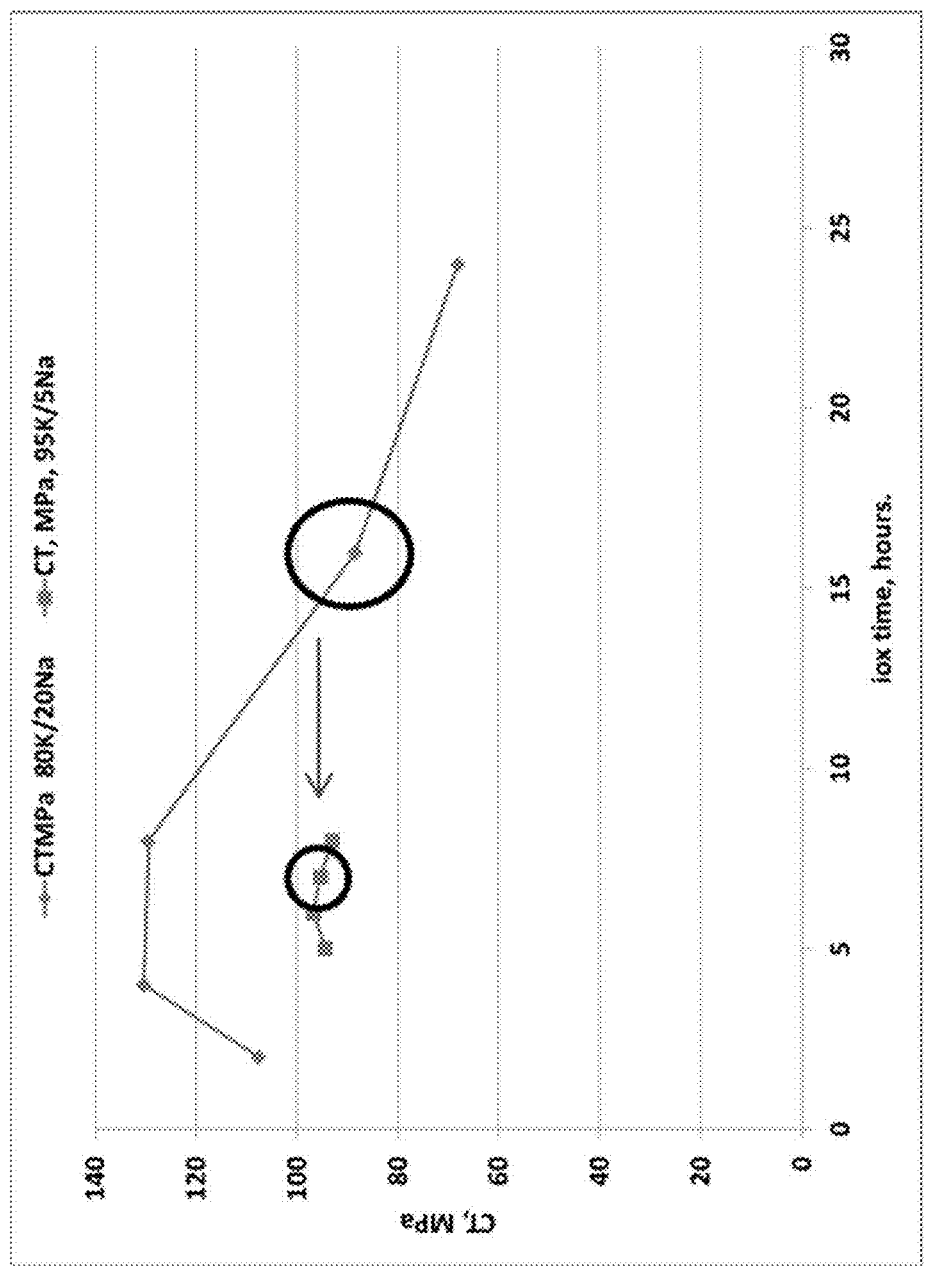
FIG. 42 is a graph showing CT versus ion exchange time for glass-based articles according to Examples 14A1-14A5 and 14B1-14B4.

FIG. 42 shows CT vs. ion exchange time in hours for 14A1-14A5 and 14B1-14B4. Examples 14A1-14A5, which were exchanged in 80% KNO$_3$/20% NaNO$_3$ exhibit ~100 MPa CT after 16 hours of ion exchange. Examples 14B1-14B4 which were exchanged in 95% KNO$_3$/5% NaNO$_3$, show a comparable CT in only 7 hours. The schedule in the 95/5 bath may be preferable in some embodiments because of decreased time in the ion exchange bath and decreased weight gain.

Figure 43:
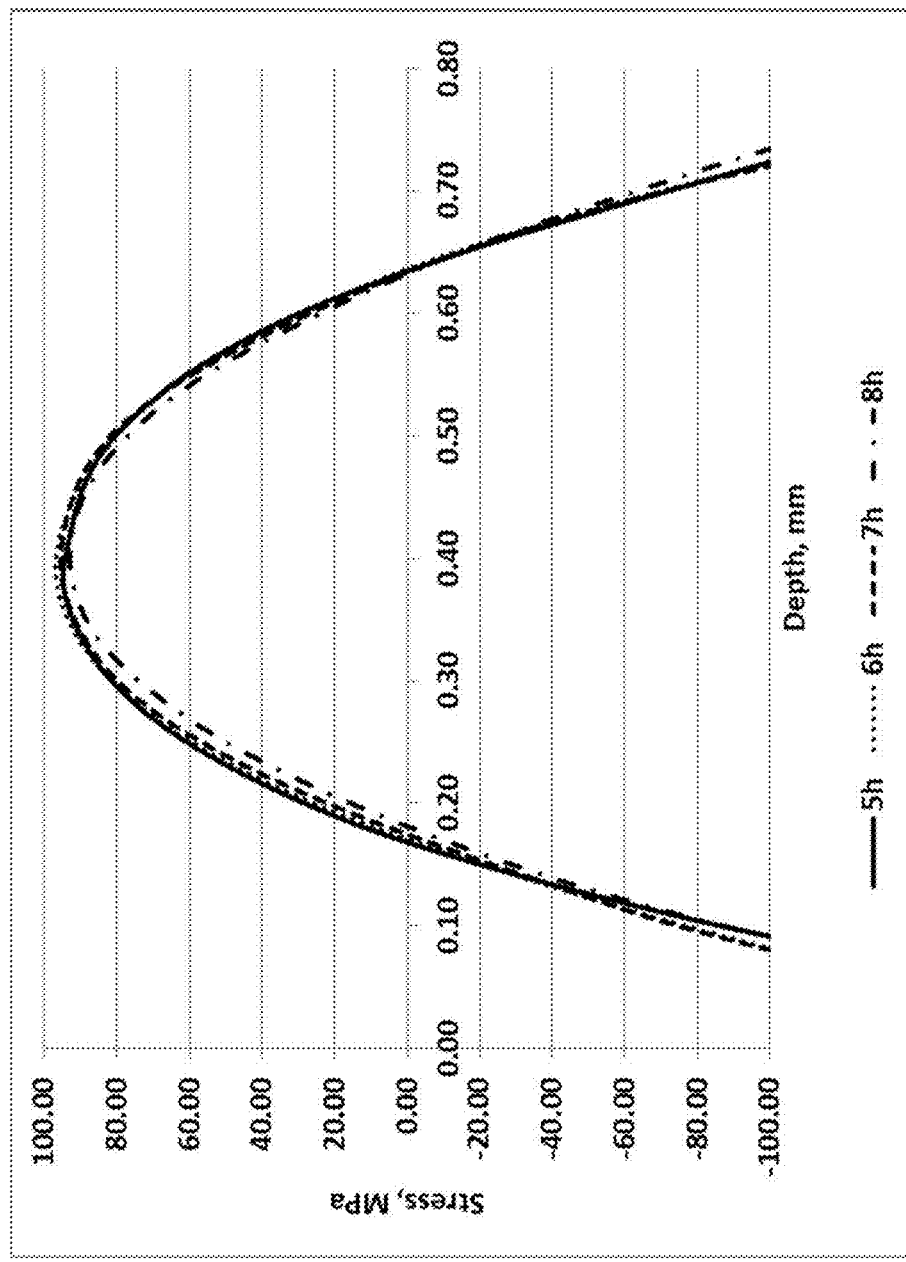
FIG. 43 is a graph showing SCALP data for glass-based articles according to Examples 14B1-14B4 with the CT region having positive stress and the CS region having negative stress.

FIG. 43 shows the SCALP data for Examples 14B1-14B4. Negative numbers represent compression; positive numbers represent tension. Depths of compression are greater than 18% of the part thickness. The figure shows the flexibility of the method where a controlled narrow range of CT values can be achieved over a relatively wide range of ion exchange times. Additionally, the depth of compression for the ion exchange times is well over 15% of thickness for all schedules and quite stable as a function of ion exchange time within the range of interest. Due to this wide process window with stable CT and DOC, the ion exchange method may be adaptable to a variety of manufacturing conditions and confers a high degree of robustness to the ion exchange process.

Figure 44:
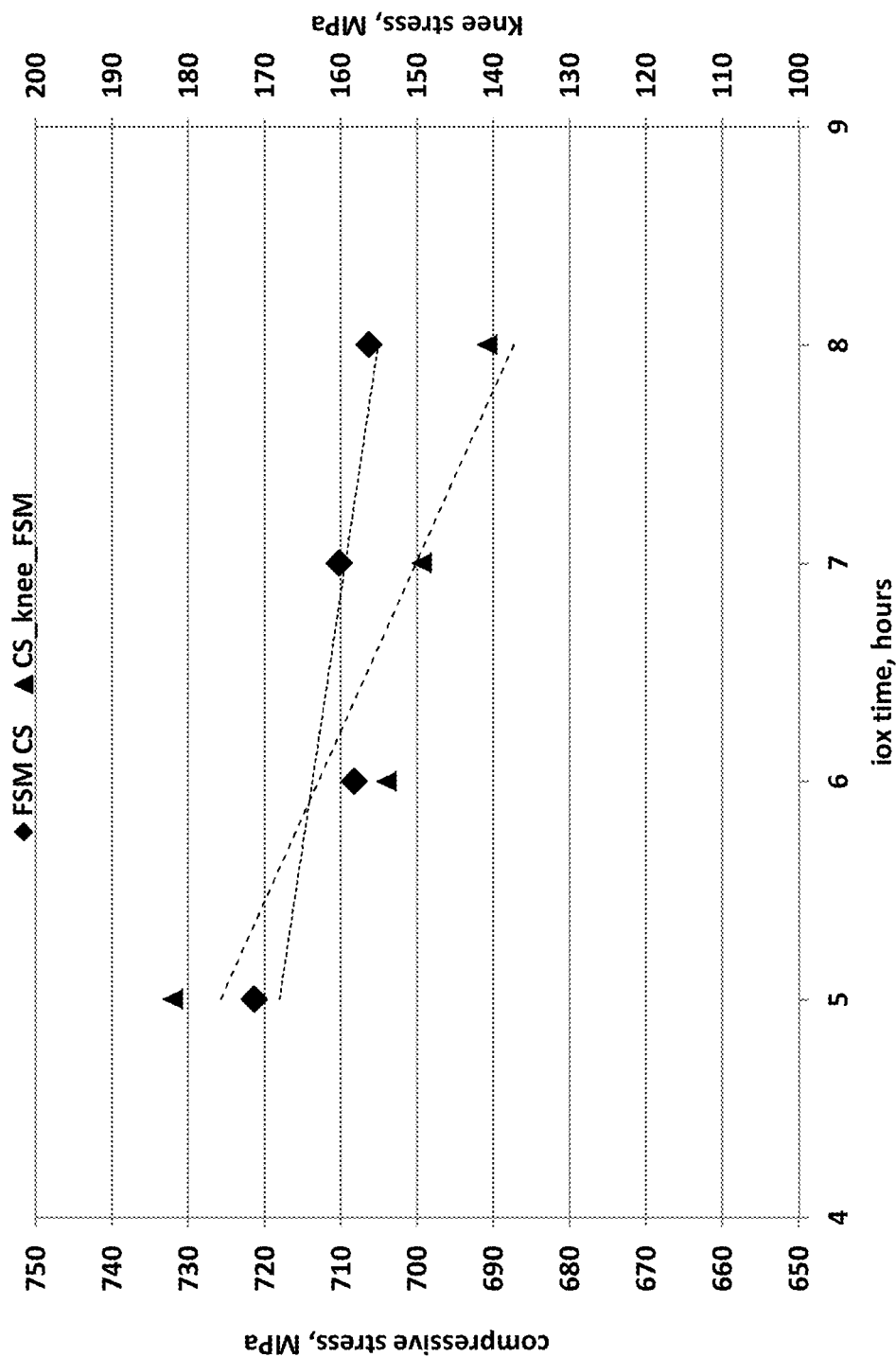
FIG. 44 is a graph showing the range of surface stress and knee stress values obtained by FSM for glass-based articles Examples 14B1-14B4.

FIG. 44 shows the range of surface stress and knee stress values obtained by FSM for Examples 14B1-14B4. Knee stress values below 100 Mpa have not so far enabled the excellent drop performance that is achieved with substantially higher knee stress values such as >130 MPa in combination with large DOC greater than 15% of the thickness. Examples 14B1-14B4 achieve at least 140 MPa in knee stress.

Figure 45:
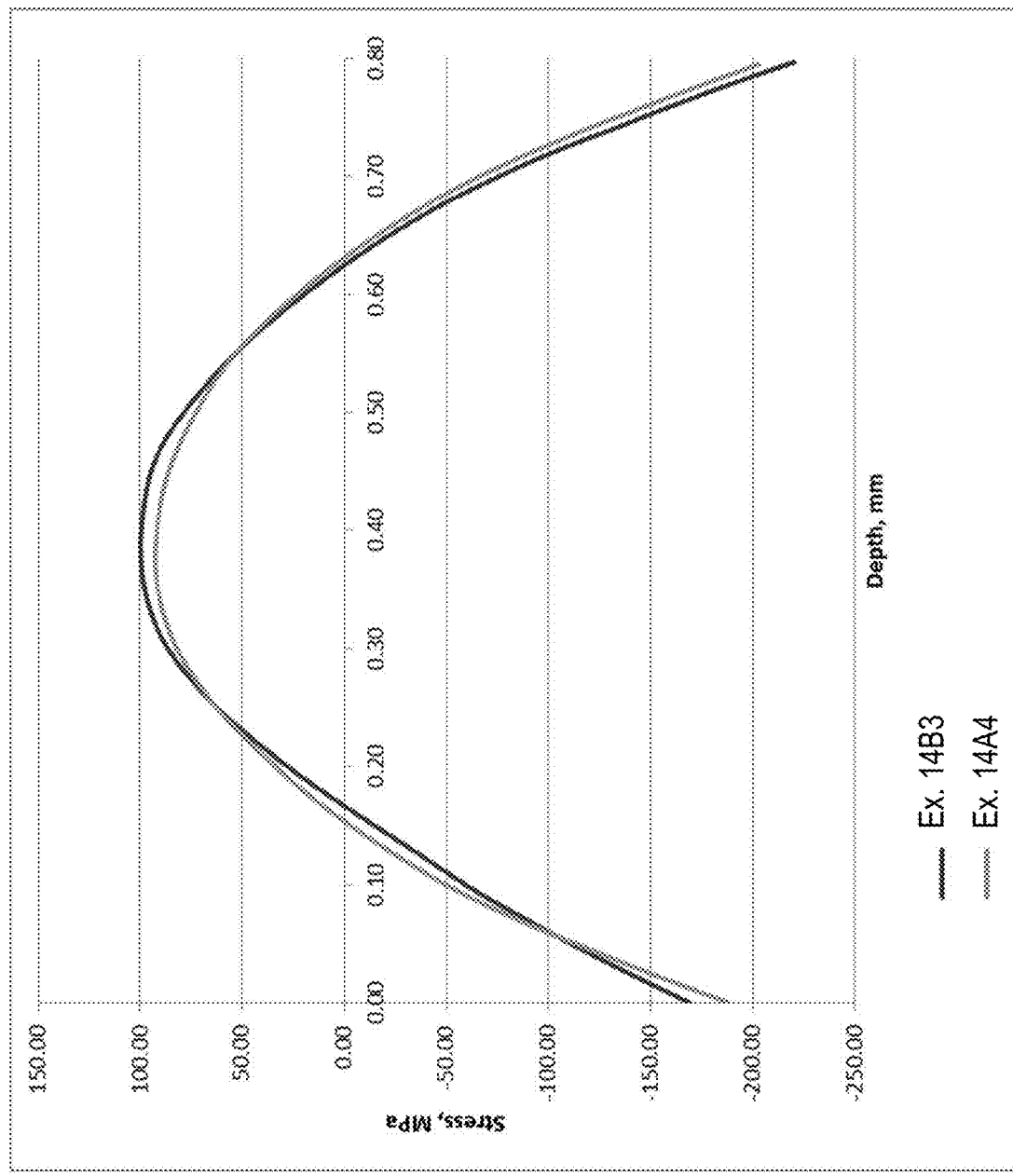
FIG. 45 is a graph showing SCALP data for glass-based articles according to Examples 14A4 and 14B3 with the CT region having positive stress and the CS region having negative stress.

FIG. 45 shows SCALP data for Examples 14A4 and 14B3. As shown in FIG. 45, Example 14B3 (95% KNO$_3$/5% NaNO$_3$ bath for 7 hours) was able to maintain the desired CT found in Example 14A4 (80% KNO$_3$/20% NaNO$_3$ bath for 16 hours).

Table 13 below shows the percent weight gain, percent dimensional change and measured warp in microns for a part approximately 60 mm×130 mm×0.8 mm having a beveled edge, for Examples 14A4 and 14B3. Weight gain, growth and warp are all substantially reduced in Example 14B3, while maintaining CT, as FIG. 42 shows. Warp was measured using a Tropel Flatmaster FM200 interferometer, taking the least squares fit from a flat plate.

TABLE 13

Weight gain, length and width (%) change and induced warp in microns for glass sample with beveled edges, for Examples 14A4 and 14B3.

| Ex. | Concentration | Time/Temp | Weight Gain (%) | Length Change (%) | Width Change (%) | Warp (μm) |
|---|---|---|---|---|---|---|
| 14A4 | 80% K/ 20% Na | 16 hr/ 430° C. | 2.00 | 0.299 | 0.299 | 231.98 |
| 14B3 | 95% K/ 5% Na | 7 hr/ 430° C. | 1.06 | 0.154 | 0.143 | 147.97 |

Table 14 is a comparison of the surface CS for the comparative and invented ion for Examples 14A4 and 14B3. Example 14B3 exhibits higher surface stress by as much as 200 MPa, which may be advantageous for 4-point bend test performance and increased resistance to some types of scratches.

TABLE 14

Comparison of surface spike compressive stress (CS, MPa) and depth of layer (DOL, um) for Examples 14A4 and 14B3.

| Ex. | Concentration | Time/Temperature | CS (MPa) | DOL (μm) |
|-----|---------------|------------------|----------|----------|
| 14A4 | 80% K/20% Na | 16 hr/430° C. | 501.8 | 12.3 |
| 14B3 | 95% K/5% Na | 7 hr/430° C. | 695.0 | 8.9 |

Figure 46:
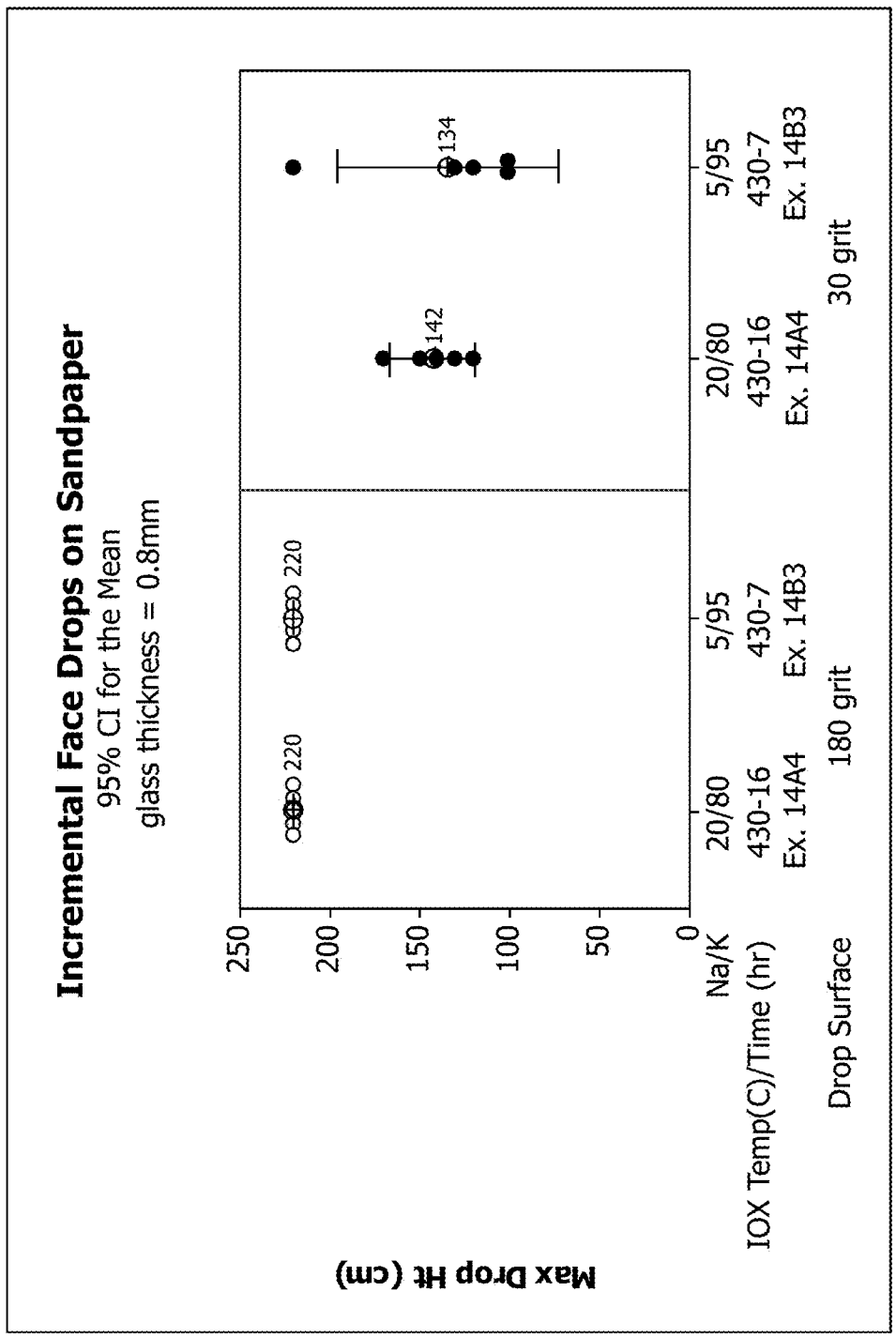
FIG. 46 is a plot showing drop results for glass-based articles according to Examples 14A4 and 14B3.

FIG. 46 shows drop results for Examples 14A4 and 14B3. Example 14B3 with lower weight gain and less warp is found to have comparable drop performance on 180 grit and 30 grit sandpaper compared to Example 14A4.

Figure 47:
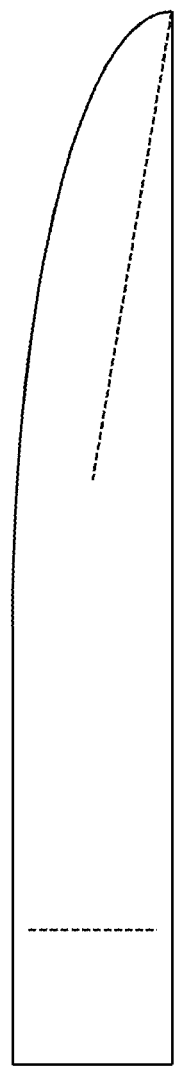
FIG. 47 shows a schematic of the beveled edge of a glass part that can warp as a consequence of ion-exchange.

FIG. 47 shows a schematic of the beveled edge of a glass part that can warp as a consequence of ion-exchange. The dotted lines represent general areas where vertical and horizontal composition scans shown in FIGS. 48 and 49 were taken, discussed below.

Figure 48:
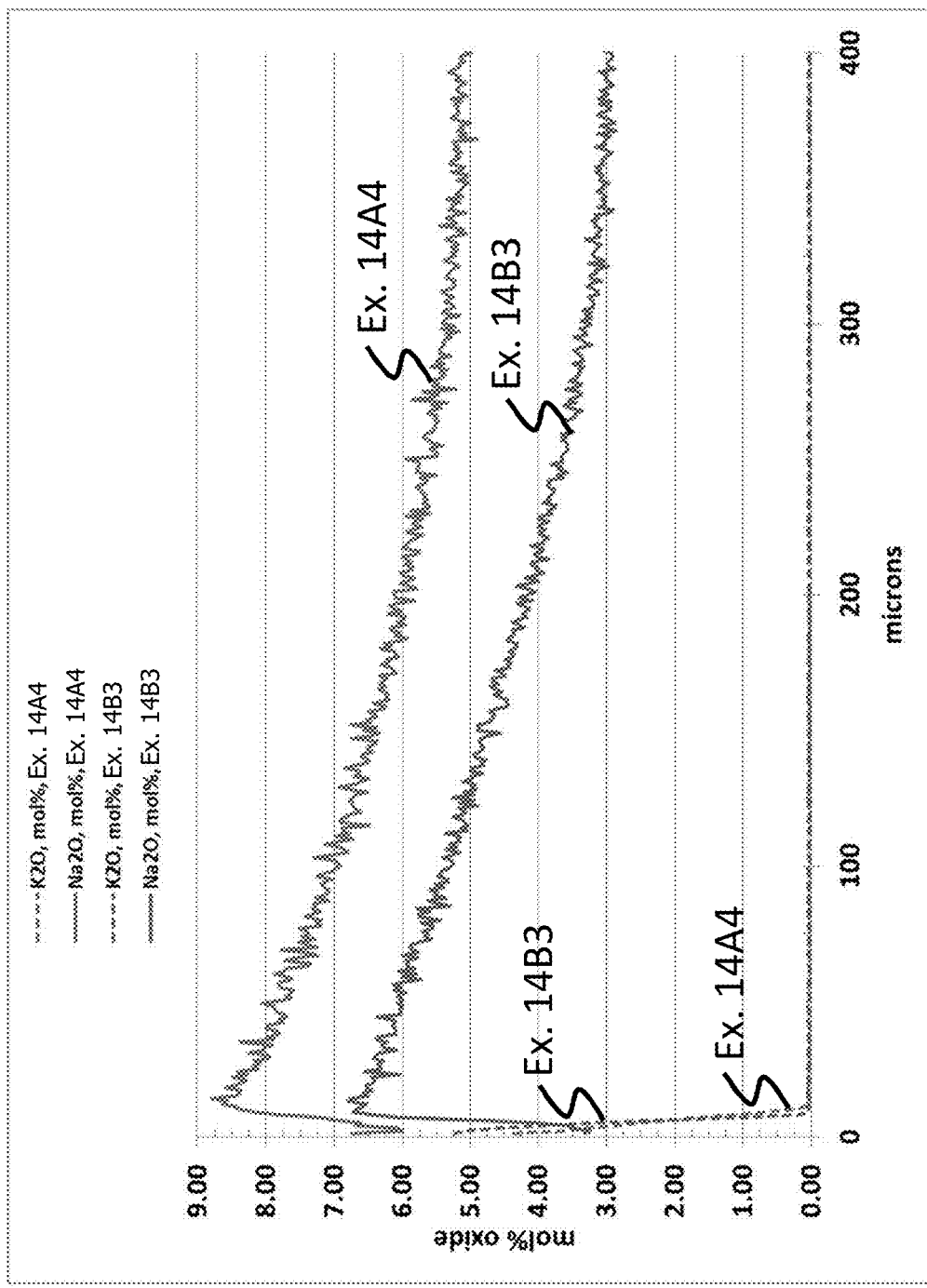
FIG. 48 is a graph showing $Na_2O$ and $K_2O$ composition profiles as a function of depth for glass-based articles according to Examples 14A4 and 14B3.

FIG. 48 shows $Na_2O$ and $K_2O$ composition profiles for Examples 14A4 and 14B3 obtained by microprobe through a 0.8 mm thick area of a 2.5D shaped part, demonstrating similar composition profiles with lower $Na_2O$ concentration in Example 14B3. This is consistent with the weight gain data disclosed in Table 13.

Figure 49:
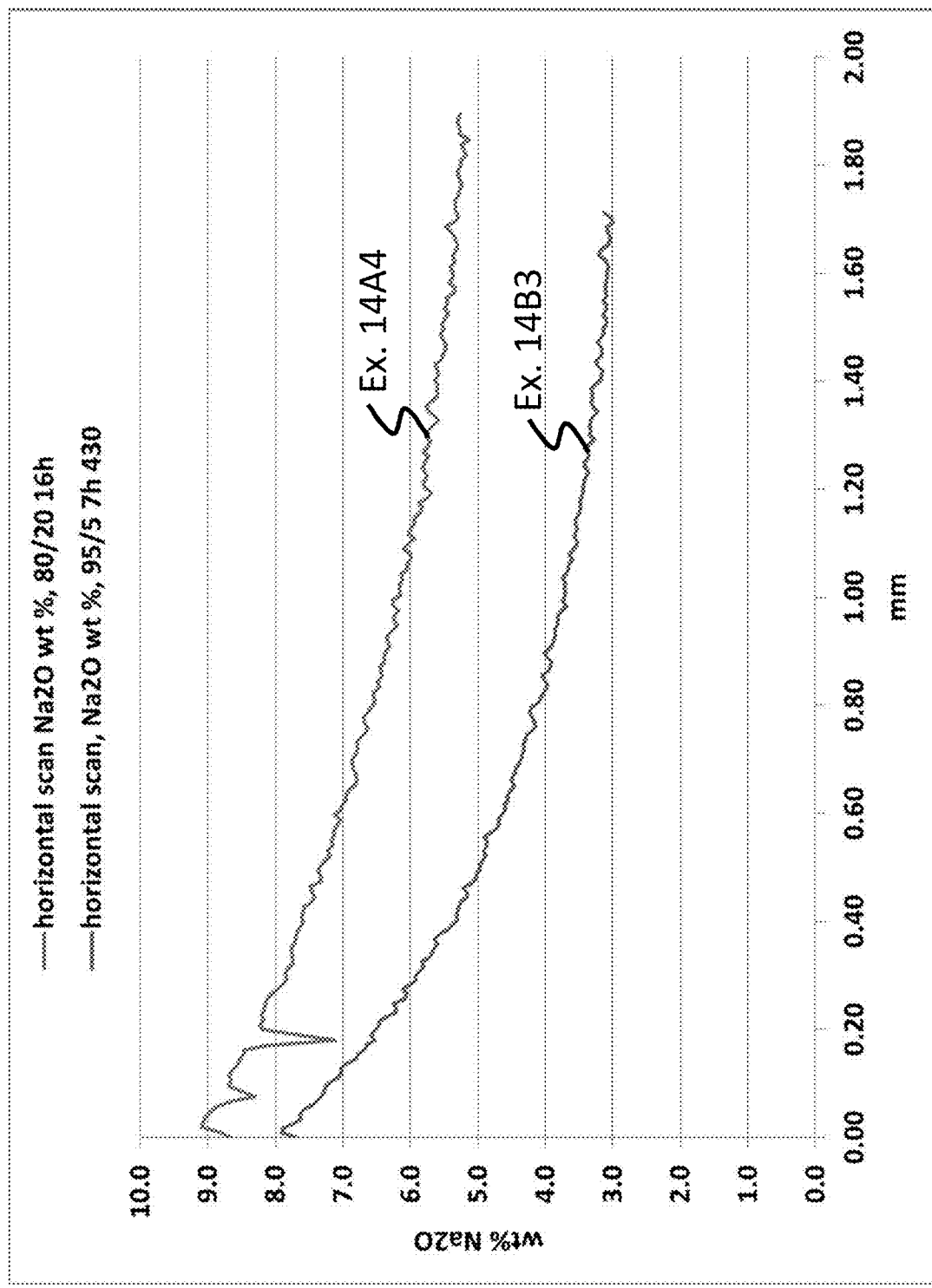
FIG. 49 is a graph showing horizontal scans of the $Na_2O$ profiles for glass-based articles according to Examples 14A4 and 14B3.

FIG. 49 shows the $Na_2O$ profiles for the schedules described in Table 14 along the horizontal shown in FIG. 47.

Example 14B3 maintains the 'rind' of low CS around the edge of the part which is an advantage in terms of failure modes. Also, there is no point on the edges of Example 14B3 where tension is found.

What is claimed is:

1. A glass-based article comprising:
   a first surface and a second surface opposing the first surface defining a thickness (t);
   a concentration of an ion-exchanged metal oxide that is both non-zero and varies along a thickness range from about 0•t to at least about 0.3•t, wherein the concentration of the ion-exchanged metal oxide comprising sodium (Na) reaches a minimum concentration at 0.5•t;
   a lithium aluminosilicate composition comprising:
      from 6 mol % to 10 mol % $Li_2O$; and
      from 1 mol % to 3 mol % $Na_2O$, wherein the concentration of $Na_2O$ at a center point of the glass-based article is less than or equal to 3 mol%; and
      a molar ratio of $Li_2O$ to alkali metal oxide content ($R_2O$) in a range of greater than or equal to 0.4 to less than or equal to 1 at the center point of the glass-based article; and
   a warp of less than about 200 μm relative to a flat plane in the absence of post-ion exchange processing.

2. The glass-based article of claim 1, wherein the glass-based article has a 2.5 dimensional or a 3 dimensional shape.

3. A device comprising:
   a housing having front, back, and side surfaces;
   electrical components that are at least partially inside the housing;
   a display at or adjacent to the front surface of the housing; and
   a cover substrate disposed over the display,
   wherein the cover substrate or housing comprises the glass-based article of claim 1.

4. A glass-based article comprising:
   a first surface and a second surface opposing the first surface defining a thickness (t);
   a concentration of an ion-exchanged metal oxide that is both non-zero and varies along a thickness range from about 0•t to at least about 0.3•t, wherein the concentration of the ion-exchanged metal oxide comprising sodium (Na) reaches a minimum concentration at 0.5•t;
   a lithium aluminosilicate composition comprising from 6 mol % to 10 mol % $Li_2O$ and from 1 mol % to 3 mol % $Na_2O$, wherein the molar concentration of $Na_2O$ at a center point of the glass-based article is less than about 45% of the total alkali metal oxide molar concentration of the glass-based article; and
   a warp of less than about 200 μm relative to a flat plane in the absence of post-ion exchange processing.

5. The glass-based article of claim 4, wherein the molar concentration of $Na_2O$ at the center point of the glass-based article is less than about 40% of the total alkali metal oxide molar concentration of the glass-based article.

6. The glass-based article of claim 4, wherein the glass-based article has a 2.5 dimensional or a 3 dimensional shape.

7. A device comprising:
   a housing having front, back, and side surfaces;
   electrical components that are at least partially inside the housing;
   a display at or adjacent to the front surface of the housing; and
   a cover substrate disposed over the display,
   wherein the cover substrate or housing comprises the glass-based article of claim 4.

8. A glass-based article comprising:
   a first surface and a second surface opposing the first surface defining a thickness (t);
   a lithium aluminosilicate composition comprising: from 6 mol % to 10 mol % $Li_2O$ and from 1 mol % to 3 mol % $Na_2O$, wherein a molar ratio of $Li_2O$ to alkali metal oxide content ($R_2O$) is in a range of greater than or equal to 0.4 to less than or equal to 1 at the center point of the glass-based article;
   a concentration of an ion-exchanged metal oxide comprising sodium (Na) that is both non-zero and varies along a thickness range from about 0•t to at least about 0.3•t, reaches a minimum concentration at 0.5•t;
   a compressive stress spike depth of layer ($DOL_{spike}$), wherein $DOL_{spike}/t$ is in the range from about 0.006 to about 0.014; and
   a warp of less than about 200 μm relative to a flat plane in the absence of post-ion exchange processing.

9. The glass-based article of claim 8, wherein $DOL_{spike}/t$ is in the range from about 0.008 to about 0.012.

10. The glass-based article of claim 8, wherein t is in the range from about 0.03 mm to about 1.3 mm.

11. The glass-based article of claim 8, further comprising a surface compressive stress (CS) of about 300 MPa or greater.

12. The glass-based article of claim 8, wherein the glass-based article has a 2.5 dimensional or a 3 dimensional shape.

13. A device comprising:
   a housing having front, back, and side surfaces;
   electrical components that are at least partially inside the housing;
   a display at or adjacent to the front surface of the housing; and
   a cover substrate disposed over the display, wherein the cover substrate or housing comprises the glass-based article of claim 8.

14. A glass-based article comprising:
a first surface and a second surface opposing the first surface defining a thickness (t);
a lithium aluminosilicate composition comprising: from 6 mol % to 10 mol % $Li_2O$ and from 1 mol % to 3 mol % $Na_2O$, wherein a molar ratio of $Li_2O$ to alkali metal oxide content ($R_2O$) is in a range of greater than or equal to 0.4 to less than or equal to 1 at the center point of the glass-based article;
stress profile comprising:
an inner region under a central tension CT;
at least one compressive stress layer under a compressive stress CS, the compressive stress layer extending from a surface of the glass-based article to a depth of compression DOC, wherein DOC ≥0.1·t when t<0.5 mm and DOC ≥50 μm when t≥0.5 mm, and being adjacent to the inner region;
a concentration of an ion-exchanged metal oxide comprising sodium (Na) that is both non-zero and varies along a thickness range from about 0·t to at least about 0.3•t, reaches a minimum concentration at 0.5•t; and
a warp of less than about 200μm relative to a flat plane in the absence of post-ion exchange processing;
wherein the glass-based article exhibits a transmittance of 88% or greater over a wavelength in the range of from about 380 nm to about 780 nm; and has at least a 60% survivability rate when subjected to an inverted ball drop test with a 4.2 g stainless steel ball having a diameter of 10 mm from a height of 100 cm onto a 30 grit sandpaper positioned above the surface of the glass so there is a 100 μm air gap between the sandpaper and the surface of the glass, wherein the survivability rate is based on testing at least 5 samples.

15. The glass-based article of claim 14, wherein the strengthened glass-based article has at least a 60% survivability rate when subjected to the inverted ball drop test from a height of 150 cm.

16. A device comprising:
a housing having front, back, and side surfaces;
electrical components that are at least partially inside the housing;
a display at or adjacent to the front surface of the housing; and
a cover substrate disposed over the display,
wherein the cover substrate comprises the glass-based article of claim 14.

17. The glass-based article of claim 1, wherein the lithium aluminosilicate composition comprises 11 mol % to about 15 mol % $Al_2O_3$.

18. The glass-based article of claim 1, wherein the lithium aluminosilicate composition comprises 11 mol % to about 15 mol % $Al_2O_3$.

19. The glass-based article of claim 8, wherein the lithium aluminosilicate composition comprises 11 mol % to about 15 mol % $Al_2O_3$.

20. The glass-based article of claim 14, wherein the lithium aluminosilicate composition comprises 11 mol % to about 15 mol % $Al_2O_3$.

21. The glass-based article of claim 1, wherein the glass-based article exhibits a transmittance of 88% or greater over a wavelength in the range of from about 380 nm to about 780 nm.

22. The glass-based article of claim 4, wherein the glass-based article exhibits a transmittance of 88% or greater over a wavelength in the range of from about 380 nm to about 780 nm.

23. The glass-based article of claim 8, wherein the glass-based article exhibits a transmittance of 88% or greater over a wavelength in the range of from about 380 nm to about 780 nm.

24. The glass-based article of claim 1, wherein a concentration of $Na_2O$ at the first and second surfaces are within 0.1 mol % of each other.

25. The glass-based article of claim 24, wherein the concentration of $Na_2O$ at the first and second surfaces are within 0.1 mol % of each other before and after chemical strengthening.

26. The glass-based article of claim 4, wherein a concentration of $Na_2O$ at the first and second surfaces are within 0.1 mol % of each other.

27. The glass-based article of claim 26, wherein the concentration of $Na_2O$ at the first and second surfaces are within 0.1 mol % of each other before and after chemical strengthening.

28. The glass-based article of claim 8, wherein a concentration of $Na_2O$ at the first and second surfaces are within 0.1 mol % of each other.

29. The glass-based article of claim 28, wherein the concentration of $Na_2O$ at the first and second surfaces are within 0.1 mol % of each other before and after chemical strengthening.

30. The strengthened glass-based article of claim 14, wherein a concentration of $Na_2O$ at the first and second surfaces are within 0.1 mol % of each other.

31. The glass-based article of claim 30, wherein the concentration of $Na_2O$ at the first and second surfaces are within 0.1 mol % of each other before and after chemical strengthening.

32. The glass-based article of claim 1 comprising a stress profile comprising: a depth of compression (DOC) of at least 0.15•t and a knee stress at a compressive stress spike depth of layer ($DOL_{spike}$) of at least 130 MPa.

33. The glass-based article of claim 32, wherein the knee stress is at least 140 MPa and the $DOL_{spike}/t$ is in a range from about 0.009 to about 0.011.

34. The glass-based article of claim 4 comprising a stress profile comprising: a depth of compression (DOC) of at least 0.15•t and a knee stress at a compressive stress spike depth of layer ($DOL_{spike}$) of at least 130 MPa.

35. The glass-based article of claim 34, wherein the knee stress is at least 140 MPa and the $DOL_{spike}/t$ is in a range from about 0.009 to about 0.011.

36. The glass-based article of claim 8 comprising a stress profile comprising: a depth of compression (DOC) of at least 0.15•t and a knee stress at the $DOL_{spike}$ of at least 130 MPa.

37. The glass-based article of claim 36, wherein the knee stress is at least 140 MPa and the $DOL_{spike}/t$ is in a range from about 0.009 to about 0.011.

38. The glass-based article of claim 14, wherein t is ≥0.5 mm and the DOC of at least 0.15•t and a knee stress at a compressive stress spike depth of layer ($DOL_{spike}$) is at least 130 MPa.

39. The glass-based article of claim 38, wherein the knee stress is at least 140 MPa and the $DOL_{spike}/t$ is in a range from about 0.009 to about 0.011.

40. The glass-based article of claim 14, wherein the CT is in a range from 70 MPa to 100 MPa.

41. The glass-based article of claim 1, wherein upon an ion exchange treatment of a glass-based substrate in a single mixed salt bath comprising potassium nitrate (KNO$_3$) and sodium nitrate (NaNO$_3$) for 5 to 8 hours to form the glass-based article, the glass-based article after the ion exchange treatment exhibits a length dimension change of less than 0.20% relative to the glass-based substrate prior to the ion exchange treatment, and a width dimension change of less than 0.20% relative to the glass-based substrate prior to the ion exchange treatment.

\* \* \* \* \*

UNITED STATES PATENT AND TRADEMARK OFFICE
CERTIFICATE OF CORRECTION

| | | |
|---|---|---|
| PATENT NO. | : 11,453,612 B2 | Page 1 of 1 |
| APPLICATION NO. | : 15/491531 | |
| DATED | : September 27, 2022 | |
| INVENTOR(S) | : Rostislav Vatchev Roussev et al. | |

It is certified that error appears in the above-identified patent and that said Letters Patent is hereby corrected as shown below:

On the Title Page

On the page 2, in Column 2, under "Other Publications", Line 8, delete "2017. Rupture)." and insert -- 2017. --.

In the Claims

In Column 59, Line 52, in Claim 1, delete "3 mol%;" and insert -- 3 mol %; --.

In Column 60, Line 46, in Claim 8, delete "0.3•t ," and insert -- 0.3•t, --.

In Column 60, Line 48, in Claim 8, delete "DOL $_{spike}$/t" and insert -- DOL$_{spike}$/t --.

In Column 61, Line 12 (Approx.), in Claim 14, before "stress" insert -- a --.

In Column 61, Line 25, in Claim 14, delete "200μm" and insert -- 200 μm --.

In Column 61, Line 54 (Approx.), in Claim 18, delete "1," and insert -- 4, --.

In Column 62, Line 30, in Claim 30, after "The" delete "strengthened".

Signed and Sealed this
Sixth Day of December, 2022

*Katherine Kelly Vidal*
Katherine Kelly Vidal
*Director of the United States Patent and Trademark Office*